(12) United States Patent
Liaw et al.

(10) Patent No.: US 12,095,054 B2
(45) Date of Patent: Sep. 17, 2024

(54) ELECTROCHEMICAL ANALYTIC DIAGNOSIS FOR ENERGY STORAGE DEVICE INCLUDING DETERMINING ELECTRODE ACTIVE MATERIAL UTILIZATION

(71) Applicant: Battelle Energy Alliance, LLC, Idaho Falls, ID (US)

(72) Inventors: Boryann Liaw, Idaho Falls, ID (US); Yulun Zhang, Salt Lake City, UT (US); Meng Li, Ammon, ID (US)

(73) Assignee: Battelle Energy Alliance, LLC, Idaho Falls, ID (US)

( * ) Notice: Subject to any disclaimer, the term of this patent is extended or adjusted under 35 U.S.C. 154(b) by 10 days.

(21) Appl. No.: 18/185,018

(22) Filed: Mar. 16, 2023

(65) Prior Publication Data

US 2023/0387487 A1     Nov. 30, 2023

Related U.S. Application Data

(60) Provisional application No. 63/269,411, filed on Mar. 16, 2022.

(51) Int. Cl.
  *G01R 31/385*     (2019.01)
  *G01R 31/389*     (2019.01)
  (Continued)

(52) U.S. Cl.
  CPC ........ *H01M 10/48* (2013.01); *G01R 31/3865* (2019.01); *G01R 31/389* (2019.01);
  (Continued)

(58) Field of Classification Search
  None
  See application file for complete search history.

(56) References Cited

U.S. PATENT DOCUMENTS

| 9,207,285 B1 | 12/2015 | Swanton et al. |
| 10,191,116 B2 | 1/2019 | Aliyev et al. |

(Continued)

FOREIGN PATENT DOCUMENTS

| CN | 202957331 U | 5/2013 |
| CN | 106295003 B | 2/2020 |

(Continued)

OTHER PUBLICATIONS

Kim et al. ("Principles and Applications of Galvanostatic Intermittent Titration Technique for Lithium-ion Batteries" 2021, J. Electrochem. Sci. Technol. 2022;13(1):19-31) (Year: 2021).*

(Continued)

*Primary Examiner* — Roy Y Yi
(74) *Attorney, Agent, or Firm* — TraskBritt

(57) ABSTRACT

Disclosed is a method of analyzing an energy storage device including normalizing charge and discharge voltage profiles to obtain normalized charge and discharge voltage profiles as a function of a normalized capacity; averaging the normalized voltage profiles to obtain an averaged voltage profile as a function of the normalized capacity; determining an internal resistance between the charge or discharge voltage profiles and the normalized averaged voltage profile; determining a current-resistance (IR) potential responsive to a measured current and the determined internal resistance; determining an IR-free voltage charge or discharge profile of the energy storage device; and determining a ratio between a capacity change and a voltage potential change in a charging or discharging process of the energy storage device over a predetermined interval of time responsive to the determined IR-free voltage charge or discharge profiles.

19 Claims, 39 Drawing Sheets

(51) Int. Cl.
  *H01M 4/505* (2010.01)
  *H01M 4/525* (2010.01)
  *H01M 10/44* (2006.01)
  *H01M 10/48* (2006.01)
  *H01M 10/42* (2006.01)

(52) U.S. Cl.
  CPC .......... *H01M 4/505* (2013.01); *H01M 4/525* (2013.01); *H01M 10/44* (2013.01); *H01M 2010/4292* (2013.01)

(56) References Cited

U.S. PATENT DOCUMENTS

| | | | |
|---|---|---|---|
| 10,345,764 | B2 | 7/2019 | Early et al. |
| 2018/0292465 | A1 | 10/2018 | Osara et al. |
| 2019/0115778 | A1 | 4/2019 | Ermon et al. |
| 2020/0152960 | A1 | 5/2020 | Grunwald et al. |
| 2022/0214399 | A1* | 7/2022 | Liaw .............. G01R 31/387 |

FOREIGN PATENT DOCUMENTS

| | | |
|---|---|---|
| EP | 3662562 A1 | 6/2020 |
| WO | 2020/033343 A1 | 2/2020 |

OTHER PUBLICATIONS

Dubarry et al. (From single cell model to battery pack simulation for Li-ion batteries, Journal of Power Sources, vol. 186, Issue 2, 2009, pp. 500-507) (Year: 2009).*

Dubarry et al., "Synthesize Battery Degradation Modes Via a Diagnostic and Prognostic Model", Journal of Power Sources, vol. 219, Dec. 1, 2012, pp. 204-216.

Hendricks et al., "A Failure Modes, Mechanisms, and Effects Analysis (FMMEA) of Lithium-Ion Batteries", Journal of Power Sources, vol. 297, Nov. 30, 2015, pp. 113-120.

Schmitt et al., "Failure Mode Based Design and Optimization of the Electrode Packaging Process for Large Scale Battery Cells", Advanced Materials Research, vol. 907, Apr. 2014, pp. 309-319.

Schnell et al., "Quality Management for Battery Production: A Quality Gate Concept", Procedia CIRP, vol. 57, (2016), pp. 568-573.

Tsai et al., "Combining FMEA with DEMATEL Models to Solve Production Process Problems", PLOS One, (available at: https://doi.org/10.1371/journal.pone.0183634), Aug. 24, 2017, 15 pages.

* cited by examiner

ELECTROCHEMICAL ANALYTIC DIAGNOSIS FOR ENERGY STORAGE DEVICE INCLUDING DETERMINING ELECTRODE ACTIVE MATERIAL UTILIZATION

CROSS-REFERENCE TO RELATED APPLICATION

This application claims the benefit under 35 U.S.C. § 119(e) of U.S. Provisional Patent Application Ser. No. 63/269,411, filed Mar. 16, 2022, the disclosure of which is hereby incorporated herein in its entirety by this reference.

STATEMENT REGARDING FEDERALLY SPONSORED RESEARCH OR DEVELOPMENT

This invention was made with government support under Contract Number DE-AC07-05-ID14517 awarded by the United States Department of Energy. The government has certain rights in the invention.

TECHNICAL FIELD

This disclosure relates generally to energy storage device utilization, and more specifically to measuring active material utilization in an energy storage device.

BACKGROUND

Formation of an energy storage device functionalizes the raw materials in a battery cell through a slow electrochemical activation process. This process is often the bottleneck of a battery manufacturing process in terms of time and resources. Since this process is used for every battery cell in the production process, it may involve a designated channel to activate each cell, and attention from an operator over the entire process. Battery manufacturers acquire a large number of formation channels to handle the production volume, accompanied with commensurate amount of electricity and thermal control capability. The formation process in some manufacturing facilities is developed by empirical optimization by experiments and tests to ensure such formation process suits the production process and schedule. This formation process may not have the capability to monitor the process during formation. The results from the formation may be validated by testing to ensure the cells exhibit a few characteristics that meet the specification to ensure the functionality of the cells as designed.

Tracking active lithium (Li) inventory is desirable (e.g., the most desirable) and a reliable way to understand rechargeable Li battery performance and degradation but no readily accessible techniques can probe the Li inventory non-destructively during the cell lifetime. Failure Mode and Effect Analysis (FMEA) and Failure Modes, Mechanisms and Effects Analysis (FMMEA) remain as the traditional context for diagnostic and testing of energy storage devices to mitigate device failures. However, the state-of-the-art FMEA or FMMEA remain empirical and semi-quantitative.

BRIEF SUMMARY

Embodiments disclosed herein include a method of analyzing an energy storage device. The method may include normalizing charge and discharge voltage profiles of the energy storage device responsive to respective measured capacities of the charge and discharge voltage profiles to obtain normalized charge and discharge voltage profiles as a function of a normalized capacity; averaging the normalized charge and discharge voltage profiles to obtain an averaged voltage profile as a function of the normalized capacity; determining an internal resistance representative of a difference in a potential between the charge or discharge voltage profiles and the averaged voltage profile divided by an applied current; determining a current-resistance (IR) potential responsive to a measured current and the determined internal resistance; determining IR-free voltage charge and discharge profiles of the energy storage device as a function of one of a measured capacity or the normalized capacity of respective charge and discharge voltage profiles and responsive to the determined IR potential and the averaged voltage profile; and determining a ratio between a capacity change and a voltage potential change in a charging or discharging process of the energy storage device over a predetermined interval of time responsive to the determined IR-free voltage charge/discharge profiles.

When examining the charge or discharge voltage profiles, the averaged voltage profile, and the IR-free charge or discharge voltage profiles as a function of the measured capacity or the normalized capacity, a quantity called "capacity ration" can be calculated from these voltage profiles in the form of capacity or specific capacity, which is the capacity per weight of the electrode active material in the electrode; per percentage of the change in the state-of-charge (SOC), per percentage of the normalized capacity change, or per percentage of the lithium, or electroactive ions such as sodium, potassium, or other alkaline elements, etc.; stoichiometric change in the electrode active material's composition as expressed in the chemical formulation, which is the lithium content in the electrode.

Additional embodiments include another method of analyzing an energy storage device. The method may include determining IR-free voltage charge and discharge profiles as a function of a measured capacity or a normalized capacity; determining a capacity ration based, at least in part, on the IR-free voltage charge and discharge profiles; determining a theoretical capacity and a theoretical capacity ration responsive to a chemical formulation of an electrode active material; determining an electrode active material utilization coefficient responsive to a ratio of the capacity ration of respective IR-free voltage charge or discharge profiles and the theoretical capacity ration; and correcting the IR-free voltage charge or discharge profiles using the electrode active material utilization coefficient to obtain IR-free voltage versus lithium content charge or discharge profiles.

Further embodiments include another method of analyzing an energy storage device including optimizing a formation process of an energy storage cell responsive to an optimized internal resistance, an optimized utilization coefficient of an electrode active material, and an optimized range of lithium content in the electrode active material for a charge and discharge process; and generating one or more parameters for energy cell formation control responsive to the optimized formation process, the optimized utilization coefficient, and the optimized range of lithium content.

Still further embodiments include another method of analyzing an energy storage device including optimizing a formation process of an energy storage cell responsive to an optimized internal resistance, an optimized IR potential, an optimized capacity ration, and an optimized utilization coefficient of an electrode active material based on a capacity or a lithium inventory; and generating one or more parameters for energy storage cell formation control responsive to the optimized formation process, the optimized IR potential, the optimized capacity ration, and the optimized utilization coefficient of the electrode active material.

Still further embodiments include another method of analyzing an energy storage device. The method may include determining a utilization coefficient of an electrode active material of the energy storage device; determining optimized IR-free voltage profiles of the energy storage device as a function of a lithium content of the electrode active material; determining a state-of-charge (SOC) of the energy storage device based on the lithium content of the electrode active material; determining IR potential and IR-free voltage profiles of the energy storage device; quantifying the utilization coefficient of the electrode active material; determining a lithium inventory utilization and a lithium inventory retention of the energy storage device; and determining whether a predetermined testing goal has been reached responsive to one or more of the determined utilization coefficient, the determined optimized IR-free voltage profiles, the determined SOC, the determined IR potential, the IR-free voltage profiles, the quantified utilization coefficient, the determined lithium inventory utilization, or the lithium inventory retention.

Still further embodiments include yet another method of analyzing an energy storage device including determining one or more IR-free voltage profiles responsive to a ratio between a capacity change and a voltage change in a charging or discharging process of the energy storage device over a predetermined interval of time for the energy storage device; determining a capacity ration responsive to the determined IR-free voltage profiles; and determining a utilization coefficient of an electrode active material responsive to the determined capacity ration.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Figure 1:
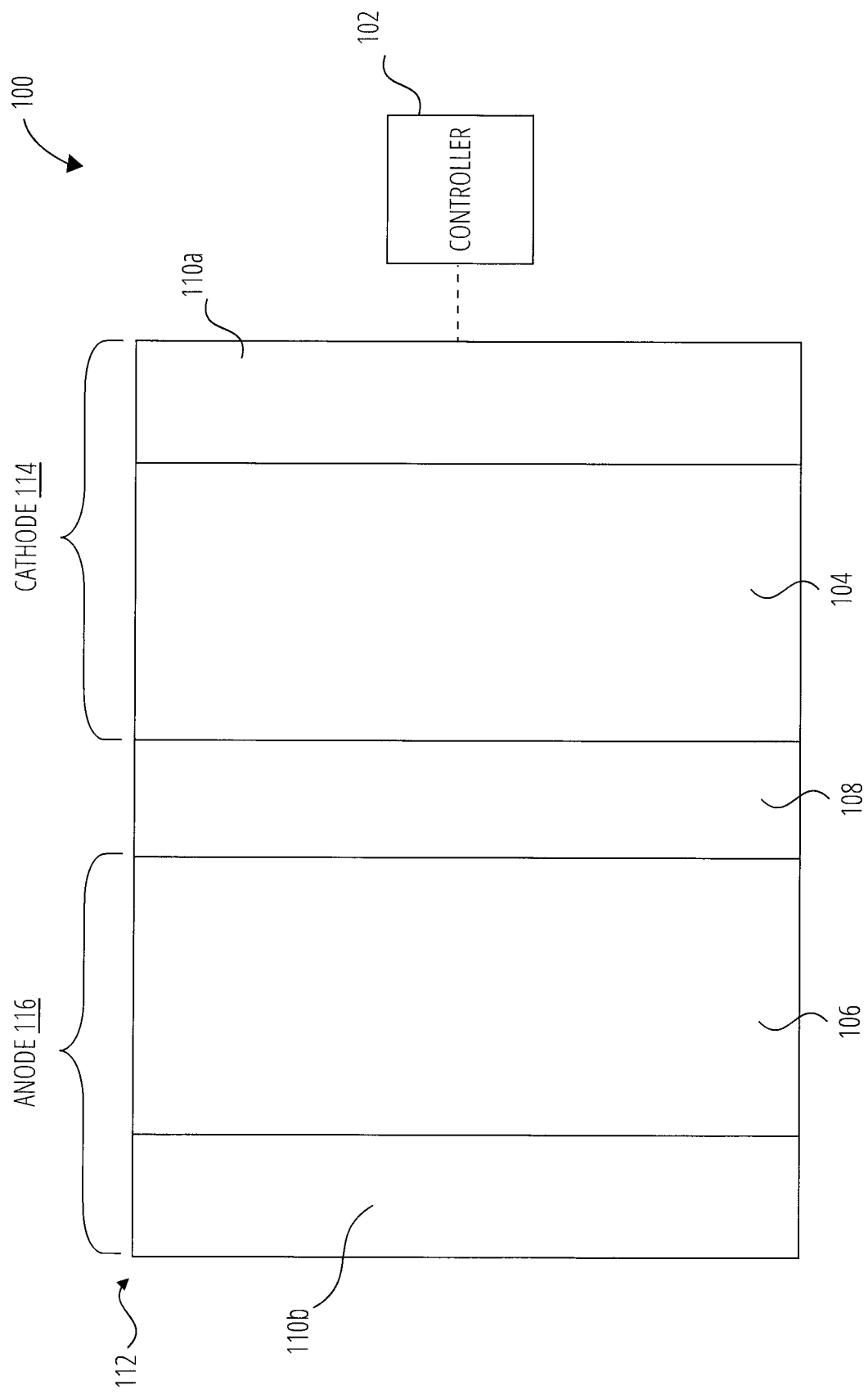
FIG. 1 illustrates a schematic diagram of an electrochemical energy storage system, according to one or more embodiments of the present disclosure.

In the following detailed description, reference is made to the accompanying drawings, which form a part hereof, and in which are shown, by way of illustration, specific examples of embodiments in which the present disclosure may be practiced. These embodiments are described in sufficient detail to enable a person of ordinary skill in the art to practice the present disclosure. However, other embodiments enabled herein may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. In some instances similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

It will be readily understood that the components of the embodiments as generally described herein and illustrated in the drawings could be arranged and designed in a wide variety of different configurations. Thus, the following description of various embodiments is not intended to limit the scope of the present disclosure, but is merely representative of various embodiments. While the various aspects of the embodiments may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art will understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the embodiments disclosed herein may be implemented or performed with a general purpose processor, a special purpose processor, a digital signal processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to embodiments of the present disclosure.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may include one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

As used herein, the term "pseudo" in the context of pseudo-open circuit voltage (pseudo-OCV) versus SOC or pseudo-OCV vs. SOC curves is indicative of the idea that the equilibrium OCV is estimated in the best effort, which is not a "truly measured" OCV. Stated another way, pseudo-OCV is the averaged voltage from the normalized charge/discharge voltage profiles as a function of the normalized capacity.

In the present disclosure, a quantification method is disclosed to determine the utilization efficiency of electrode active materials in a battery cell. This method may include analyzing the efficiency of the active material that contributes to the capacity of the battery cell under a testing operating condition responsive to battery testing or operating data.

Rechargeable lithium (Li) batteries enable advanced consumer electronics, vehicle electrification and utility grid energy storage applications. Battery performance is sensitively related to the utilization of electrode active materials (EAM) in a battery cell. To date, battery performance relies on laboratory testing against the specification for a specific application. However, there is no direct determination technique that can reveal how efficient the EAM is being used in a battery or even in an electrode.

Currently, test results may evaluate the capacity received in the tests or coulombic efficiency during charging and discharging processes. The capacity and coulombic efficiency may be good indices to reflect if EAMs in the battery are being properly used in the cell. Nonetheless, there is no quantification method today to accurately depict the actual utilization of the EAM in a cell or an electrode and its efficiency in any operating condition. Various embodiments disclosed herein relate to a technique that may reveal the utilization efficiency of EAMs in a cell or even in an electrode, as an in situ, operando characterization tool. The technique is based on an electrochemical analytic diagnosis (eCAD) method to quantify a variable of cell capacity in battery performance, sometimes referred to as a "capacity ration" or equivalently "QR." The capacity ration measured in a battery during operating or testing is a quantity that depicts how much capacity is released from a percentage of state-of-charge (SOC) from a battery during a specific charging or discharging condition. An "equivalent" capacity ration may refer to how much capacity is released from a fraction of the lithium content in the electrode or the EAM composition and stoichiometry. A "theoretical" capacity ration refers to how much capacity is expected to be released from a traction of the lithium content in the electrode loading or the EAM composition and stoichiometry.

Determination of this quantity QR using the eCAD method may enable calculation of the "effective amount" of EAM that was used in the charge or discharge process to release the capacity of the cell. The quantification of QR may further enable determination of the utilization efficiency of the EAM in this charge or discharge process. This quantification of QR may also be used to determine the QR for a cell for a condition or for an electrode as in the same condition.

Knowing QR may be useful for battery cell design, prototyping, production quality control, and system operation. For instance, knowing QR may help a battery cell designer to assess how efficiently the cell design can use EAM for better performance, improve energy and power capability, cycle life, and may eventually improve yield in a production. The ability to determine QR may also help, for example, engineers to evaluate if the design and the cell performance characteristics may be scaled up from coin cells to a production cell with the same efficiency, which is a greater refined index parameter than capacity or coulombic efficiency.

Likewise, determining QR may allow, for example, production engineers to monitor the production quality with a more sensitive parameter than those produced from the test results. This ability to monitor the production quality with a more sensitive parameter may greatly improve and assure production quality and yield, thereby reducing waste and cost. The quantification of QR also may enable, for example, system engineers to trace and evaluate the variations in the utilization efficiency of an EAM in a cell during system operation and control. Such diagnostic and prognostic capability may improve system durability, reliability, and safety. These examples are a non-exhaustive list of potential benefits of embodiments of the present disclosure.

As advanced rechargeable Li batteries become the battery of choice for consumer electronics, vehicle electrification, and grid energy storage, the supply chain for battery production and deployment is becoming more reliant on system durability, reliability, and safety. The present disclosure presents a component in a battery diagnosis and prognosis paradigm that may enable detailed characterization of battery applications, from EAM selection, electrode architecture, to cell balance (balance-of-plant) in battery cell design; to prototyping, process optimization and cell production and deployment for practical applications. Determining capacity ration to yield EAM's utilization efficiency may also address many issues in a battery supply chain. The disclosed technique may also improve supply chain production capability, reliability, safety, and lead to cost reduction. Various embodiments according to the present disclosure also present a potential to help the battery supply chain to avoid recalls and support technology development and deployment (TDD), which may assist in managing faults and risks in the industry.

It is also worth noting that failure analysis (FA) and failure mode and effect analysis (FMEA) is a large part of the battery supply chain to improve battery production quality and yield and to mitigate liability due to concerns in reliability and safety. Various embodiments according to the present disclosure may create a new paradigm using quantitative verification to enable cell design, prototyping, production, and operation via FMEA validation. The techniques disclosed herein may present several advantages to customers in the battery supply chain, including battery materials suppliers, battery design and engineering companies, battery manufacturers, battery energy and power system integrators (manufacturers' customers), battery system operators, and end-users.

Tracking active lithium (Li) inventory may be a reliable way to understand rechargeable Li battery performance and degradation, but no readily accessible conventional techniques may probe the Li inventory non-destructively during the cell lifetime. The present disclosure discloses various embodiments including validated methods to track Li inventory in, for example, the formation cycle of Li—Li$_x$Ni$_{0.8}$Mn$_{0.1}$Co$_{0.1}$O$_2$ (NMC811) or other transition metal oxides as cathode active materials in single cells, which may offer certain advantages compared to the capacity measurements alone. By tracking Li inventory in the formation process, an accurate account and insightful understanding of the Li inventory retention in the cell performance are accomplished and validated. The method may allow precise cathode material engineering and modification, electrode formulation and processing, cell design and fabrication, and accurate state function estimation in battery management systems. The method may also provide more tangible information to mitigate capacity loss and improve battery performance, life, reliability, and safety in the future.

Furthermore, FA and FMEA are weak links in the battery supply chain. To enable quantitative FA and FMEA to improve battery supply chain reliability, the disclosed battery diagnosis and prognosis may offer a potential solution. The battery product development cycle using "empirical design-build-test" or DBT approach is resource limited, time consuming, and costly. This DBT methodology is not reliable because it is often a black-box approach that relies on a large set of data from testing. Testing sometimes involves a heavy investment on equipment, facility, and personal training, and is prone to human errors. The data obtained from testing cannot avoid bias, error and complicity of the influences from test conditions. These factors are raising the cost for production but also introduce a significant number of faults and risks that the DBT cannot handle.

The various embodiments disclosed herein may allow for the determination of effective EAM utilization in battery materials, electrodes, and cells during charging and discharging processes and may improve eCAD's ability to serve in quantitative FA and FMEA. The presented techniques may also extend the benefits of eCAD with enhanced capability to reduce the impact on environment (e.g., emissions, pollutions) and promote societal impacts of clean energy by introducing a reliable and trustworthy manufacturing capability for battery supply chain. For the rechargeable battery industry, this may impact a $30-$50 billion sector. For broader impact on other manufacturing sectors, this approach may create more value for product developments that rely on conventional DBT cycles.

Using the techniques of the present disclosure together with eCAD to quantify EAM utilization in actual cells may help to realize the potential of FA and FMEA. This approach may readily take battery data from testing or operation to conduct analysis and interpretation from the data to evaluate how efficient an EAM is being used during the testing or operating condition. The information obtained in this manner may be used to verify materials, electrodes and cell's performance in a realistic situation. This capability may further facilitate battery material development, design of electrode architecture, or cell component design and integration in prototyping. It may also improve the optimization process in these operations to offer quantitative guidance and comparison. Various embodiments disclosed herein may be used in production to monitor quality of the component fabrication, process control, and final product quality assurance. The information collected through the process of product development and production cycle can be used in assessment, verification, and validation of the production efficiency, yield, and reliability in quality control. Further, once the product is deployed, the cell performance may be monitored to trace the product performance, degradation and aging, and performance reliability for safety assessment. This battery analytic diagnosis and prognosis is an improvement to the current art in battery manufacturing and deployment. Using FA and FMEA based eCAD and evaluation to enhance battery design-development and production cycle may ensure durability, quality, reliability and safety in battery production and usage.

Various embodiments of the present disclosure may provide an improvement to the formation process from the early development of protocols to the final products. In some examples, the characterization method of quantifying electrode active material's utilization may provide a quantitative method to monitor the efficiency of the formation process. This ability may improve the formation process with quantitative control capability, which may be a benefit to battery manufacturers. The techniques of the present disclosure may also give formation machine manufacturers the ability to produce better machinery and control strategies.

By way of non-limiting examples, various embodiments of the present disclosure may provide: better control in (1) the development of formation protocols, (2) optimization of such protocols with quantitative feedback, (3) in-process monitoring capability to conduct formation quality control, (4) well-anticipated outcomes with formation for product quality control and assurance, (5) collecting quantifiable information of the formation process for future product development and improvement, and (6) providing detailed metrics related to product specification to improve production yield, product selection and qualification, and for product tracking for potential recall and failure analysis. There may be potential uses beyond formation, so the entire life cycle of the cell may be tracked, managed, and protected.

Because the formation process may be an important operation in the battery manufacturing supply chain, the various embodiments of the present disclosure may improve the quality control of the formation process and the outcomes. The cost saving from reduction of the time in protocol development, the duration of the formation process, and the resource, labor, and time in the process, may be significant and important to stakeholders in the development and application of the formation process, which include, for example, design engineers, production engineers, quality control engineers, production managers, formation machine manufacturers, and end-users who need cost effective and reliable products.

Battery manufacturing supply chain may enjoy a more rapid development cycle for better products, a more efficient production process, more reliable technology to reduce wastes and costs, and more cost reduction from design to deployment with shortened production development cycle.

This detailed characterization technique according to various embodiments disclosed herein may also enhance the control, optimization, and efficiency of the formation process in batteries to ensure better yield and performance propensity in quality control and assurance. Further benefits may include, by way of non-limiting examples, energy and cost reduction, shortened time to market, and enhanced productivity for battery manufacturing.

Lithium inventory tracking via proper quantification and validation may enable the ability to follow the Li utilization in a rechargeable Li battery (RLB), which may change during the lifetime of a battery due to the extreme reactivity of Li metal. Although the Li content may be determined by destructive chemical analysis, there is no generally accessible conventional method to track Li inventory in an operating battery cell. Therefore, researchers may conventionally rely on electrochemical measurements of charge (e.g., capacity) to assess cell performance under the assumptions that "a one-to-one correspondence between charge and Li content in the cell" holds, while Coulombic efficiency (CE) indicates the efficiency of charge retention. In practice, side reactions and self-discharge processes may invalidate these assumptions and skew observations. Whether CE is a proper indicator of an accurate account of the charge transfer and retention has been a subject of recent debate, but the subject of any discrepancy between the capacity and the Li inventory retention has not been clarified. It may be difficult to interpret electrochemical data without properly validated relationships among the active material, electrode formulation, and cell performance. Thus, when it is possible to reliably track the Li inventory from one sample to another, from one cell to another, from one experiment to another, and from one laboratory to another, the durability, reliability, and safety of RLBs may be improved. The various embodiments of the present disclosure relate to a simple but reliable electrochemical analytic method for Li inventory quantification. Tracking is demonstrated and validated with complementary synchrotron diffraction experiments.

To demonstrate the ability of tracking Li inventory, the data from the formation cycle of Li-NMC811 cells was used as examples. Two types of cells comprising Targray (T) and EcoPro (E) NMC811 in pouch (P) or coin (C) cells respectively were evaluated in the formation cycle to show the sensitivity of this method in distinguishing any differences in cathode material utilization and performance. As the cell formation may help to ensure optimized battery performance, the first cycle capacity loss (FCCL) may determine the cathode material utilization in a cell design and its performance. The first cycle capacity loss may be reduced to achieve high specific energy and long cycle life. An accurate account and reliable method to understand the origin of first cycle capacity loss and optimize the cell formulation may be desirable.

In the present disclosure, applying an electrochemical analytic diagnosis (eCAD) for Li inventory tracking is demonstrated to resolve the first cycle capacity loss changes of Li-NMC811 cells in T-P or E-C configurations with three upper cutoff voltages (Vmax=4.2, 4.4, and 4.6 V). The principle that governs the Li inventory tracking is the universality of the relationship between the equilibrium open circuit voltage (OCV) and the Li content in NMC811 (i.e., x in $Li_xNMC811$). Applying this strict thermodynamic relationship to track Li inventory during polarization may be impractical according to conventional approaches. However, by using an approximation by plotting the "IR-free" voltage ($V_{IR-free}$) as a pseudo-OCV against the state-of-charge (SOC) that is based on the Li content in NMC811, this difficulty may be overcome. The universal applicability of the pseudo-OCV vs. SOC curve to track Li inventory is demonstrated in FIG. 2. The data transformation method from typical charge and discharge voltage profiles exhibiting polarization effects to a Li-content-based analysis that is independent of cell polarization is shown in FIG. 3. The accuracy of transforming the capacity measured under polarization conditions into an equivalent Li content change in NMC811 is validated in FIG. 4. Tracking the Li inventory in NMC811 to provide information about the utilization of NMC811 in the cathode during formation and its dependence on the cell formulation is shown in FIG. 5. This allows an in-depth understanding of the mechanism on capacity and Li inventory retention (see FIG. 6) at different levels (from material, electrode, to cell) synergistically, providing a generally accessible method to obtain well quantified information to design batteries with improved performance.

The eCAD method described herein may enable determination of the Li content in NMC so that kinetic effects and their impact on the accessible capacity of a cell may be readily quantified. The Li content in NMC reflects the extent of the delithiation (charge) and lithiation (discharge) of the cathode material in a cell. As the NMC composition changes during these reactions, the Gibbs free energy of the NMC reaction with Li also varies, as reflected in the equilibrium potential of the cathode in a complex manner. Although this relationship is complex, the Gibbs free energy of the NMC reaction is a state function (that depends on the Li content in NMC) that may be captured by a universal curve depicting a well-defined thermodynamic equilibrium OCV to the NMC composition, or equivalently, the SOC of the cathode material relationship. Even though the true thermodynamic potential as a function of NMC composition cannot be directly measured during polarization, true thermodynamic potential as a function of NMC composition may be reasonably approximated by averaging the charge and discharge profiles determined at a very slow rate like C/20 or readily determined by the Galvanostatic intermittent titration technique (GITT) with a sufficient rest duration for equilibration in an incremental fashion. In FIG. 2(a)-(c), the consistency and conformity of various OCV vs. SOC profiles obtained by both methods are shown. A detailed discussion is provided herein to explain how these data sets confirm the universality and generality of these potential profiles in providing a reliable basis for cross-platform comparisons with data obtained in various cathode and electrolyte formulations, cell configurations, and test conditions.

The SOC, as discussed herein, may be based on the Li content in the cathode material, such as NMC811. This convention may be different from the ones reported in most of the conventional literature, which is largely based on the measured capacity rather than the Li content in the cathode material. The distinction between the two (i.e., the capacity vs. the Li content in the cathode material) may be one distinction between some of the embodiments disclosed herein and some conventional practices. Using the Li content in the cathode material as the basis for the SOC determination is a framework that may be based on thermodynamic principle, and it may minimize the influence of the kinetic effect under the polarization during the charge or discharge measurements of the capacity. Because of the reliance on the compositional dependence in the phase relationship, various embodiments disclosed herein may offer a reliable basis for cross-platform comparisons that are free from polarization (kinetic) effects. The framework used by this work thus may differ from conventional frameworks that use the measured capacity as the basis, which is often affected by the reaction kinetics and thus may not be able to serve as a reliable basis for cross-platform comparisons.

With this perspective on SOC, the electrochemical analytic diagnosis (eCAD) technique may have the ability to separate the thermodynamic aspects (e.g., Li inventory loss due to side reactions) from the kinetic ones (e.g., the recoverable capacity loss due to the lag created by the electrode reaction kinetics because of the slow Li transport in the electrode and the associated Li concentration gradient that produces a rate-dependent voltage and capacity hysteresis). Such a difference may have been overlooked in past conventional approaches and literature.

The correspondence of the IR-free voltage ($V_{IR-free}$) profile with the true Li content variation in NMC may be a reliable basis for inferring the capacity changes in the electrode reaction through Li inventory tracking.

FIG. 1 illustrates a schematic diagram of an electrochemical storage system 100. The electrochemical storage system 100 may include an electrochemical storage device 112 and a controller 102 for performing one or more operations on or using the electrochemical storage device 112. The electrochemical storage device 112 may include an anode 116, a cathode 114, and a separator 108. The cathode 114 may include a current collector 110a and a positive electrode active material 104 suspended in an electrolyte. The anode 116 may include a current collector 110b and a negative electrode active material 106 suspended in an electrolyte.

Figure 2:
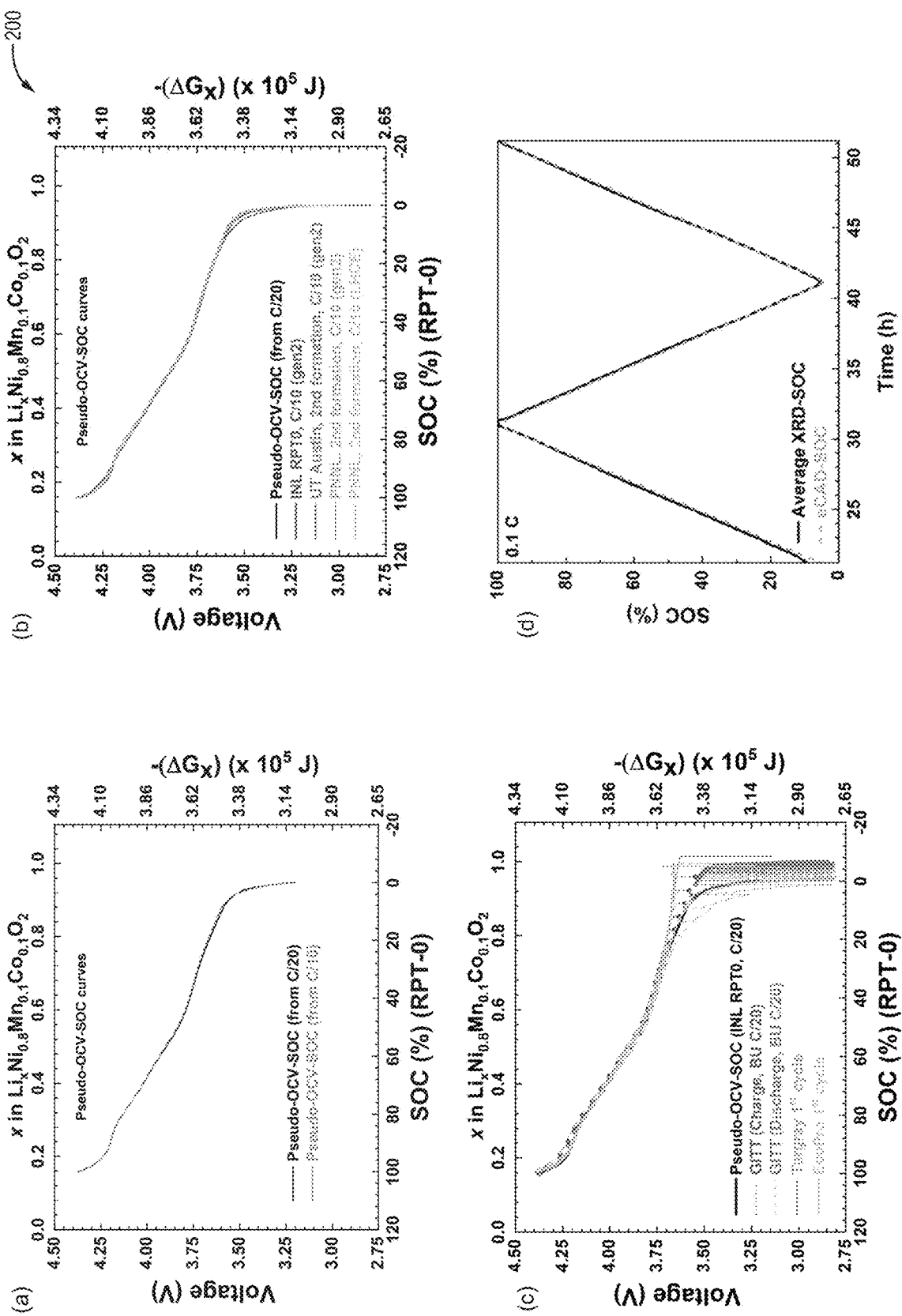
FIG. 2 is a series of plots illustrating a comparison of the pseudo-open circuit voltage (pseudo-OCV) versus state-of-charge (SOC) or pseudo-OCV vs. SOC curves obtained from various methods, according to some examples.
Figure 3:
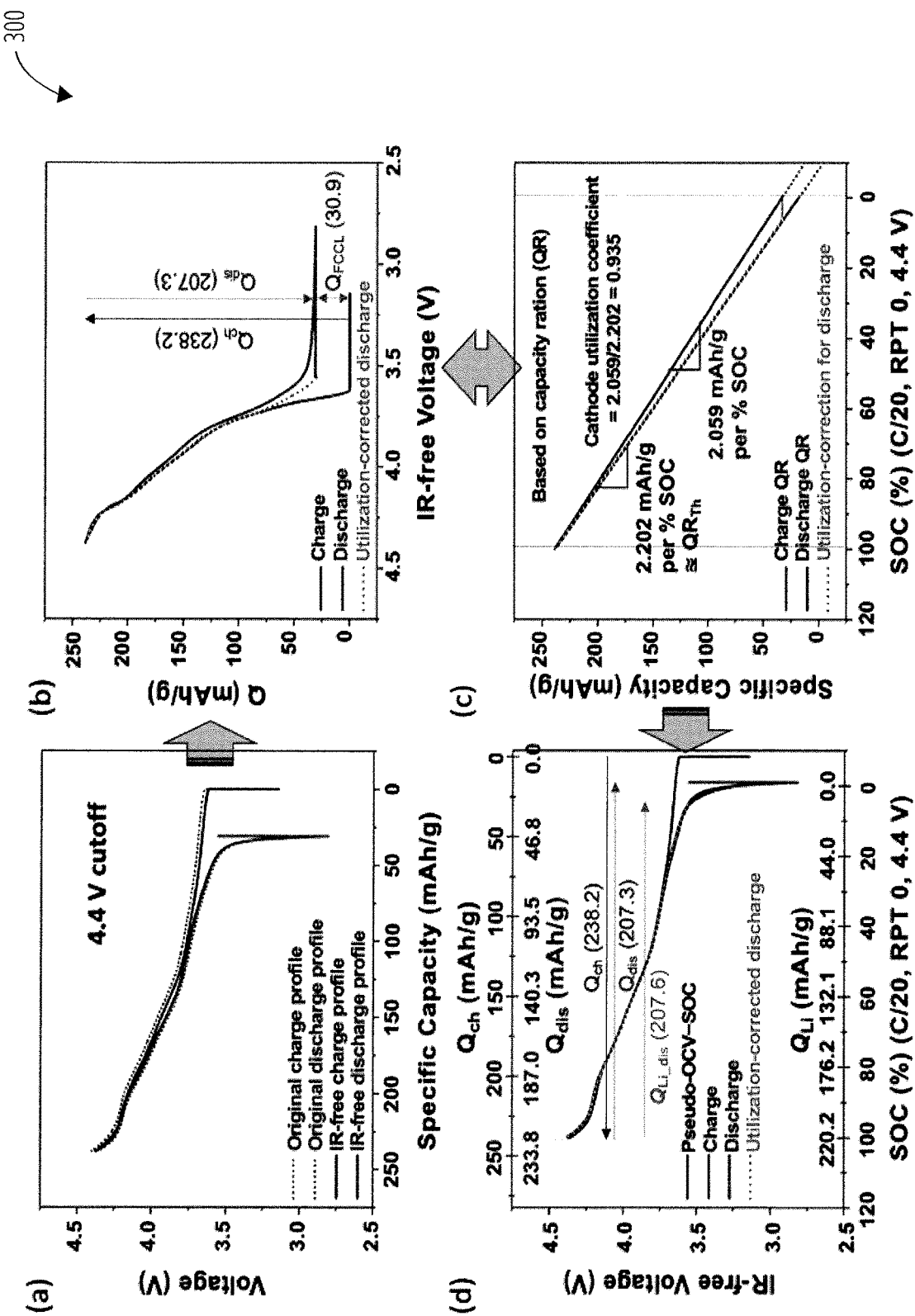
FIG. 3 is a series of plots that illustrate the transformation of voltage profiles in the formation cycle into an SOC-based analytical framework that is aligned with the lithium (Li) content (x) in the cathode active material for tracking Li inventory, which is the lithium content in the cathode active material and its change and retention during the formation cycle, according to some examples.

FIG. 2 is a series of plots 200 (plots (a)-(d)) illustrating a comparison of the pseudo-OCV vs. SOC curves obtained from various methods: plot (a) illustrates a result associated with using a Targray coin (T-C) cell with C/20 and C/10 respectively in an initial reference performance test (RPT0), plot (b) illustrates a result associated with using different cathode formulations, cell configurations, and electrolyte compositions measured at various labs, plot (c) illustrates a result associated with using the OCV profiles obtained from galvanostatic intermittent titration technique (GITT) on an EcoPro coin (E-C) cell in the formation cycle, also exhibited are the formation cycle of a T-P cell and an E-C cell; and plot (d) illustrates using temporal SOC excursion profiles at C/10 determined by synchrotron X-ray diffraction (XRD) and eCAD.

Referring to plot (c) of FIG. 2, the voltage profiles of an EcoPro coin (E-C) cell with stepwise rest periods in GITT, where the equilibrium OCV at each increment in the formation cycle may be traced (to represent the "OCV vs. Li content in NMC" relationship), and the pseudo-OCV vs. SOC curve (which is determined by a Targray coin (T-C) cell at C/20 ($Q_{C/20}$)) may be compared to show the close agreement between the two, indicating that a proper alignment of the Li content and SOC is established. Thus, the ability of eCAD to probe the thermodynamic OCV effectively vs. the Li content in NMC in the experiments may be verified. However, plot (c) of FIG. 2 also indicates that eCAD may probe NMC cathodes reliably over the Li contents between x=0.26 and 0.86 (where x is the Li content in NMC811) or alternatively in the IR-free voltage range of 3.60 V-4.18 V by using the pseudo-OCV vs. SOC curve due to the kinetic effects that limit access to low SOCs (<9%) and high SOCs (>84%). The sluggish Li transport may also constrain an effective NMC811 capacity utilization.

Still referring to plot (c) of FIG. 2, to remove one Li from a fully intercalated NMC811 (x=1.0) to x=0 may take 27.5 mAh/g theoretically. Two formation charge profiles from a T-P and an E-C cell with Vmax=4.4 V are also displayed in plot (c) of FIG. 2. The E-C cell gives a capacity measured in the charge process $Q_{ch}$=228.2 mAh/g, while the T-P cell $Q_{ch}$=238.2 mAh/g. The E-C cell used in GITT yielded $Q_{ch}$=232.9 mAh/g. Thus the incremental charge in GITT with periodic rests led to a slightly higher capacity than the continuous charging. Since the T-P cell exhibited the largest capacity to reach 4.4 V, its highest Li content was assumed as x=1.0. Therefore, as shown in plot (c) of FIG. 2 the Li content x may vary from 1.0 to 0.13(5) in the T-P cell during charging of the formation. At the end-of-charge (EOC), four IR-free voltage profiles aligned well, depicting that they reached rather identical Li content at 4.4 V. Thus, the three (T-P, E-C, and GITT) cells in the formation may still endure slightly different utilization that led to the disparity in the initial Li content at the beginning-of-charge (BOC). After the formation, the T-C cell yielded an averaged capacity measured at C/20 $Q_{C/20}$=220.2 mAh/g between 2.8 V (Vmin) and 4.4 V (Vmax) in the initial reference performance test (RPT0), implying that the capacity is limited in the voltage range of 2.8 V-4.4 V by the test protocol. Comparing $Q_{C/20}$ against $Q_{ch}$ in GITT, the shortage may be due to the sluggish Li transport in the intercalation, as shown by the increasingly frequent rest periods in GITT by the cutoff at 2.8 V. By examining the region of SOC=84%-9% or x=0.26-0.86, where the Li content and SOC aligned excellently, ΔSOC=75% is equal to Δx=0.60, which gives a theoretical capacity ration $QR_{Th}$=2.204 mAh/g·% SOC, almost identical to the 2.202 mAh/g·% SOC derived from $Q_{C/20}$, as shown in plot (c) of FIG. 2. This verification may indicate that $Q_{C/20}$ may be close to the theoretical capacity confined by the IR-free voltage range of 2.8 V-4.4 V (thus, $Q_{Th}$ (2.8-4.4 V)=220.4 mAh/g with Δx=0.80). Subsequently, the $Q_{Th}$ (2.8-4.2 V)=186.6 mAh/g with Δx=0.68 and $Q_{Th}$ (2.8-4.6 V)=235.1 mAh/g with Δx=0.85 may be determined and verified with GITT experiments. The determination of $QR_{Th}$ and $Q_{Th}$ under various IR-free voltage windows may provide a theoretical basis and framework to determine the NMC cathode utilization efficiency under any polarization. For instance, it may be concluded that $Q_{C/20}$ harnessed 99.9% of $Q_{Th}$ (2.8-4.4 V) in the T-C cell and 92.4% of the $Q_{ch}$ (238.2 mAh/g) in the T-P cell formation, which are relevant information that will help us understand the context of CE later.

With continued reference to plot (c), it may be possible to validate the conformity of the pseudo-OCV vs. SOC curve obtained at C/20 with a Targray coin (T-C) cell (in which IR-free voltage is used as the basis for Li content inference) with the rest voltage ($V_{rest}$) profiles determined by GITT with an EcoPro coin cell, in which the OCV at equilibrium is a well-defined function of the Li content in NMC. Furthermore, the GITT data may be obtained in the formation cycle where the initial Li content is known. In contrast, the pseudo-OCV vs. SOC curve may be derived from the data in an initial reference performance test (RPT0) after the formation cycle. The consistency in the alignment of the voltage profiles (i.e., IR-free voltage vs. the rest voltage) with the Li content in NMC (thus, SOC) may provide a universal basis to track Li inventory and to examine and decipher any discrepancies between the capacity and Li inventory during the polarization. Some examples of using the validated pseudo-OCV vs. SOC curve for cross-platform comparisons by tracking Li inventory are discussed herein.

An example independent confirmation of the effectiveness of the eCAD method is shown in plot (d), which shows the agreement between the electrochemically determined SOC from eCAD and that determined from an analysis of changes in the NMC811 unit cell volume that may be directly characterized by synchrotron X-ray diffraction (XRD) experiments. These two measurements may be done independently and probed different physical responses of the cathode material. The close agreement between the independently determined SOCs indicates that both methods may relatively precisely track the Li content changes in NMC during cycling.

With continued reference to plot (d) of FIG. 2, it may be possible to validate the consistency of the Li content in NMC with SOC by comparing the temporal SOC excursion profiles from (1) a synchrotron XRD experiment in which the unit cell of the lattice parameter variations in NMC may be used to infer the Li content in the lattice and (2) the SOC profile determined by the eCAD method based on the data transformation delineated in FIG. 3. The substantial agreement between the two may demonstrate the validity in tracking the Li inventory using the pseudo-OCV vs. SOC curve to decipher the Li content changes in the cathode material under any polarization condition.

Detailed information about the source of the NMC811 cathode materials, electrode formulations, and the cell assembly configurations (including the electrolyte formulations) that yield plots (a)-(c) of FIG. 2 is provided below. A few pseudo-OCV vs. SOC curves explicitly derived from various combinations of the above formulations and test conditions are compiled and exhibited in FIG. 2 to validate the consistency and generality of using such kind of curves for Li inventory tracking:

1. Comparison of different rates in the testing conditions: A Li-NMC811 Targray coin cell with Gen2 electrolyte which comprised 1.2 M lithium hexafluorophosphate ($LiPF_6$) in a 3:7 (w/w) mixture of ethylene carbonate (EC) and ethyl methyl carbonate (EMC) with 2 wt % vinylene carbonates (VC) may be conducted with C/10 and C/20 rates.

2. Additional cells of different configurations and sizes may be used in the comparisons with the result obtained in plot (a) of FIG. 2:
   i. Comparison of different sources of NMC811 and electrode formulations: A coin cell made of NMC811 particles may be synthesized with a grain size and morphology different from that of plot (a) of FIG. 2. The Gen2 electrolyte (the same composition as detailed in plot (a) of FIG. 2) may be used in this cell.
   ii. Comparison of different electrolyte compositions, cell configurations, shapes, and sizes: Pouch cells fabricated and tested using either Gen2 electrolyte or a localized high-concentration electrolyte (LHCE), respectively, may be shown for comparison. The LHCE may comprise lithium bis(fluorosulfonyl)imide (LiFSI), 1,2-Dimethoxyethane (DME), 1,1,2,2-Tetrafluoroethyl-2,2,3,3-tetrafluoropropyl ether (TTE) at a molar ratio of 1:1.2:3.

3. Comparison of different electrochemical techniques: A coin cell made of EcoPro NMC811 with Gen2 electrolyte may be evaluated using the galvanostatic intermittent titration technique (GITT) and compared with the results in plot (a) of FIG. 2.

Plots (a)-(c) of FIG. 2 demonstrate the validity, generality, and conformity in deriving a universal pseudo-OCV vs. SOC curve as a reliable basis for cross-platform analysis, diagnosis, and comparison. Thus, the generality of using this eCAD technique in tracking Li inventory may be validated. Plot (a) of FIG. 2 displays substantial agreement between the two curves obtained at C/20 and C/10, respectively. The agreement may indicate that the consistency in the Li content alignment is independent of rate and polarization condition. One noticeable difference between the two is the extent of the SOC correspondence at the end-of-discharge (EOD), where a higher SOC at C/10 was observed than at C/20 due to the rate effect on the depth-of-discharge as expected. In this example, the Li inventory tracking may reveal the difference in the utilization of the NMC capacity by the rate effect.

In plot (b) of FIG. 2, the comparisons among several pseudo-OCV vs. SOC curves may demonstrate the generality of the technique, which may be irrelevant to where and how the data were collected from various sources of NMC811 cathode material, cathode and cell formulations and configurations (e.g., coin versus pouch cells), dimensions and sizes (e.g., from a few mAh in coin cells to >2 Ah in pouch cells), or test conditions (e.g., different rates or cutoff conditions). The conformity and consistency demonstrated by these examples may support the assertion that reliable cross-platform comparisons of the test data from sample to sample, cell to cell, experiment to experiment, and laboratory to laboratory may be conducted with sufficient accuracy and precision for detailed analysis and inference of the results. Such a capability for cross-platform examinations may be beneficial for battery diagnostic and prognostic with universally quantifiable information. Additionally, it may establish a quantitative analytic that offers a number of advantages over other analytics that use electrochemical characterizations.

With reference again to plot (c) of FIG. 2, substantial agreement between the rest voltage profiles obtained by GITT and the IR-free voltage profile in the pseudo-OCV vs. SOC curve is shown. Such a comparison may illustrate the validity of both IR-free voltage and the rest voltage from two electrochemical techniques to exhibit the same Li content correspondence in addition to the synchrotron XRD evidence as shown in plot (d) of FIG. 2. The characteristic of the GITT experiment is that the rest voltage obtained in each charge or discharge operation represents the equilibrium OCV, whereas the pseudo-OCV that comes from averaging charge and discharge profiles at C/20 establishes the IR-free voltage. The unison reflected in the correspondence of the Li content variations in both techniques confirms the basis and the generality of the technique used in this work to track the Li inventory in any NMC electrode.

The comparison between the two voltage profiles from GITT and eCAD also provides a case of cross-examination regarding the utilization of the NMC capacity and Li inventory during and after the formation cycle. For example, the rest voltage in the GITT profiles may be conducted in the formation cycle, while the pseudo-OCV vs. SOC data are obtained in an initial reference performance test (RPT0) at C/20 rate after the formation cycle. As shown in plot (c) of FIG. 2, the region between the two dashed lines from 3.60 V to 4.18 V, or from 9% to 84% in SOC, or from x=0.86 to 0.26, where x is the Li content in $Li_xNMC811$, the rest voltage and IR-free voltage aligned relatively well. This relatively close alignment may indicate the validity that the changes in SOC in the pseudo-OCV vs. SOC curve do represent the true Li content changes in NMC811. Furthermore, assuming the as-prepared NMC811 has a nominal composition of $Li_{1.0}NMC811$, and removing one Li from this composition may take $Q_{ch\_Th}$=275.5 mAh/g. In an example GITT experiment carried out in an EcoPro NMC811 coin cell in the formation cycle, the experiment may result in $Q_{ch\_GITT}$=232.9 mAh/g with a 4.4 V cutoff. The result is corresponding to a removal of 0.84(5) Li in the charge regime without any utilization loss. In the discharge regime, $Q_{dis\_GITT}$=223.1 mAh/g may be yielded due to the sluggish Li transport and the lower voltage cutoff at 2.8 V, indicating a small fraction of the capacity was not fully recovered by the experimental condition. In a typical formation cycle at C/10, a similar EcoPro coin cell of the same formulation yielded $Q_{ch\_C/10}$=229.2 mAh/g in the charge and $Q_{dis\_C/10}$=195.4 mAh/g in the discharge regime, respectively. The comparison indicates a slight deficiency (99.1%) in the utilization of the capacity between a continuous polarization and an incremental process with multiple rests in the charge regime. The comparison in the discharge regime may illustrate a substantial discount in the utilization of the NMC capacity in the continuous discharge against the incremental process, so only 87.6% of the $Q_{dis\_GITT}$ may be gained due to the sluggish Li transport kinetics. This analysis may aid in understanding the origin of the Coulombic efficiency measured at 85.3% for the formation cycle with 4.4 V cutoff, without the implication of any side reaction but the differences in the utilization of the NMC capacity due to kinetic effects.

Based on FIGS. 1 and 2 and associated discussions above, a verification between SOC that is based on $Q_{C/20}$ and the Li content in NMC may delineate the following relationship: the compositional change from x=0.86 to 0.26 (Δx=0.60) is equivalent to the change from 9% to 84% in SOC (ΔSOC=75%). As $Q_{Th}$=275.5 mAh/g is the theoretical capacity for an equivalent one Li removal in NMC811, a theoretical capacity ration of $QR_{Th}$=2.204 mAh/g·% SOC shall be established. Establishing the quantity of $QR_{Th}$ may be useful for assessing the cathode material utilization in an experiment using the reliable SOC determination by the pseudo-OCV vs. SOC relationship for Li inventory tracking.

To emphasize this unique aspect, the analysis in the region <9% SOC may be insightful. As plot (c) of FIG. 2 shows that the IR-free voltage profile exhibits a deviation from the rest voltage (in GITT) with a lower potential at the same SOC, it may be indicative that the sluggish Li transport has impacted the NMC capacity utilization after formation. This observation is also evident from the discharge voltage profile of GITT during polarization, which may exhibit increases in the magnitude of the voltage relaxation in the rest period as the SOC reduces and increases in the frequency of the intermittent operations induced by the lower voltage cutoff at 2.8 V. As a result of the sluggish Li transport, the capacity at C/20 ($Q_{C/20}$) could only achieve on average 220.2 mAh/g in a Targray NMC811 coin cells, as expected from the $QR_{Th}$ for 200% SOC. This cross-examination is a useful example to show the merit of analyzing the kinetic effect of the utilization of the NMC capacity against $Q_{Th}$. Possible restraints include: the intrinsic sluggish Li transport in the cathode material as shown in the discharge intercalation process, and also the test protocol with the upper and lower voltage cutoff settings (as 4.4 V and 2.8 V in this case).

FIG. 3 is a series of plots 300 (plots (a)-(d)) that illustrate the transformation of voltage profiles in the formation cycle into an SOC-based analytical framework that is aligned with the Li content in NMC811 for tracking Li inventory and its retention during cycling. Plot (a) of FIG. 3 illustrates the charge and discharge profiles and the associated IR-free voltage ($V_{IR-free}$) profiles; Plot (b) of FIG. 3 illustrates the transformed correspondence of the specific capacity vs. IR-free voltage; Plot (c) of FIG. 3 illustrates the associated specific capacity and SOC correspondence for charge and discharge profiles that show the utilization disparity between the two; and Plot (d) of FIG. 3 illustrates the reconciled charge and discharge IR-free voltage vs. SOC profiles in correspondence with the Li content in NMC811. Due to the utilization disparity between charge and discharge, the corresponding specific capacity ranges may be expressed in different scales. For clarity, the measured capacities (Q) are denoted differently from those calculated based on SOC or Li inventory ($Q_{Li}$).

FIG. 3 illustrates how to transform the charge discharge profiles in the formation cycle into SOC-based analytic profiles to track the Li inventory in NMC811. Plot (a) of FIG. 3 shows the voltage and the corresponding IR-free voltage profiles of a Targray pouch (T-P) cell with Vmax=4.4 V. Plot (b) of FIG. 3 exhibits the transformed relationship between specific capacity (Q) measured and IR-free voltage, where the first cycle capacity loss ($Q_{FCCL}$) is also indicated. The utilization of the NMC capacity differs between the charge (the long-dashed line, $Q_{ch}$=238.2 mAh/g) and the discharge segment (the solid line, $Q_{dis}$=207.3 mAh/g) with a CE on the order of 87.0%. The difference in cathode capacity utilization is further analyzed in plot (c), where QR is used for comparison. The charge regime recovered 2.202 mAh/g·% SOC, which is in par with $QR_{Th}$, whereas the discharge is only 2.059 mAh/g·% SOC. The ratio $QR_{dis}/QR_{Th}$=93.5% indicates the sluggish Li transport also limits the utilization of the NMC811 capacity between 2.8 V and 4.4 V (i.e., $Q_{C/20}$) in the discharge segment. Compounding the two utilization efficiencies (i.e., 93.5%-92.4%) induced by the sluggish Li transport kinetics explains the resulting CE=87.0%. This verification may also offer a correction to the VIR-free discharge profile. By accounting for this utilization disparity, the IR-free voltage discharge profile may be aligned with the Li content in NMC (as shown in plot (d) of FIG. 3). Thus, the data transformation by eCAD may enable accurate Li inventory in the cathode to be tracked and quantified, whereas the capacity measurement alone may not offer such a clear inference.

With reference to plot (d) of FIG. 3, the correspondence of the four IR-free voltage profiles, are well aligned on the SOC scale with the Li content. However, each VIR-free profile may have a specific capacity scale associated with it, marked by a color code for the charge (the long-dashed line), discharge (the solid line), utilization-corrected discharge (the short-dashed line), and pseudo-OCV (the line bearing dots) curve, respectively. The scales for the charge ($Q_{ch}$, the long-dashed line) and the discharge ($Q_{dis}$, the solid line) are different because the difference in the utilization efficiency in the capacity (Q) measurements. In principle, the utilization-corrected discharge profile (the short-dashed line) and pseudo-OCV (the line bearing dots) curve may follow the same scale based on the Li content ($Q_{Li}$) calculation. In other words, the measured Q depends on the utilization efficiency of NMC under a specific polarization condition, so it may be impractical for direct comparison or for cross-platform analysis. After properly scaled to align with the Li content, the utilization-corrected profiles may then be used for inferring $Q_{Li}$ on a consistent basis for cross-platform comparisons.

Figure 4:
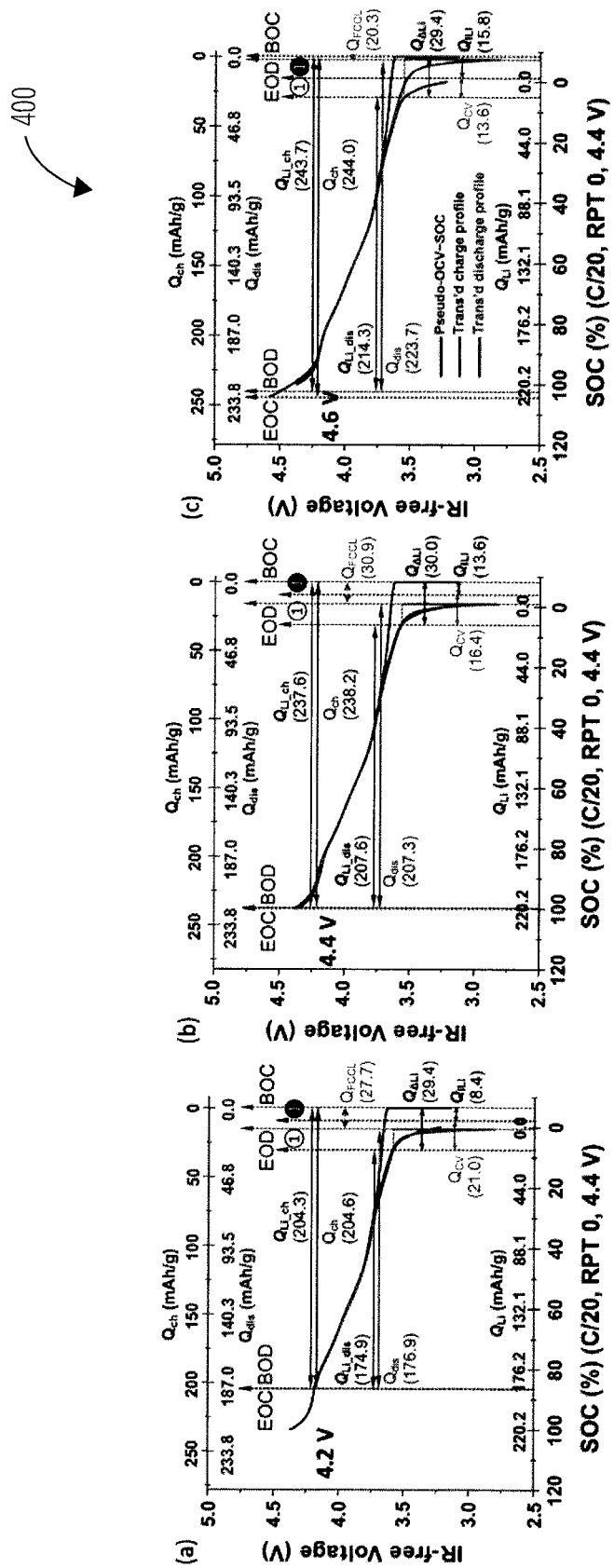
FIG. 4 is a series of plots that illustrate a summary of specific capacity values measured during experiments, and their correspondence with the lithium content changes during the charge and discharge processes, according to some examples.
Figure 5:
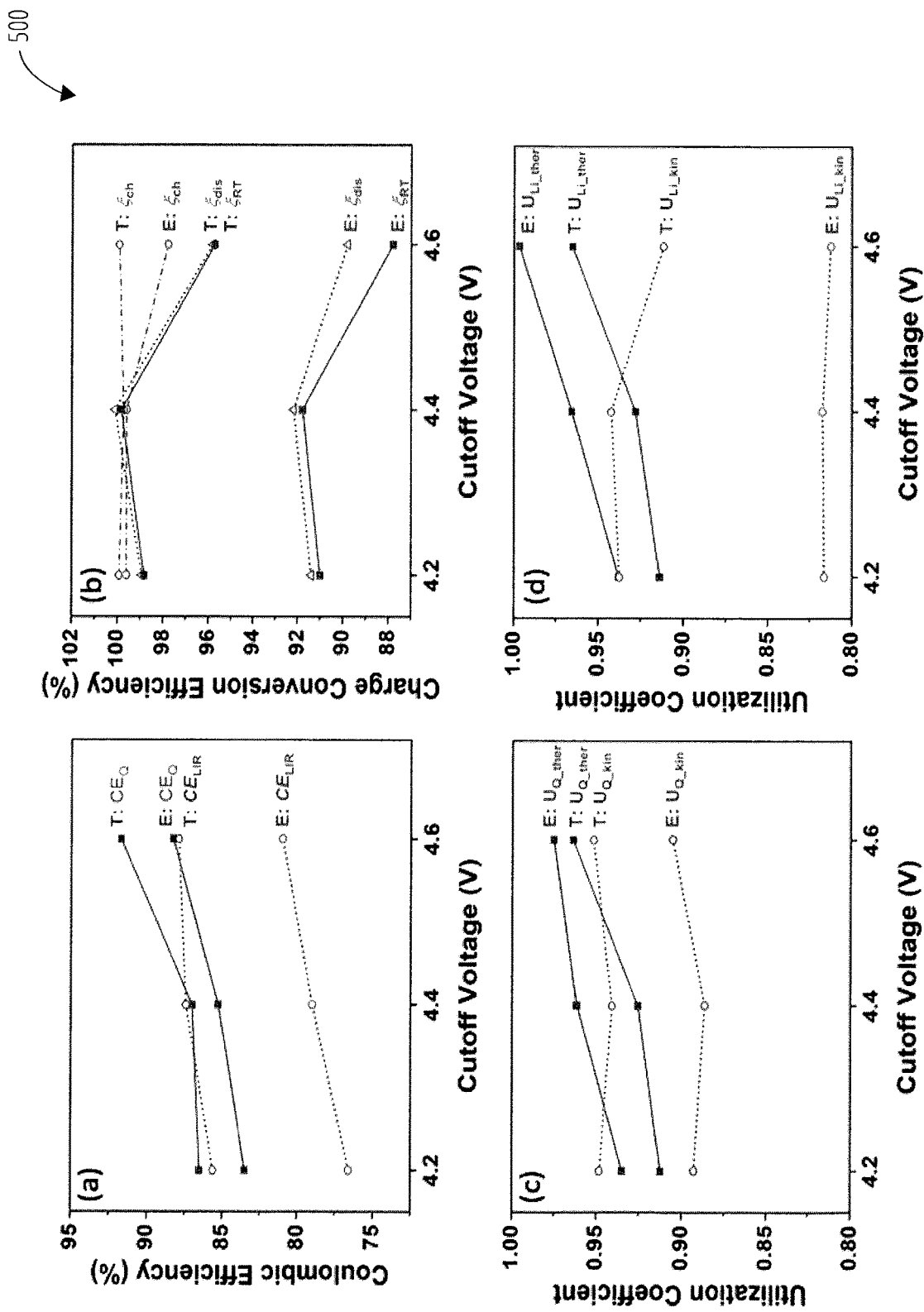
FIG. 5 is a series of plots that illustrate various aspects of coulombic efficiency and a utilization coefficient, according to some examples.

FIG. 4 is a series of plots 400 (plots (a)-(c)) that illustrate a summary of specific capacity values measured during experiments and calculated by the tracking of the Li inventory in NMC811 under 4.2 V (plot (a)), 4.4 V (plot (b)), and 4.6 V (plot (c)) cutoff in the formation cycle of Li-NMC811 Targray pouch (T-P) cells. The first cycle capacity loss $Q_{FCCL}$ is shown in each case. Each plot summarizes the attributes that contributed to the capacity and Li inventory retention in the charge and discharge regime. The identification and quantification of the attributes to Li inventory retention are illustrated. Numbers in parentheses are specific capacity values in mAh/g.

The consistency in capacity (Q) measurement and Li inventory interpolation ($Q_{Li}$) is verified using the example with 4.2 V cutoff. Plot (a) of FIG. 4 shows that $Q_{ch}$ (204.6 mAh/g) agrees with $Q_{Li\_ch}$ (204.3 mAh/g), so does $Q_{dis}$ (176.9 mAh/g) with $Q_{Li\_dis}$ (174.9 mAh/g), revealing that the correct interpolation of the Li inventory in NMC811 agrees with the capacity measured. The verification validates that the relaxation voltage at EOD does reflect the correct Li content in NMC811. The same verification was observed in the 4.4 V case. The agreement between Q and $Q_{Li}$ denotes the successful interpolation of a reliable Li inventory estimation, properly quantifying the utilization of the NMC811 capacity for accurate Li inventory tracking even when polarization is present.

A rather constant $Q_{\Delta Li}$ at about 30 mAh/g is shown in at least these three cases, regardless of the cutoff voltage. This value equals to $Q_{FCCL}$ obtained for 4.2 V and 4.4 V cutoffs. Thus, the same degree of capacity and Li inventory retentions is shown to be achieved in both cases. In the case of 4.6 V cutoff, $Q_{Li\_dis}$ (214.3 mAh/g) is less than $Q_{dis}$ (223.7 mAh/g) by 9.4 mAh/g, which led to a smaller $Q_{FCCL}$ (reduced from 30 mAh/g to 20.3 mAh/g) by the same amount. A higher $Q_{dis}$ (than $Q_{Li\_dis}$ with an excess 9.4 mAh/g) may imply a higher degree of discharge in the utilized portion of the cathode than the average Li content in NMC as plot (c) of FIG. 4 depicts, yet the transformed IR-free voltage profile may suggest the opposite because IR-free voltage is higher than the pseudo-OCV when SOC<5%. The relaxed OCV at EOD indeed may suggest that the Li content in NMC is lower than that indicated by the capacity. Thus, the 9.4 mAh/g in excess is shown to not be converted into a commensurate Li content change in NMC. This shortfall may suggest that certain side effects like loss of lithium inventory $Q_{LLI}$ and/or loss of active material $Q_{LAM}$ did occur during discharge, leading to lower Li inventory retention efficiency as discussed below.

FIG. 5 is a series of plots 500 (plots (a)-(d)) that illustrate various aspects of coulombic efficiency and a utilization coefficient. Specifically, in FIG. 5 includes a columbic efficiency plot (a) of FIG. 5, a charge conversion efficiency plot (b) of FIG. 5, a utilization coefficient plot (c) based on capacity, and a utilization coefficient plot (d) of FIG. 5 based on Li inventory tracking. As shown in plot (a) of FIG. 5, Coulombic efficiency may be calculated using the capacity ($CE_Q$) and Li inventory retention ($CE_{LIR}$) in the formation cycle of the three different cutoff voltage experiments for Targray (T) pouch cells and EcoPro (E) coin cells. Plot (b) of FIG. 5 illustrates the respective charge conversion efficiency in the charge ($\xi_{ch}$), discharge ($\xi_{dis}$) regime, and the round-trip ($\xi_{RT}$) in the formation cycle. Plot (c) of FIG. 5 illustrates the utilization coefficient based on capacity ($U_Q$). Plot (d) of FIG. 5 illustrates the utilization coefficient based on Li inventory tracking ($U_{Li}$).

Coulombic efficiency (CE) is an indicator of capacity retention, thus $$CE_Q=(Q_{dis}/Q_{ch})\times 100\%$$

Applying the same concept to describe the Li inventory retention, the CE for the Li inventory retention (LIR) may be quantified as:

$$CE_{LIR}=(Q_{Li\_dis}/Q_{Li\_ch})\times 100\%$$

Furthermore, charge conversion efficiency may be assessed to quantify the effectiveness in the conversion of the charge into a commensurate amount of Li inventory in the cathode material in the respective charge and discharge regime as:

$$\xi_{ch}=(Q_{ch}/Q_{Li\_ch})\times 100\%$$

$$\xi_{dis}=(Q_{dis}/Q_{Li\_dis})\times 100\%$$

A "round-trip charge conversion efficiency" ($\xi_{RT}$) for the cycle is thus obtained as follows:

$$\xi_{RT}=\xi_{dis}/\xi_{ch}$$

With regard to the concepts on Li inventory-based CE and charge conversion efficiencies $\xi$'s, the results of Li inventory utilization efficiency and retention are summarized in plots (a)-(d) of FIG. 5 for Targray pouch (T-P) cells and EcoPro coin (E-C) cells. Generally, $Q_{\Delta Li}$ are about 29.6±0.4 mAh/g in T-P cells and 46.5±1.7 mAh/g in E-C cells, rather invariant with the Vmax cutoffs. The invariance of $Q_{\Delta Li}$ in each cell of the same family may imply that the sluggish Li transport and Vmin=2.8 V determined $Q_{\Delta Li}$, not Vmax; and the different $Q_{\Delta Li}$ results between T-P and E-C cells may be likely due to the disparity in the utilization efficiency from the polarization kinetics between the two types of cells. The implication from $Q_{\Delta Li}$ results is also reflected in plot (a) of FIG. 5 where $CE_{LIR}$ is higher in T-P (85.6-87.9%) than in E-C (76.6-81.0%) cells. In contrast, $Q_{FCCL}$ is about 26.3±5.4 mAh/g in T-P cells and 31.6±3.1 mAh/g in E-C cells. The values of $Q_{FCCL}$ are about the same in T-P and E-C cells and resemble to $Q_{\Delta Li}$ in T-P cells. The higher standard deviations in $Q_{FCCL}$ are due to the side effects with 4.6 V cutoff, which do not affect $Q_{\Delta Li}$. Therefore, $CE_Q$ are on the order of 86.5-91.7% in T-P cells and 83.5-88.3% in E-C cells. Thus, the congruent increases in Q and $Q_{Li}$ may lead to a better $CE_Q$ and $CE_{LIR}$ with a higher cutoff. However, with 4.6 V cutoff, the side effect reduced the $Q_{Li}$ conversion in the discharge regime, leading to a reduced $CE_{LIR}$ and decreased $\xi_{dis}$, and $\xi_{RT}$ in both T-P and E-C cells as shown in plot (b) cataclysmic. To reconcile the aspects represented by $CE_Q$, $CE_{LIR}$, and charge conversion efficiency, another concept of utilization coefficient (U) of the capacity ($U_Q$) and Li inventory ($U_{Li}$) in NMC may be introduced and quantified.

Similar to CE, the concept of utilization and its coefficient to be quantified have not only two aspects of analyses (e.g., based on capacity measured, thus $U_Q$, or Li inventory inferred, thus $U_{Li}$) but also two processes that involve different nature of the polarization kinetics (e.g., in the charge and discharge regimes). In the charge process, as mentioned earlier, the polarization usually suffers little impact from the Li transport issues, so the utilization is close to a thermodynamic, theoretical projection and the utilization efficiency is also close to 100%. Thus, considering the ratio of $Q_{Th}/Q_{ch}$ without much interference of Li transport kinetics, defining a $U_{Q\_ther}$ or $U_{Li\_ther}$ may specify the utilization of NMC capacity or Li inventory respectively with the condition imposed by a test protocol. Using $Q_{Th}$ (2.8–4.4 V)=220.4 mAh/g with $\Delta x$=0.80 as an example, in the T-P cell under the formation cycle protocol, a $U_{Q\_ther}=Q_{Th}(2.8-4.4\text{ V})/Q_{ch}(238.2\text{ mAh/g with 4.4 V cut-off})=92.5\%$ or $U_{Li\_ther}=Q_{Li\_Th}(2.8-4.4\text{ V})(\Delta x=0.80)/Q_{Li\_ch}(\Delta x=0.86(5))=92.8\%$ could be derived, as shown in plot (c) and plot (d) of FIG. 5, respectively. In the discharge regime, the utilization of NMC capacity and Li inventory may be affected by the Li transport kinetics in a more substantial manner, thus a ratio of $Q_{dis}/Q_{Th}$ may represent the impact of the transport kinetics on the capacity and Li inventory utilization, denoted as $U_{Q\_kin}$ and $U_{Li\_kin}$ respectively. In the same example with T-P cell, a $U_{Q\_kin}=Q_{dis}(207.3\text{ mAh/g with 2.8 V cutoff})/Q_{Th}(2.8-4.4\text{ V})=94.1\%$ or $U_{Li\_kin}=Q_{Li\_dis}(\Delta x=0.75(4))/Q_{Li\_Th}(2.8-4.4\text{ V})(\Delta x=0.80)=94.2\%$ could be derived. Compounding the two coefficients, the resulting $CE_Q$ and $CE_{LIR}$ may be validated.

Figure 6:
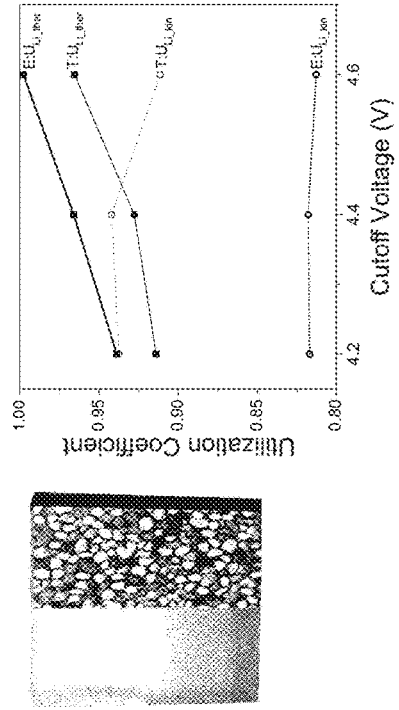
FIG. 6 is a chart illustrating a perspective on the capabilities offered by the electrochemical analytic diagnosis (eCAD), a set of defined methodologies described in this disclosure, to enable improved strategies for battery design, development, manufacturing, and operation, according to some examples.
Figure 6:
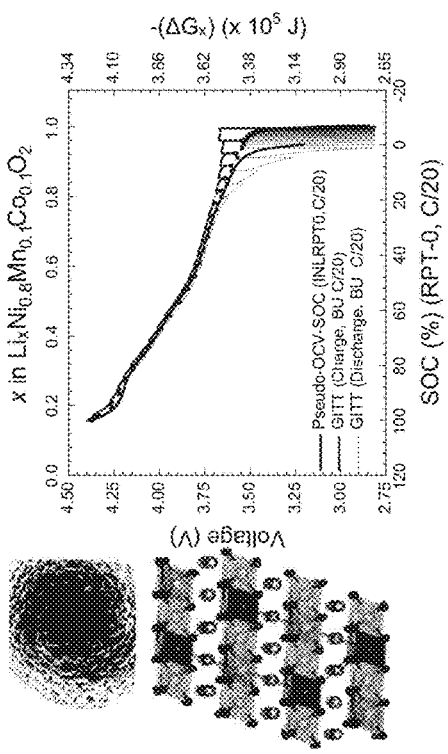
Figure 6:
Figure 6:
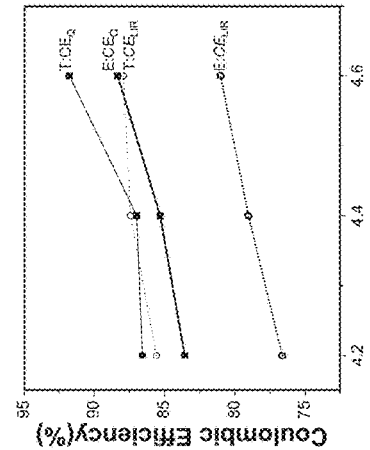

FIG. 6 is a chart 600 illustrating a perspective on the capabilities offered by the electrochemical analytic diagnosis to enable improved strategies for battery design, development, manufacturing, and operation. For example, active material properties may be more accurately measured which may allow for measuring OCV-Li content correspondence, a capacity ration, a state of charge, active materials loss, and Li inventory quantification. Furthermore, the capabilities offered by the electrochemical analytic diagnosis may also reveal information pertaining to electrode formation such as morphology and tortuosity, porosity and pore size distribution, kinetic effects, capacity loss, and active material utilization efficiency. Additionally, various aspects of cell performance may be measured such as cell balance and crosstalks, Li inventory retention, capacity retention, and coulombic efficiency.

The eCAD analysis and Li inventory tracking results may be integrated into more advanced control loops incorporating artificial intelligence and/or machine learning methods which could lead to improved battery design and manufacturing as well as to improve battery control and management during operation.

Figure 7:
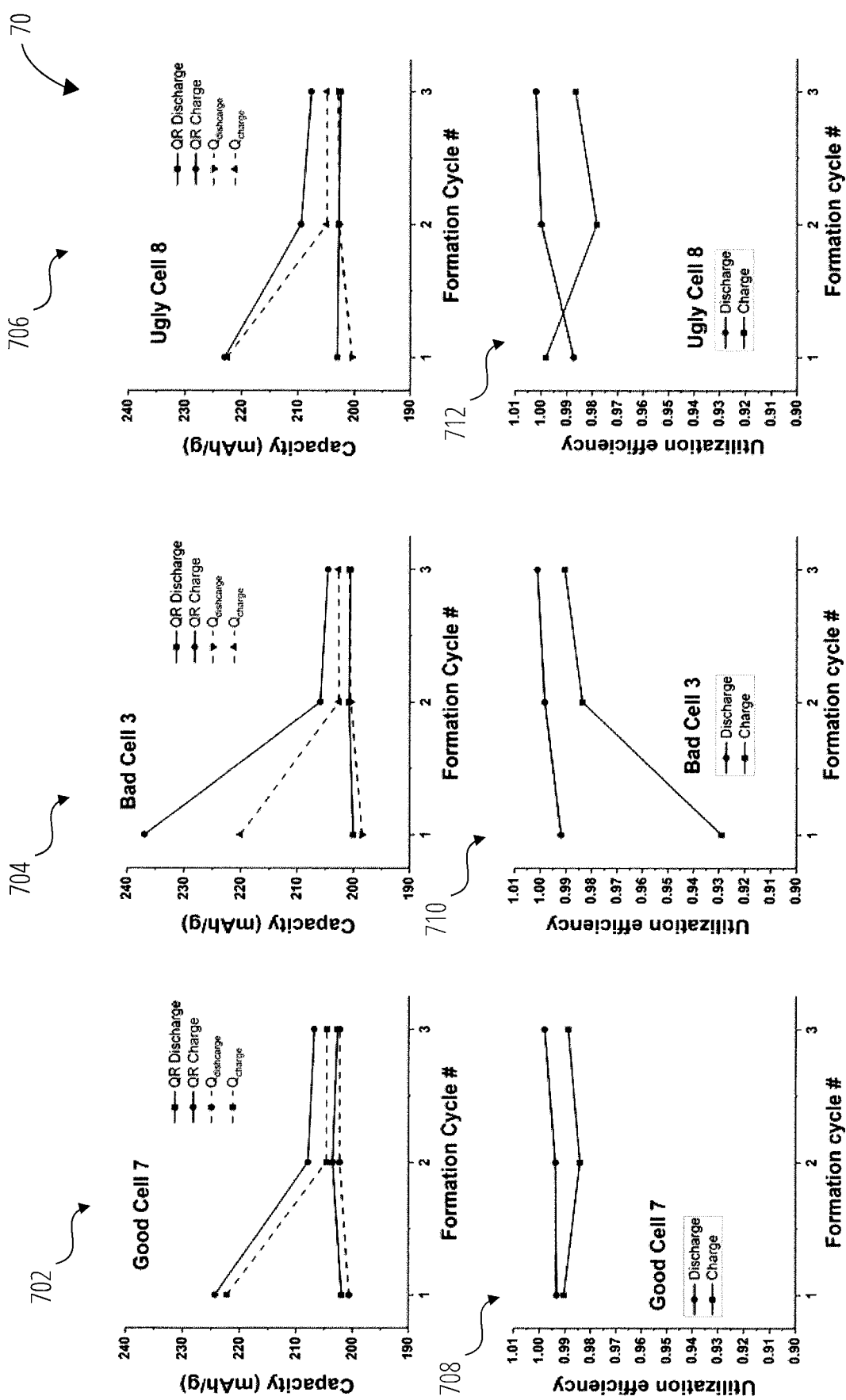
FIG. 7 is a series of plots illustrating capacity and utilization efficiency as a function of the number of formation cycles, according to some examples.

FIG. 7 is a series of plots 700 illustrating capacity and utilization efficiency as a function of the number of formation cycles. For example, the plots 700 include a plot 702 indicating the capacity over the number of formation cycles of a "good" electrochemical storage cell, plot 704 indicating the capacity over the number of formation cycles of a "bad" electrochemical cell, plot 706 indicating the capacity over the number of formation cycles of an "ugly" (e.g., worse the "bad") electrochemical cell, plot 708 indicating the utilization efficiency over the number of formation cycles of the "good" electrochemical cell, plot 710 indicating the utilization efficiency over the number of formation cycles of the "bad" electrochemical storage cell, and plot 712 indicating the utilization efficiency over the number of formation cycles of the "ugly" electrochemical storage cell.

Figure 8:
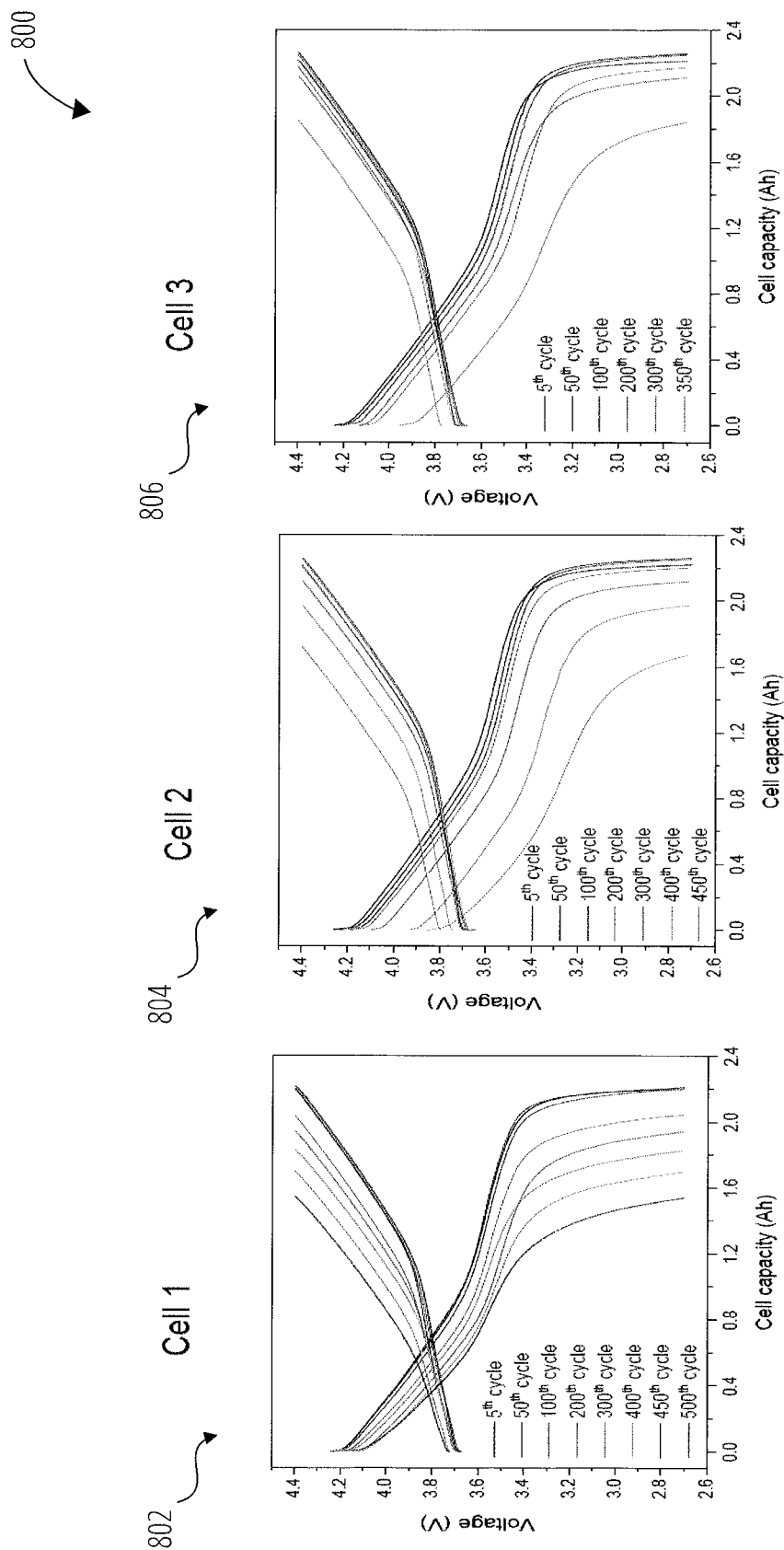
FIG. 8 is a series of plots illustrating three pouch cell designs and test results as a relationship between voltage and cell capacity for a given cycle number of a cell in each design and test, according to some examples.

FIG. 8 is a series of plots 800 illustrating three pouch cell designed and test results as a relationship between voltage and cell capacity for a given cycle number of a cell. Plots 800 include plot 802 illustrating the voltage over cell capacity for a first cell (Cell 1), plot 804 illustrating the voltage over cell capacity of a second cell (Cell 2), and plot 806 illustrating the voltage over cell capacity of a third cell (Cell 3).

Figure 9:
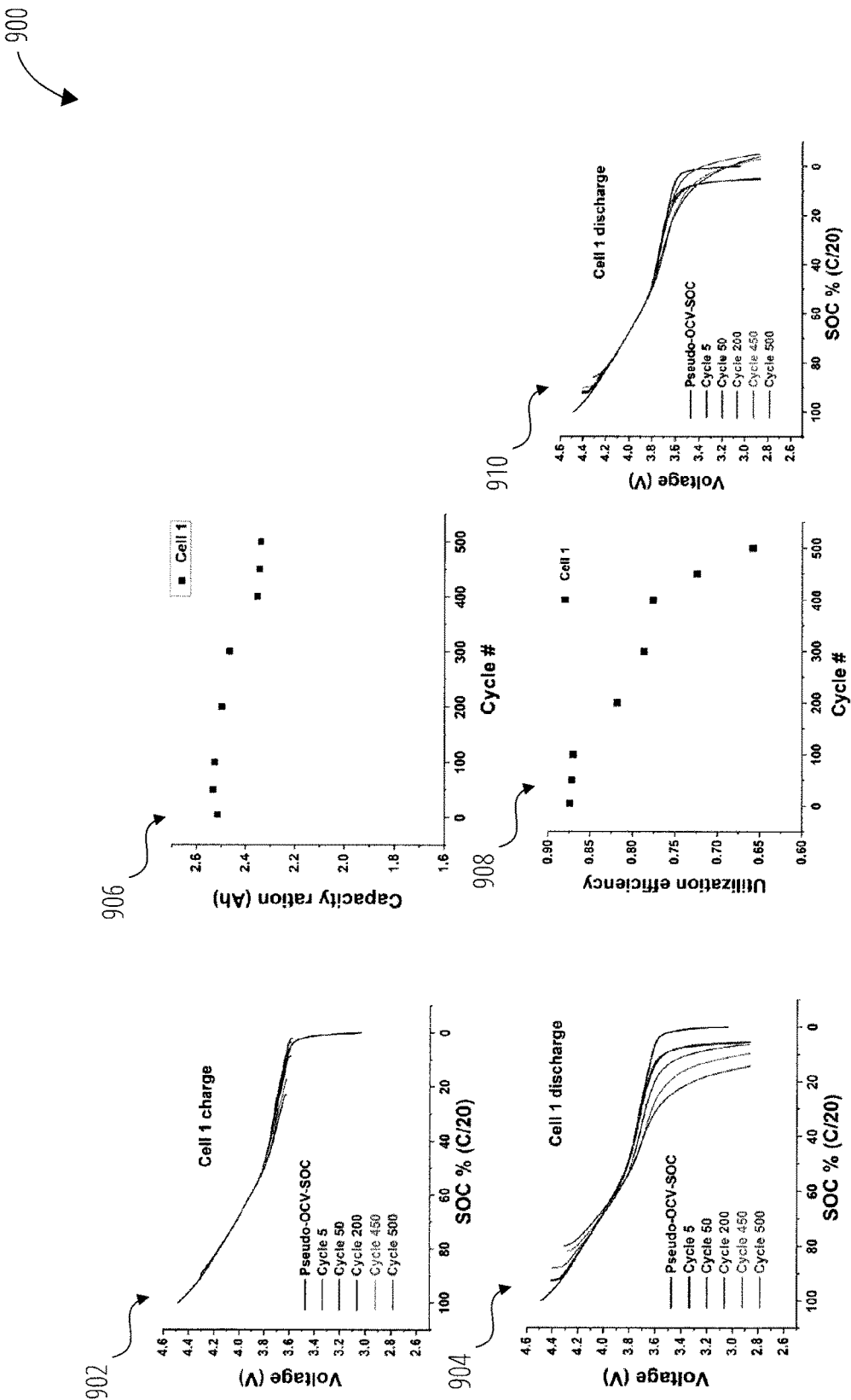
FIG. 9 is a series of plots illustrating various characteristics of cell 1 depicted in FIG. 8, according to some examples.

FIG. 9 is a series of plots 900 illustrating various characteristics of the first cell depicted in FIG. 8. For example, plots 900 include plot 902 showing a plot of a charge voltage profile over SOC percentage of the first cell, plot 904 showing a plot of a discharge voltage profile over SOC percentage of the first cell, plot 906 showing a plot of a capacity ration over the numbers of cycles of the first cell, plot 908 showing a plot of a utilization efficiency over the number of cycles of the first cell, and plot 910 showing a plot of a discharge voltage over SOC percentage of the first cell corrected by the utilization efficiency variations. Stated another way, plot 910 illustrates an IR-free voltage plotted by the corrected capacity with full Li content utilization.

Figure 10:
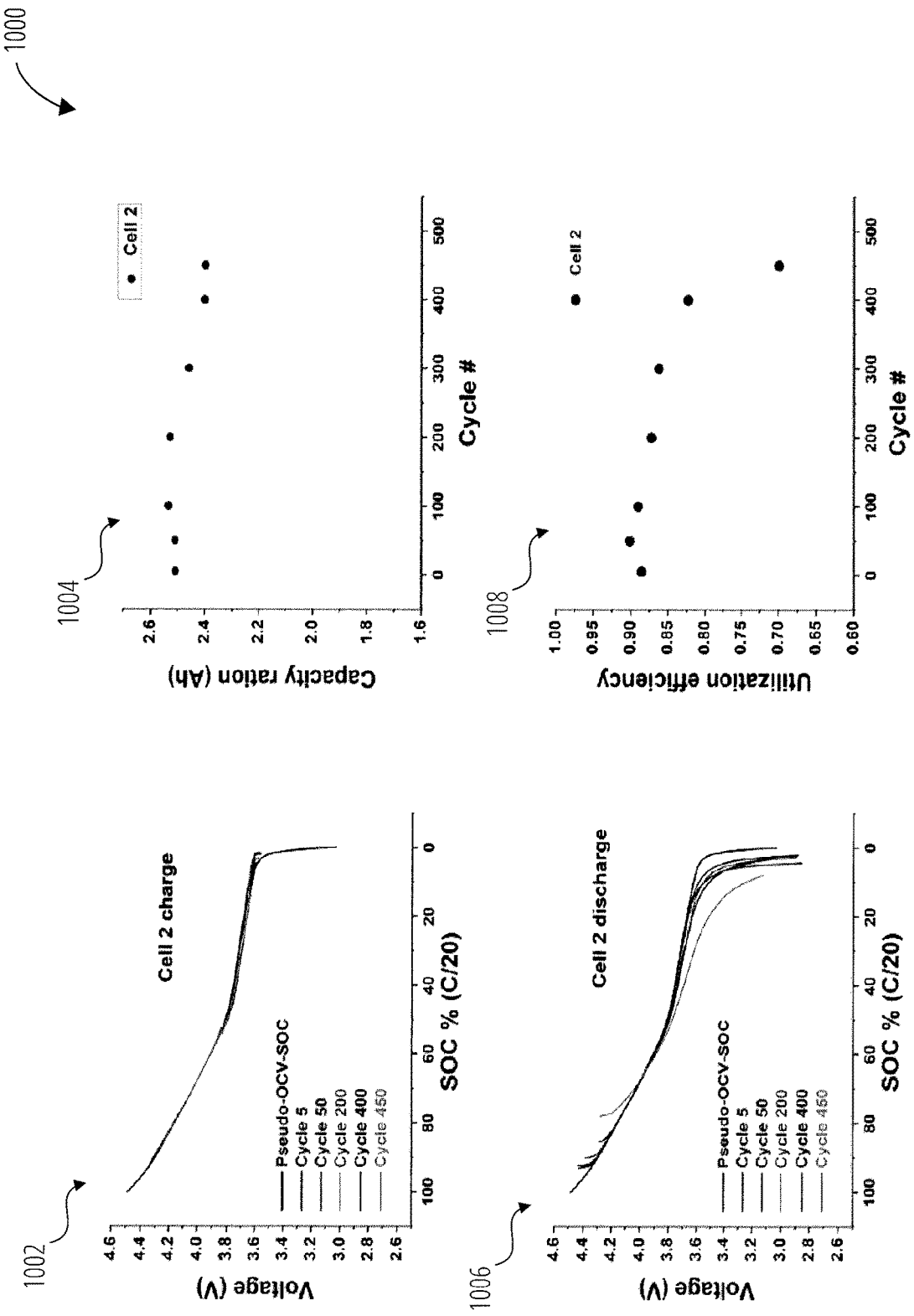
FIG. 10 is a series of plots illustrating various characteristics of cell 2 depicted in FIG. 8, according to some examples.

FIG. 10 is a series of plots 1000 illustrating various characteristics of the second cell depicted in FIG. 8. For example, plots 1000 include plot 1002 showing a plot of a charge voltage over SOC percentage for the second cell, plot 1004 showing a plot of a capacity ration over the number of cycles of the second cell, plot 1006 showing a plot of a discharge voltage over SOC percentage of the second cell, and plot 1008 showing a plot of utilization efficiency over the number of cycles of the second cell.

Figure 11:
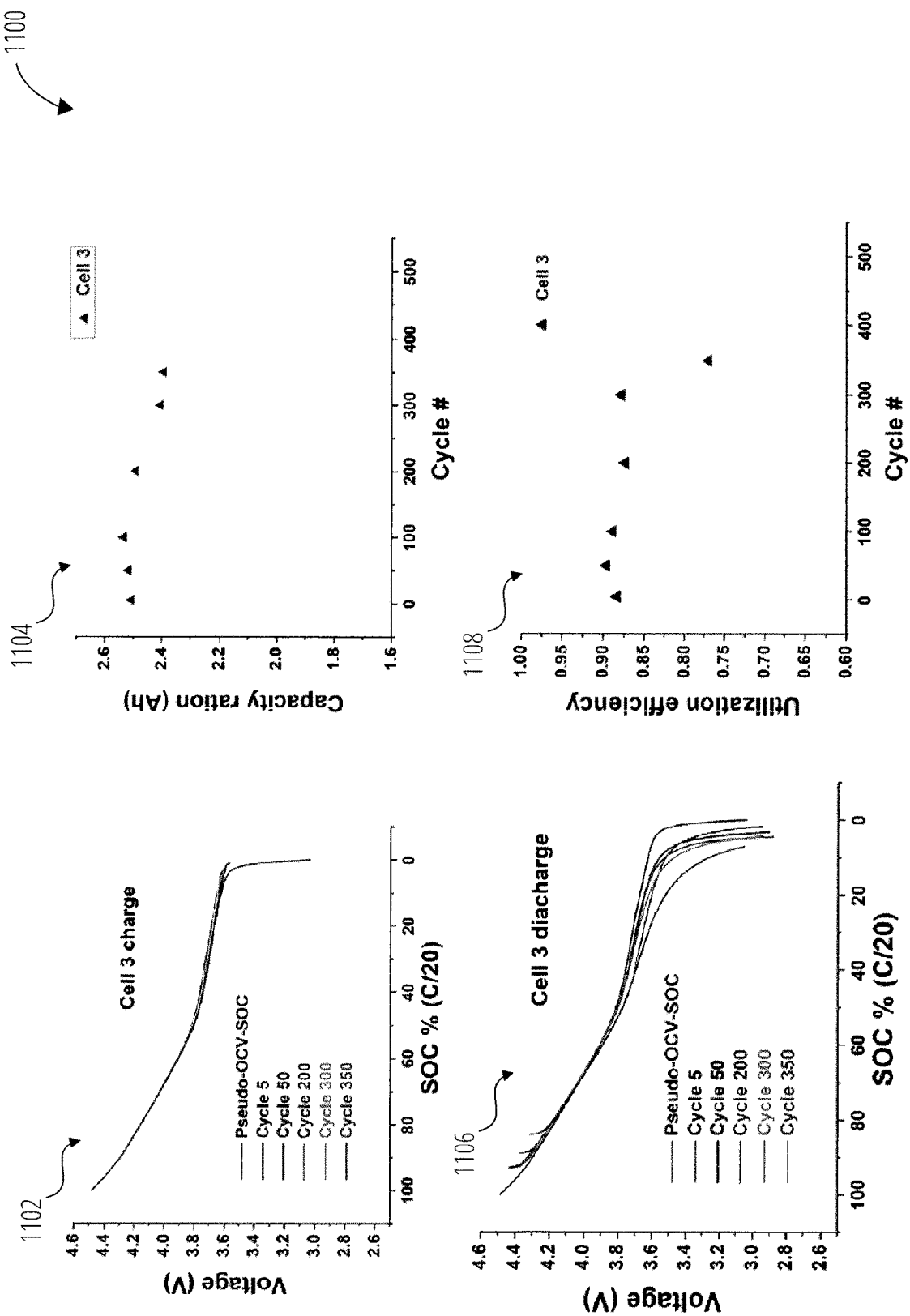
FIG. 11 is a series of plots illustrating various characteristics of cell 3 depicted in FIG. 8, according to some examples.

FIG. 11 is a series of plots 1100 illustrating various characteristics of the third cell depicted in FIG. 8. For example, plots 1100 include plot 1102 showing a plot of a charge voltage over SOC percentage for the third cell, plot 1104 showing a plot of a capacity ration over the number of cycles of the third cell, plot 1106 showing a plot of a discharge voltage over SOC percentage of the third cell, and plot 1108 showing a plot of utilization efficiency over the number of cycles of the third cell.

Figure 12:
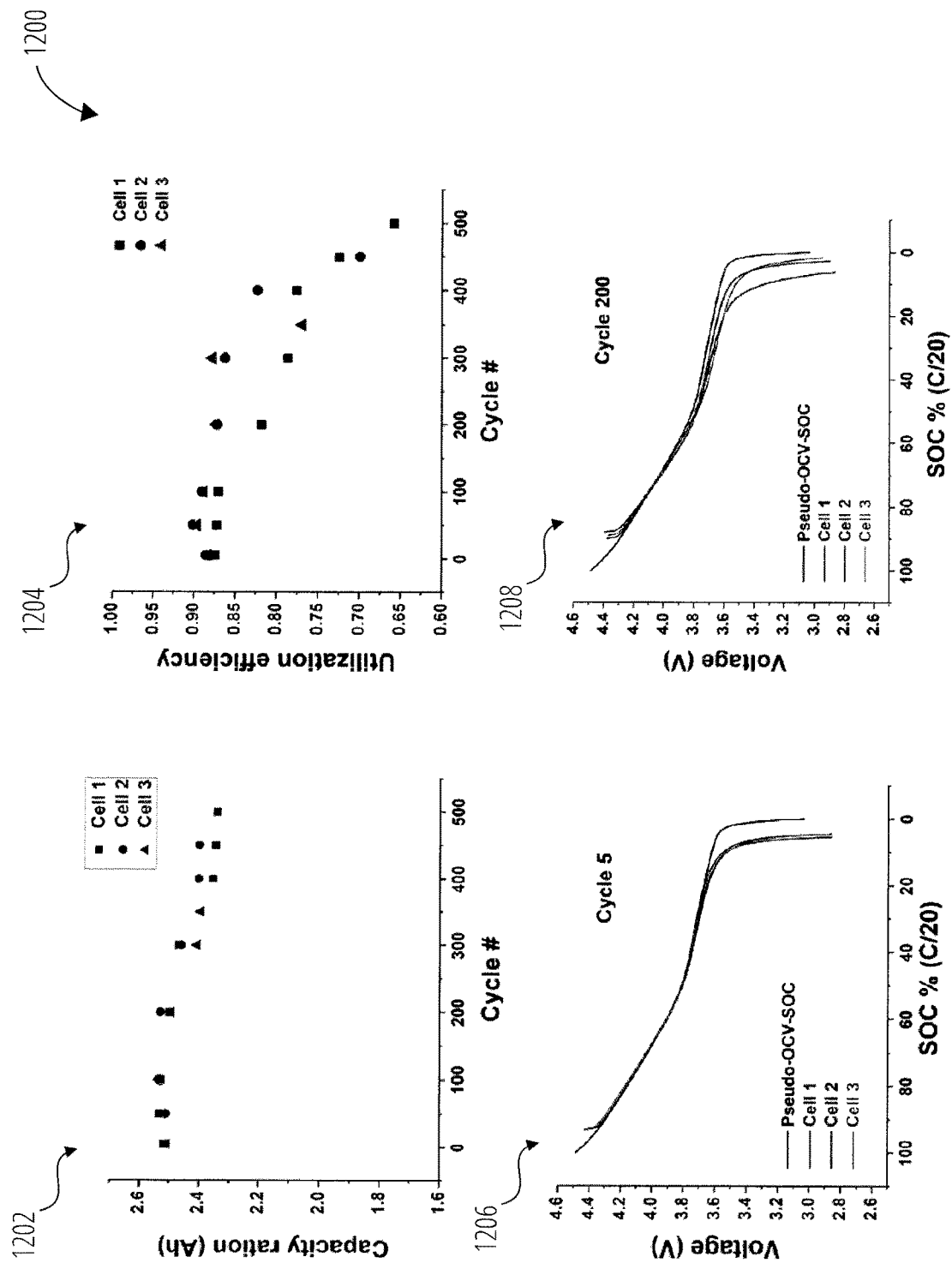
FIG. 12 is a series of plots comparing characteristics in the aging behavior among cell 1, cell 2, and cell 3 depicted in FIGS. 8-11, according to some examples.

FIG. 12 is a series of plots 1200 comparing characteristic behavior among the first cell, the second cell, and the third cell depicted in FIGS. 8-11. For example, plots 1200 include plot 1202 showing a plot of a charge voltage over SOC percentage for the first, second, and third cells, plot 1204 showing a plot of a utilization efficiency over the number of cycles of the first, second, and third cells, plot 1206 showing a plot of a voltage over SOC percentage for a fifth cycle of the first, second, and third cells, and plot 1208 showing a plot of voltage over SOC percentage for a 200th cycle of the first, second, and third cells.

Figure 13:
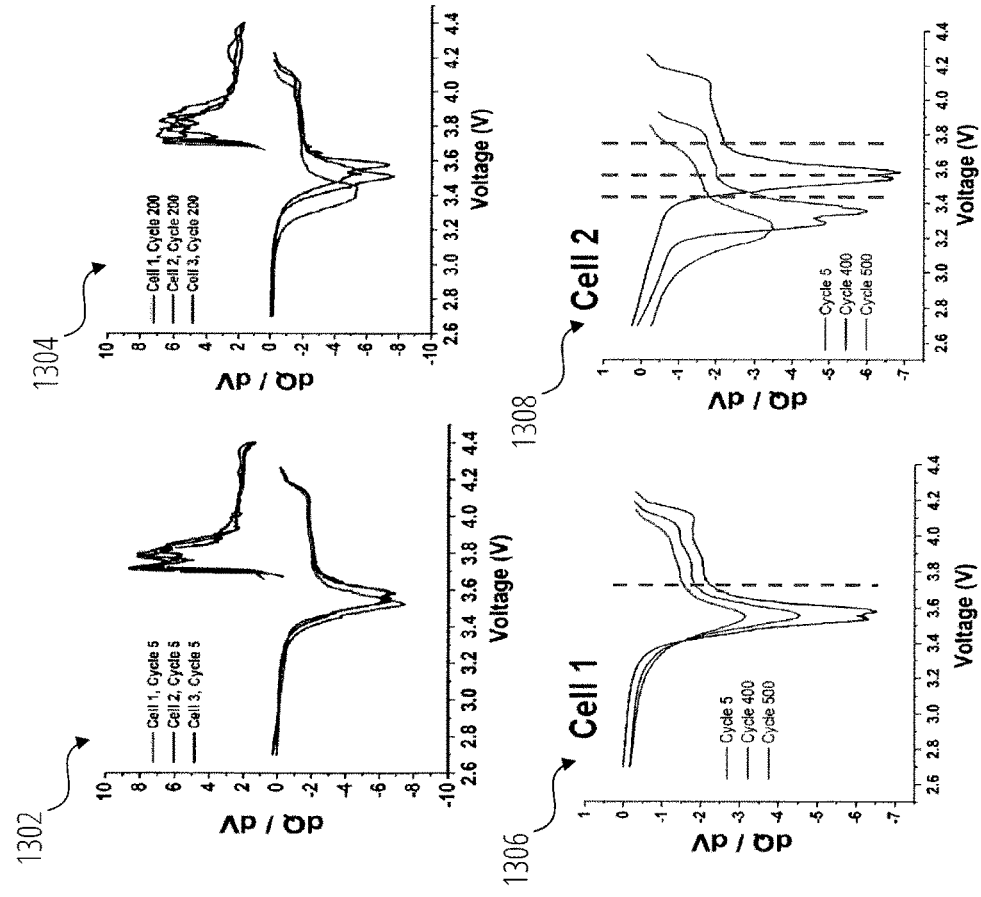
FIG. 13 is a series of plots demonstrating the differences in degradation among cell 1, cell 2, and cell 3 of FIGS. 8-11 according to some examples.

FIG. 13 is a series of plots 1300 demonstrating the differences in degradation among the first cell, the second cell, and the third cell of FIG. 8. For example, plots 1300 include plot 1302 showing a dQ/dV over voltage for a fifth cycle of the first, second, and third cells, plot 1304 showing a dQ/dV over voltage for a 200th cycle of the first, second, and third cells, plot 1306 showing a dQ/dV over voltage of the first cell for a fifth, 400th, and 500th cycle of the first cell, a plot 1308 showing a dQ/dV over voltage for a fifth, 400th, and 500th cycle of the second cell, and plot 1310 showing a plot of a polarization for discharge over cycle number for the first, second, and third cells. As shown in FIG. 13, the charge part for the dQ/dV curves of the cells may be similar, meaning that for Li deposition/de-intercalation, the polarization is similar among the three cells. However, the discharge part of dQ/dV curves show some difference, that the second cell and the third cell show increasing polarization when Li is stripping from Li and transferring to the cathode, showing the SEI/Li transport to the cathode is a problem which causes faster degradation.

Figure 14:
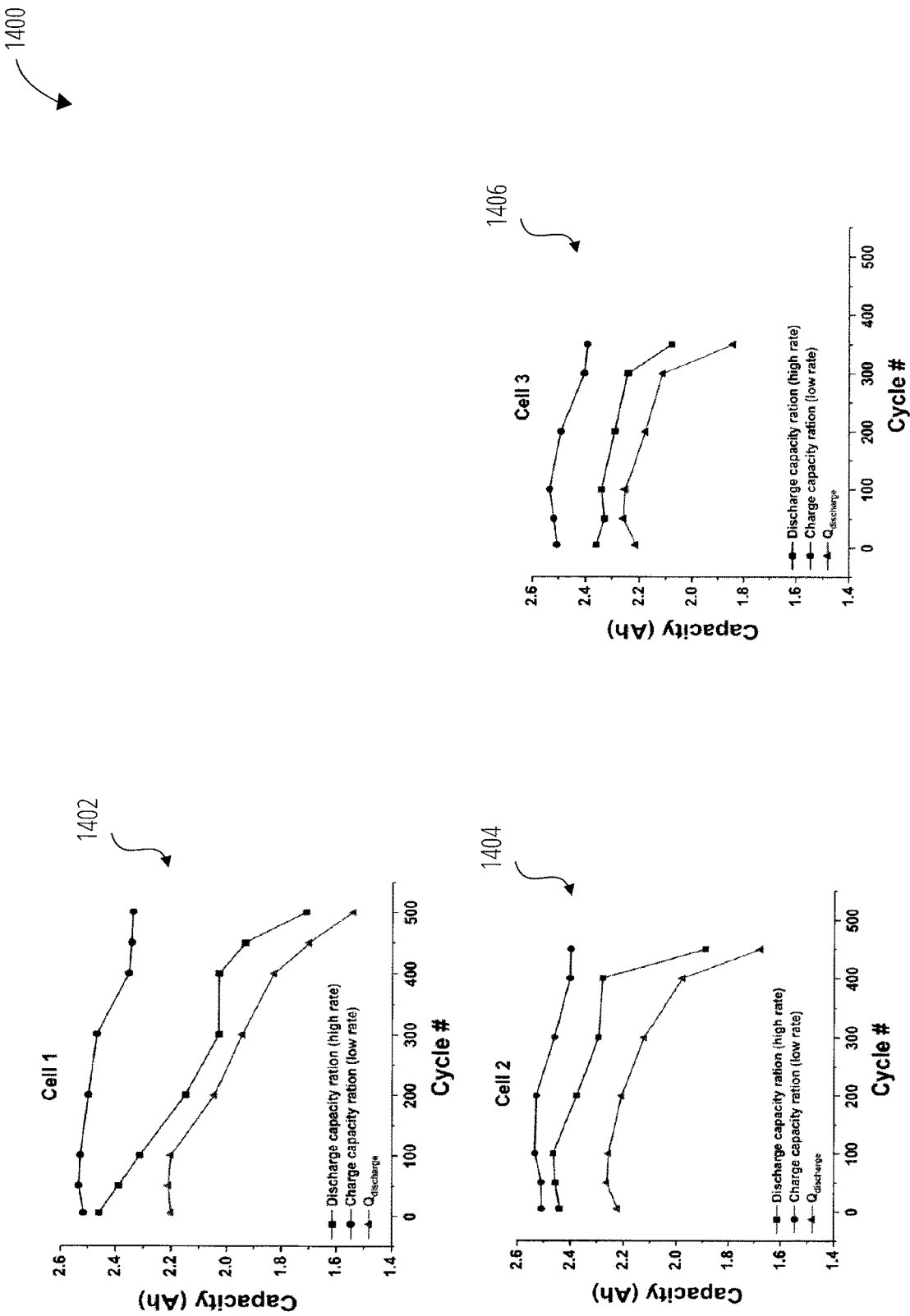
FIG. 14 is a series of plots illustrating capacity ration (QR) variations and the discharge capacity for cell 1, cell 2, and cell 3 of FIGS. 8-11 as a function of cycle number, according to some examples.

FIG. 14 is a series of plots 1400 illustrating thermodynamics-based capacity ration (LAM, C/10 KPH, LLI), kinetics-based capacity ration (C/3-KPH), and discharge capacity (including polarization and Li transport effect) for the first cell (plot 1402), the second cell (plot 1404), and the third cell (plot 1406) as a function of capacity over cycle number.

Figure 15:
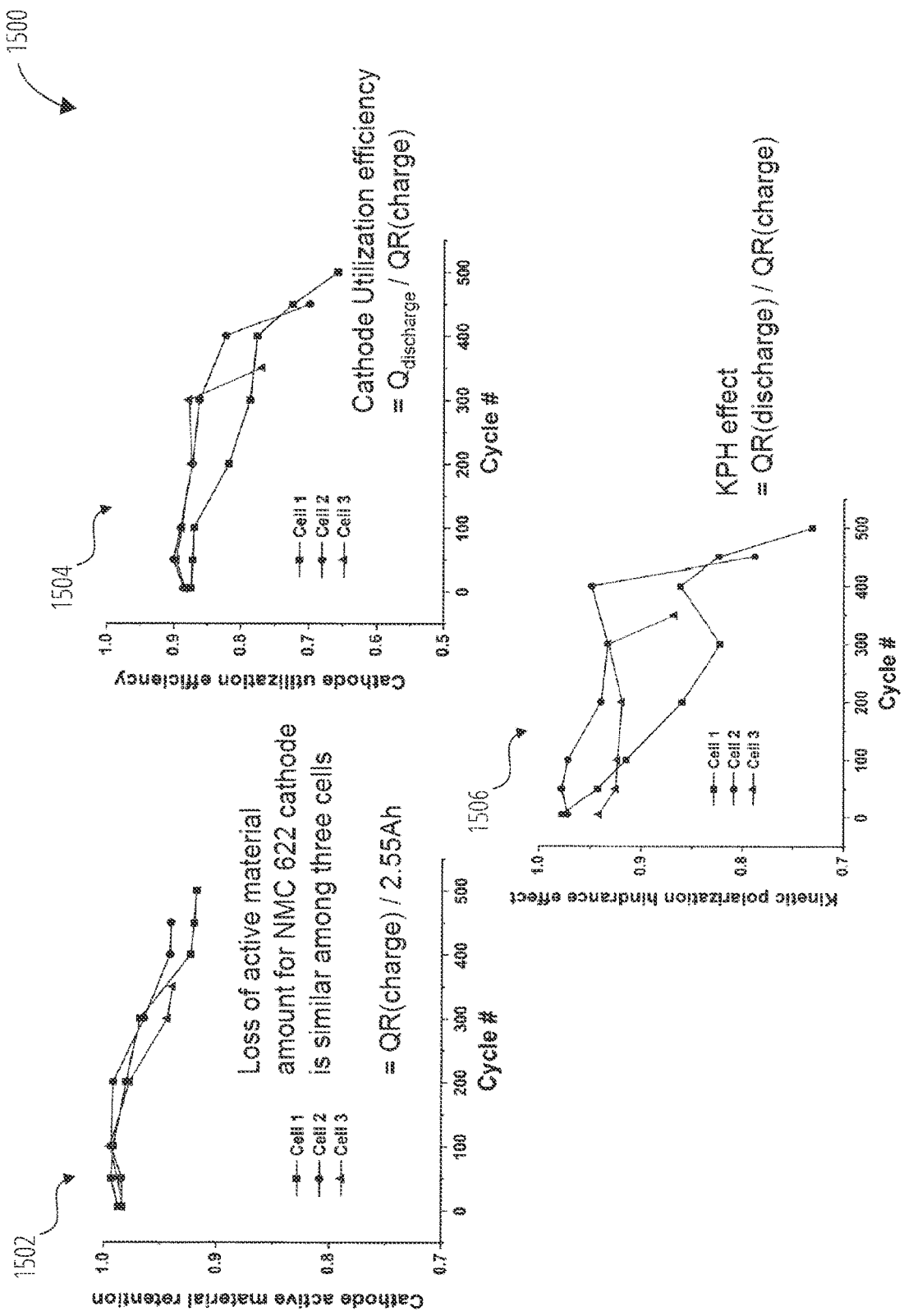
FIG. 15 is a series of plots illustrating the differences among cell 1, cell 2, and cell 3 of FIGS. 8-11 as a function of cathode active material retention over cycle number, cathode utilization efficiency over cycle number, and kinetic polarization hindrance (KPH) effect over cycle number, according to some examples.

FIG. 15 is a series of plots 1500 illustrating the differences among the first cell, the second cell, and the third cell as a function of cathode active material retention over cycle number (plot 1502), cathode utilization efficiency over cycle number (plot 1504), and kinetic polarization hindrance effect over cycle number (plot 1506).

Figure 16:
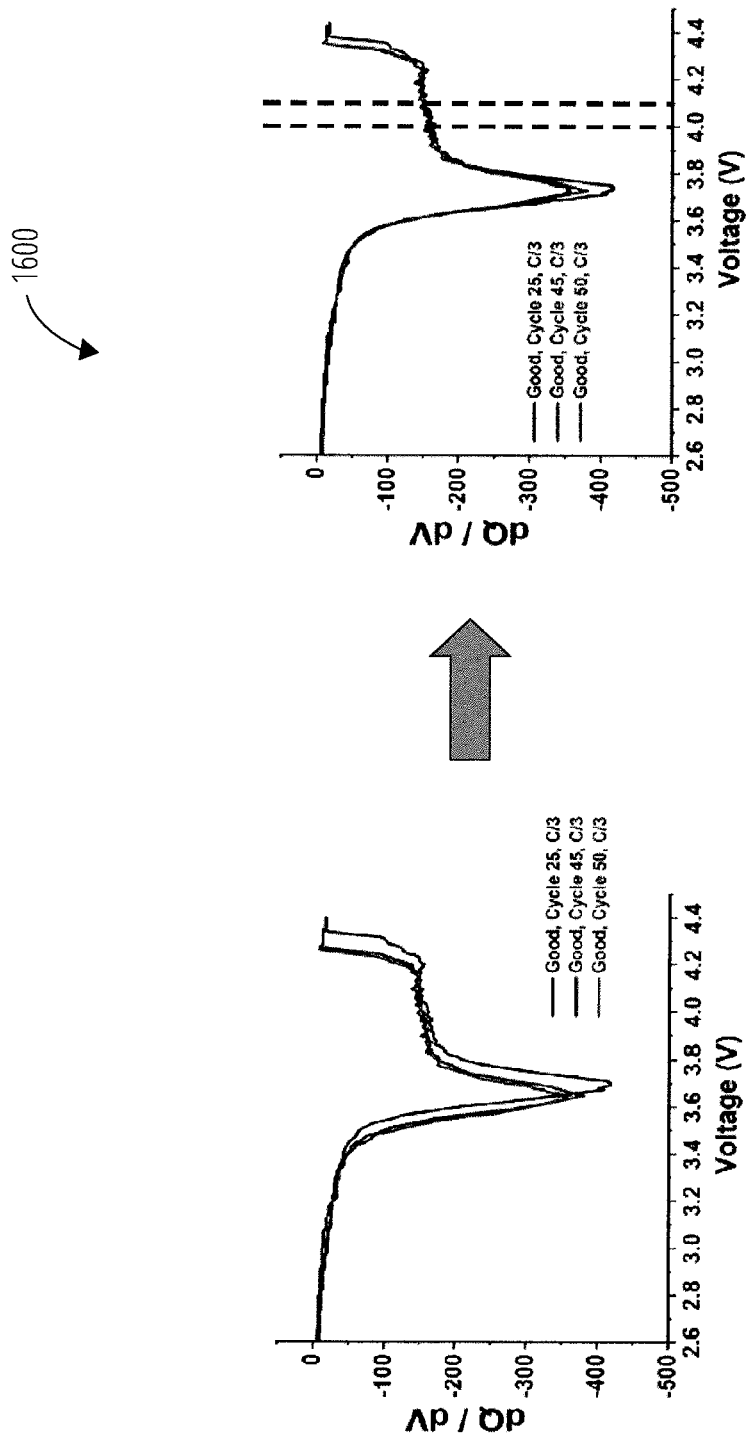
FIG. 16 illustrates the use of the incremental capacity analysis, in which the incremental amount of capacity may be created by a commensurate amount of voltage change (dQ/dV) is used as the basis for comparison, to create dQ/dV plots and to derive IR potential and IR-free voltage, according to some examples.

FIG. 16 illustrates a diagram for deriving an IR-free voltage by analyzing dQ/dV over voltage for various cycles of an electrochemical cell.

Figure 17:
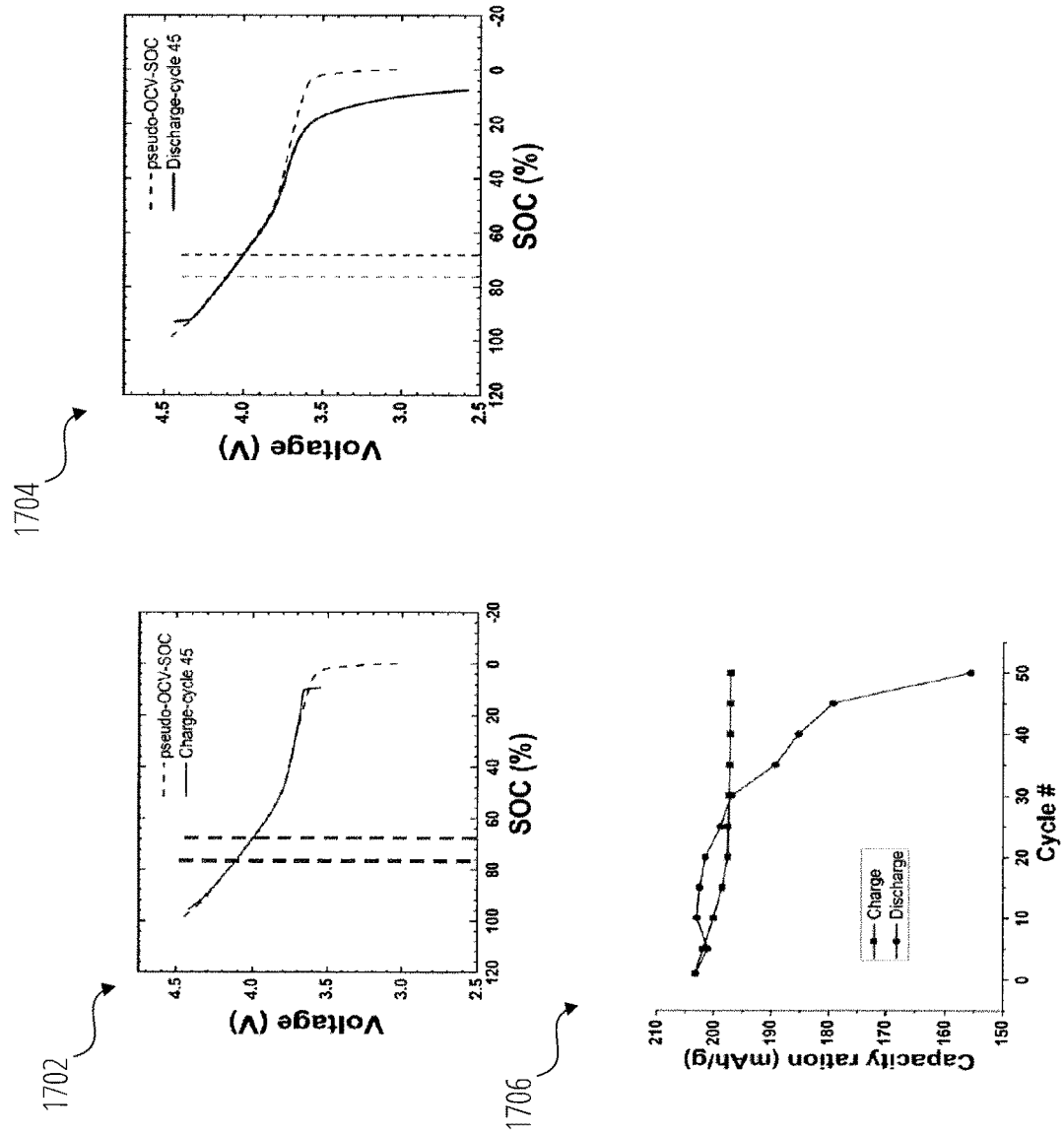
FIG. 17 illustrates calculating a capacity ration (QR), according to some examples.

FIG. 17 illustrates calculating a capacity ration by measuring the charge voltage over SOC % (plot 1702) and/or the discharge voltage over SOC % (plot 1704). For example, the capacity ration (mAh/100% SOC)=$(Q_{4.1V}-Q_{4.0V})/(SOC_{4.1V}-SOC_{4.0V})$ Plot 1706 shows a plot of the capacity ration of an "ugly" cell over the number of cycles of the "ugly" cell.

Figure 18:
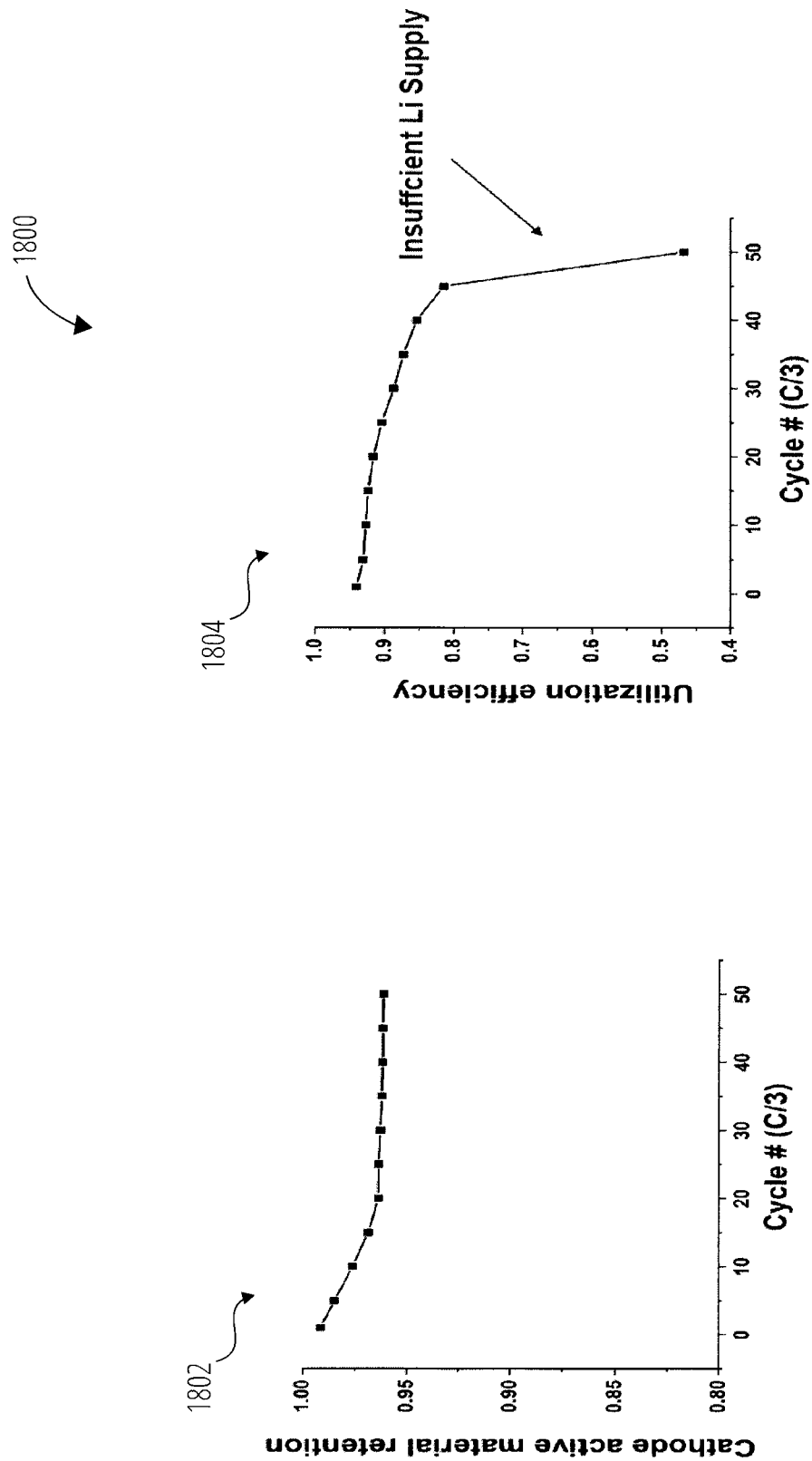
FIG. 18 illustrates quantifying electrode active material retention and utilization, according to some examples.

FIG. 18 illustrates quantifying electrode material utilization. For example, plot 1802 illustrates a cathode active material (e.g., NMC622) retention rate where the retention rate=capacity ration (charge)/theoretical capacity calculated by loading. Plot 1804 shows a plot of utilization efficiency over cycle number for a cell (e.g., an "ugly" cell) where utilization efficiency=$Q_{discharge}$/capacity ration (charge).

Figure 19:
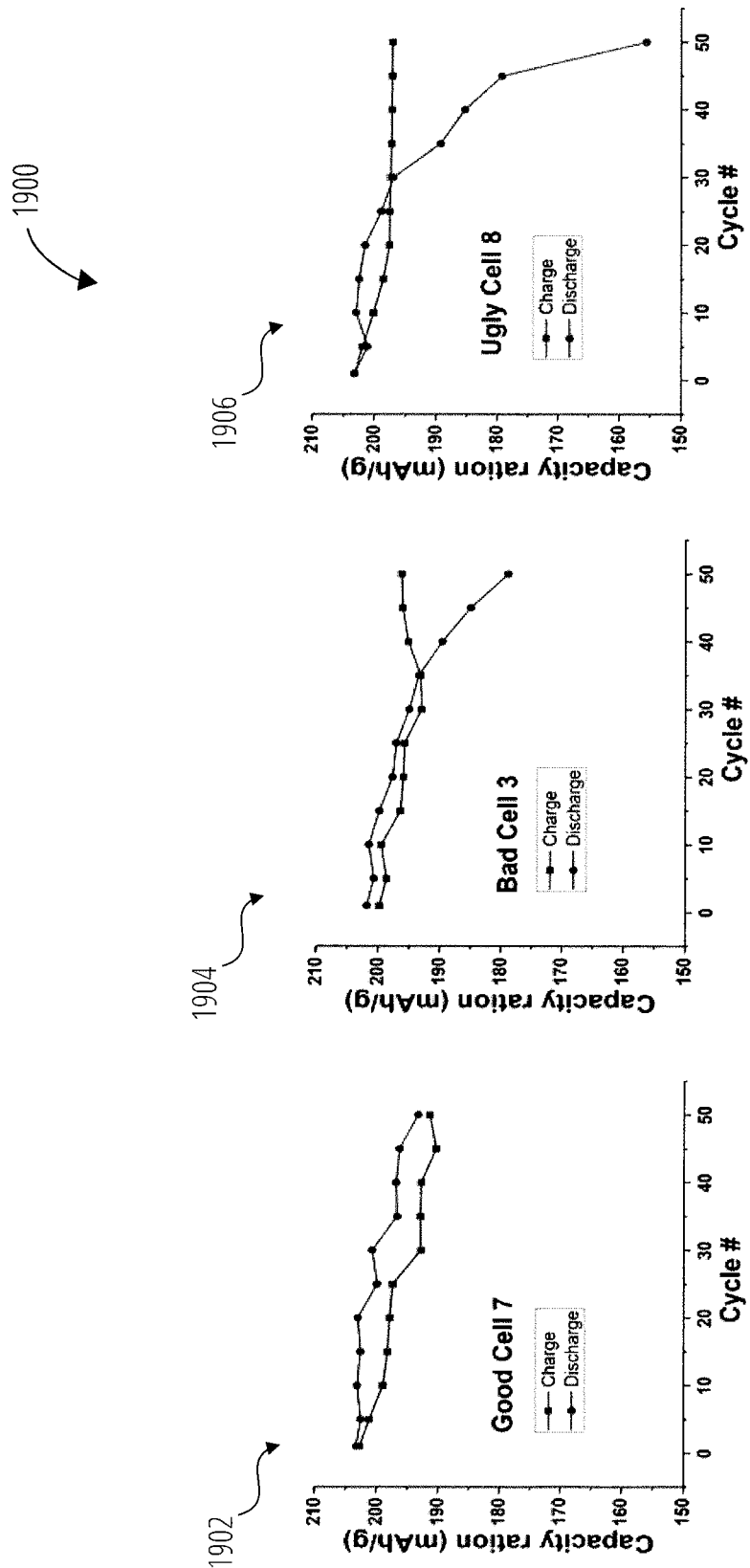
FIG. 19 is a series of plots illustrating how determining active materials utilization in electrode design and performance could be used as a tool for quality control and quality assurance (QC/QA), according to some examples.

FIG. 19 is a series of plots 1900 illustrating determining active materials utilization in electrode design and performance. Specifically, plots 1900 show a plot of capacity ration over a number of cycles for a good cell (plot 1902), a bad cell (plot 1904), and an "ugly" cell (plot 1906).

Figure 20:
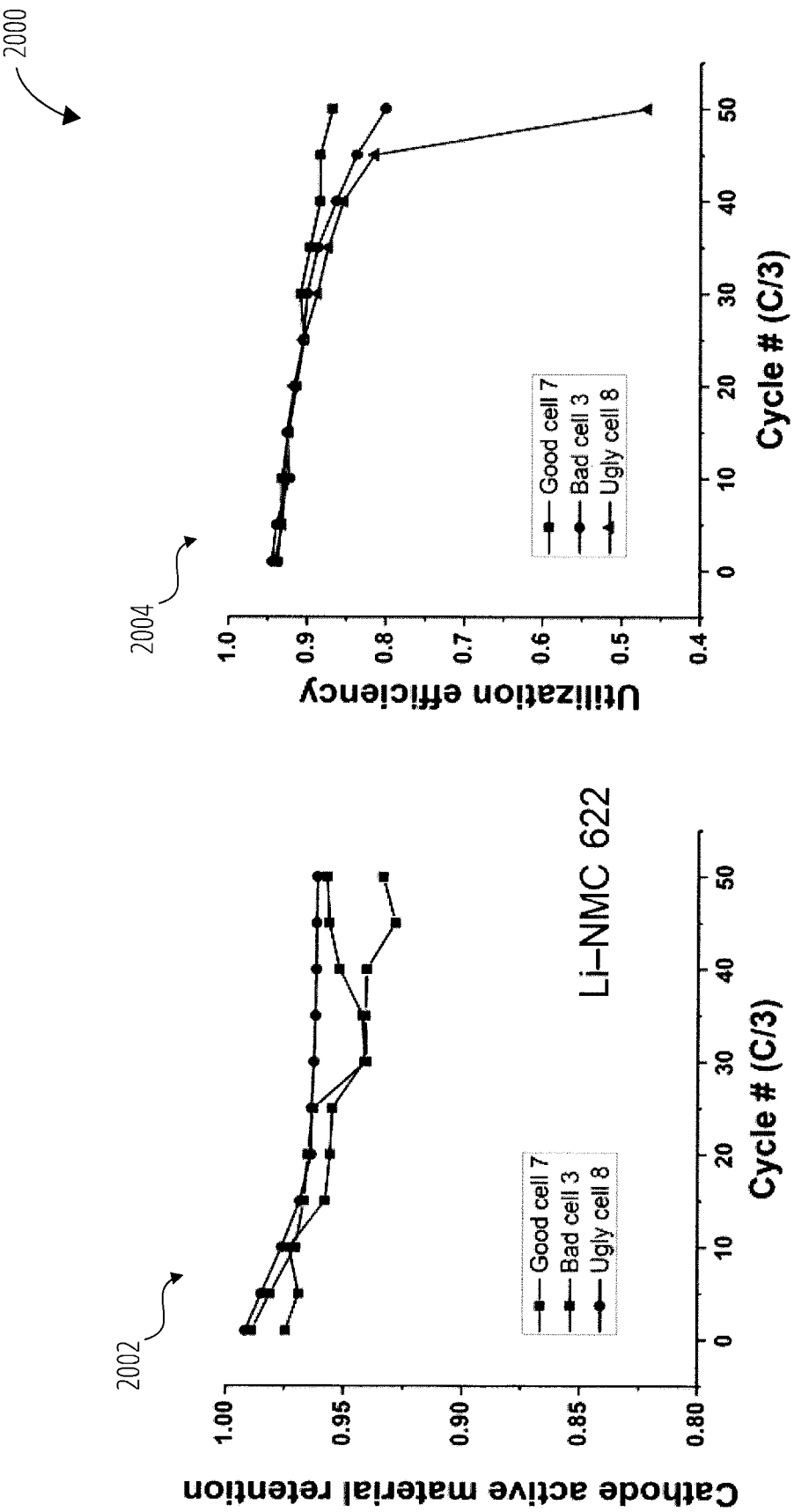
FIG. 20 is a pair of plots illustrating characteristics of a family of cells of the same make-up in formulation where variations in life cycle performance related to the Li inventory utilization and retention are characterized illustrating how cathode active material retention and utilization efficiency and coefficient can be used as a tool for quality control and quality assurance (QC/QA), according to some examples.

FIG. 20 is a pair of plots 2000 illustrating characteristics of a family of cells of the same make-up. For example, the first plot (plot 2002) depicts a measurement of the cathode active material retention for a good cell, a bad cell, and an "ugly" cell as a function of cycle number. The second plot (plot 2004) illustrates the utilization efficiency of a good cell, a bad cell, and an "ugly" cell as a function of cycle number.

Figure 21:
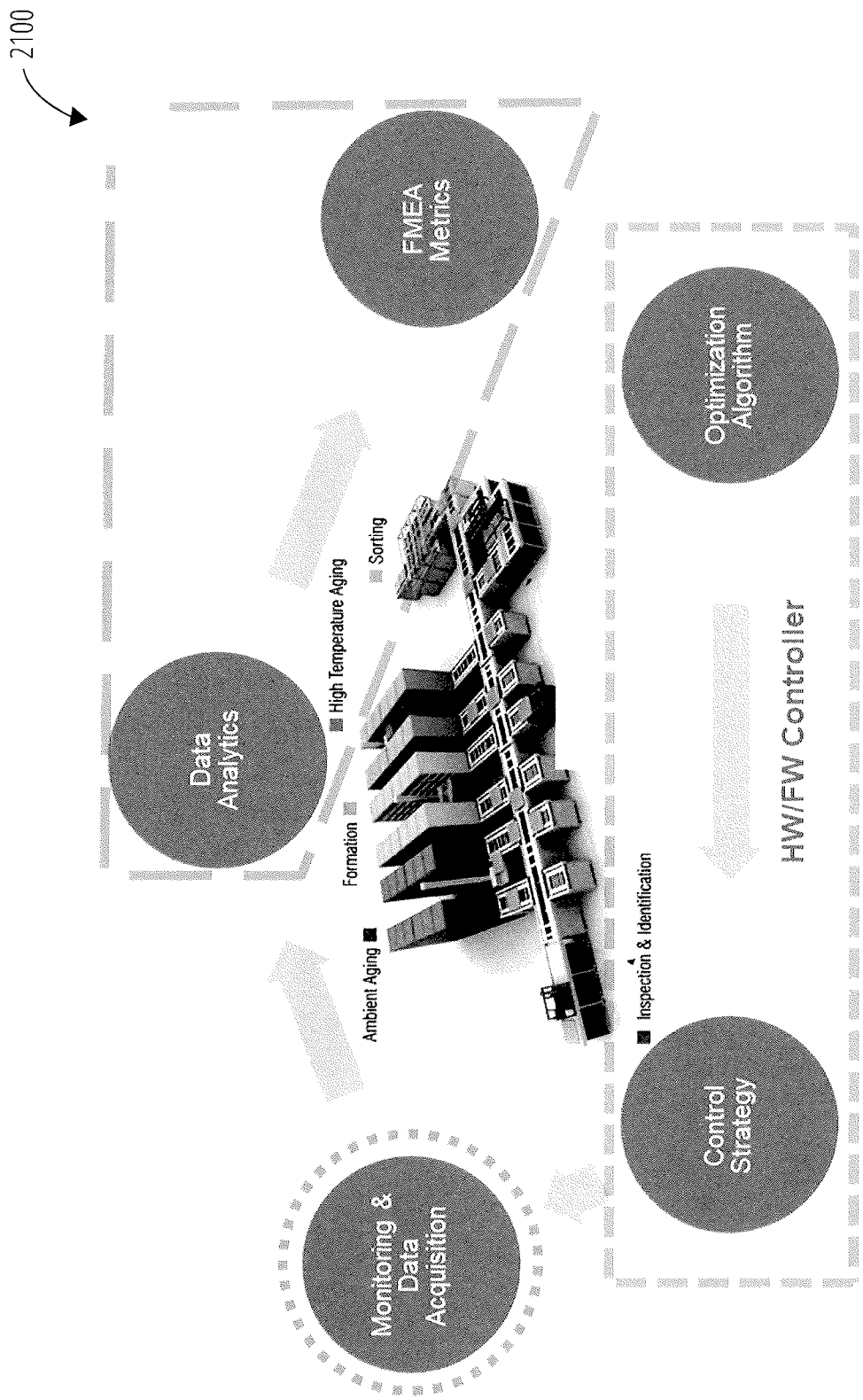
FIG. 21 is a flowchart illustrating a possible FMEA in battery formation process and in battery diagnosis and prognosis, according to some examples.

FIG. 21 is a flowchart of an example battery formation process 2100. The battery formation process 2100 includes a cycle of data analysis, FMEA metrics, an optimization algorithm, a control strategy, monitoring and data acquisition, and again to the data analysis.

Figure 22:
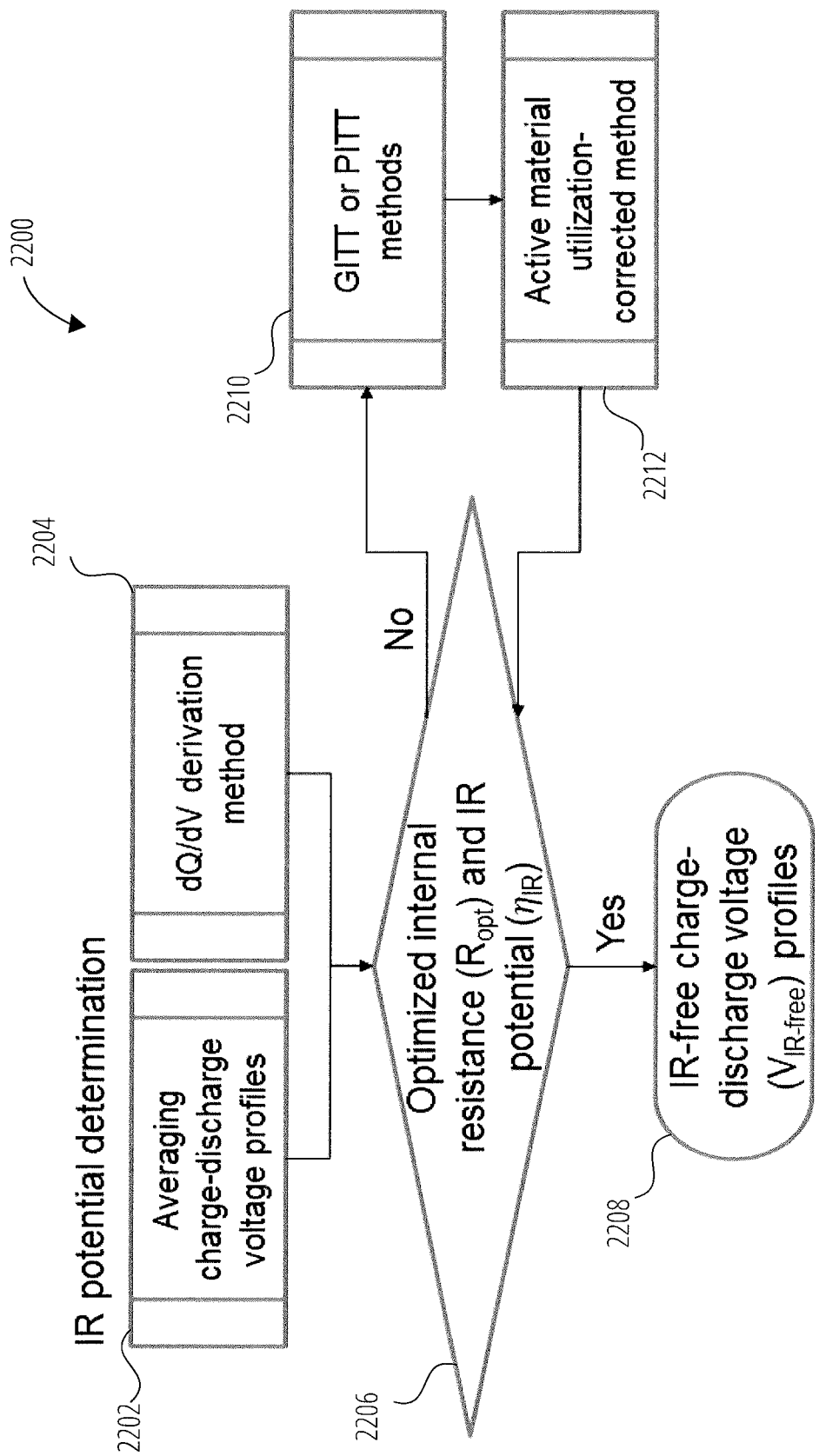
FIG. 22 is a flowchart illustrating a possible method of determining internal resistance (R), IR potential, and IR-free voltage in an energy storage device in battery diagnosis and prognosis and the corresponding charge and discharge voltage profiles, according to some examples.

FIG. 22 is a flow diagram illustrating a method 2200 of determining IR potential and IR-free voltage. The method 2200 may include averaging charge-discharge voltage profiles, as shown in operation 2202. Method 2200 may also include performing a dQ/dV derivation method, as shown in operation 2204. Based on the averaged charge-discharge voltage profiles and the derived dQ/dV, the method 2200 may check to see whether the internal resistance and IR potential are optimized, as shown in operation 2206. For example, the method 2200 may check whether the internal resistance and IR potential are substantially similar to a predetermined or desirable set of values for the internal resistance and IR potential. If yes, then the method 2200 continues to operation 2208 where IR-free charge-discharge voltage profiles are generated based, at least in part, on at least one of the internal resistance and the IR potential. If no, the method 2200 proceeds to operation 2210. At operation 2310, GITT or potentiostatic intermittent titration technique (PITT) methods are performed. The method 2200 may then calculate a corrected active material utilization as shown in operation 2212. The method 2200 may then proceed back to operation 2206 to again check whether the internal resistance and IR potential are optimized or reaching the desired values.

Figure 23:
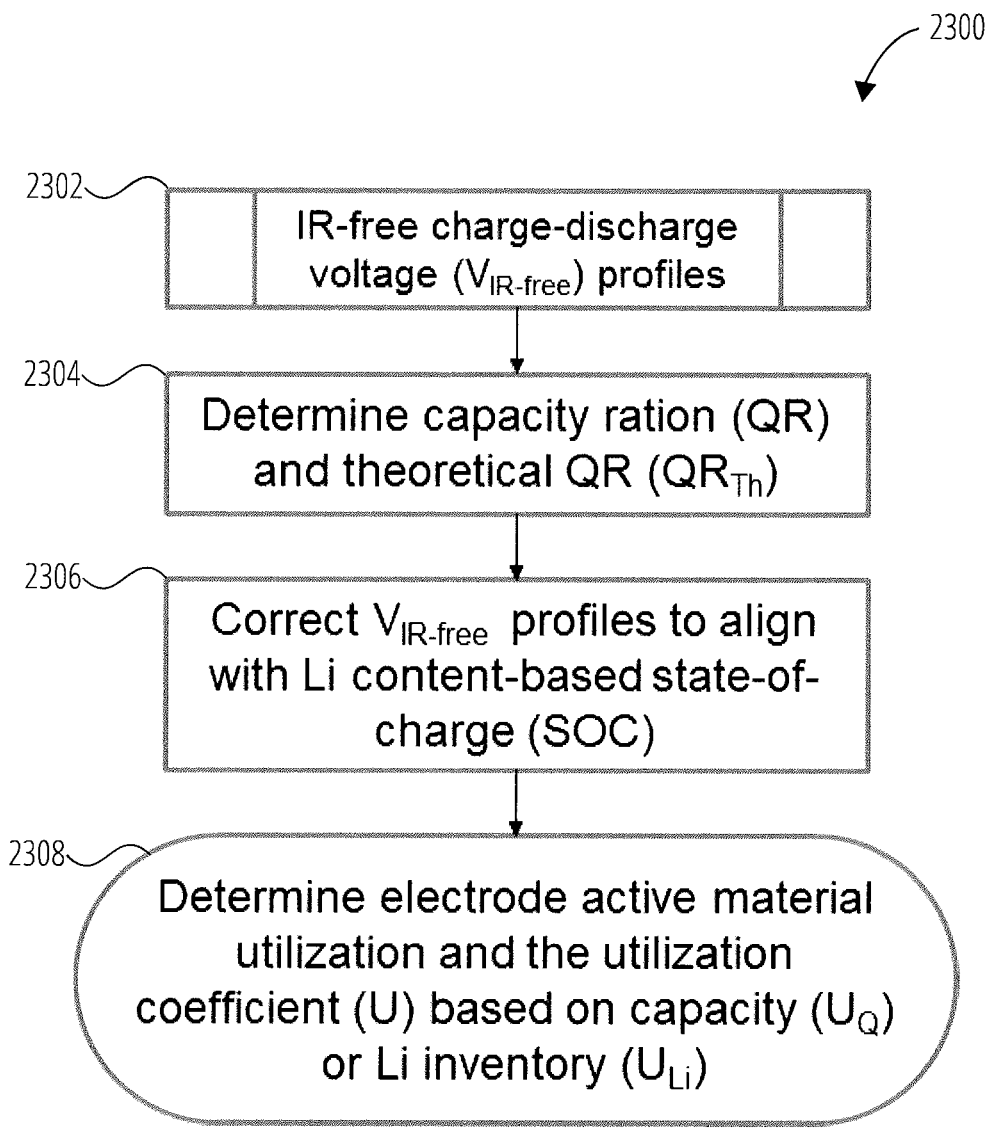
FIG. 23 is a flow diagram illustrating a method of quantifying active materials utilization in an energy storage device, according to some examples.

FIG. 23 is a flow diagram illustrating a method 2300 of quantifying active materials utilization. The method 2300 may include generating IR-free charge-discharge voltage profiles, as shown in operation 2302. The method 2300 may also include determining a capacity ration (QR) and a theoretical capacity ration ($QR_{Th}$), as shown in operation 2304. The method 2300 may further include correcting the generated IR-free voltage profiles to align with a lithium (Li) content-based state of charge (SOC), as shown in operation 2306. The method 2300 may further include determining electrode active material utilization and a utilization coefficient (U) based on capacity ($U_Q$) or Li inventory ($U_{Li}$), as shown in operation 2308.

Figure 24:
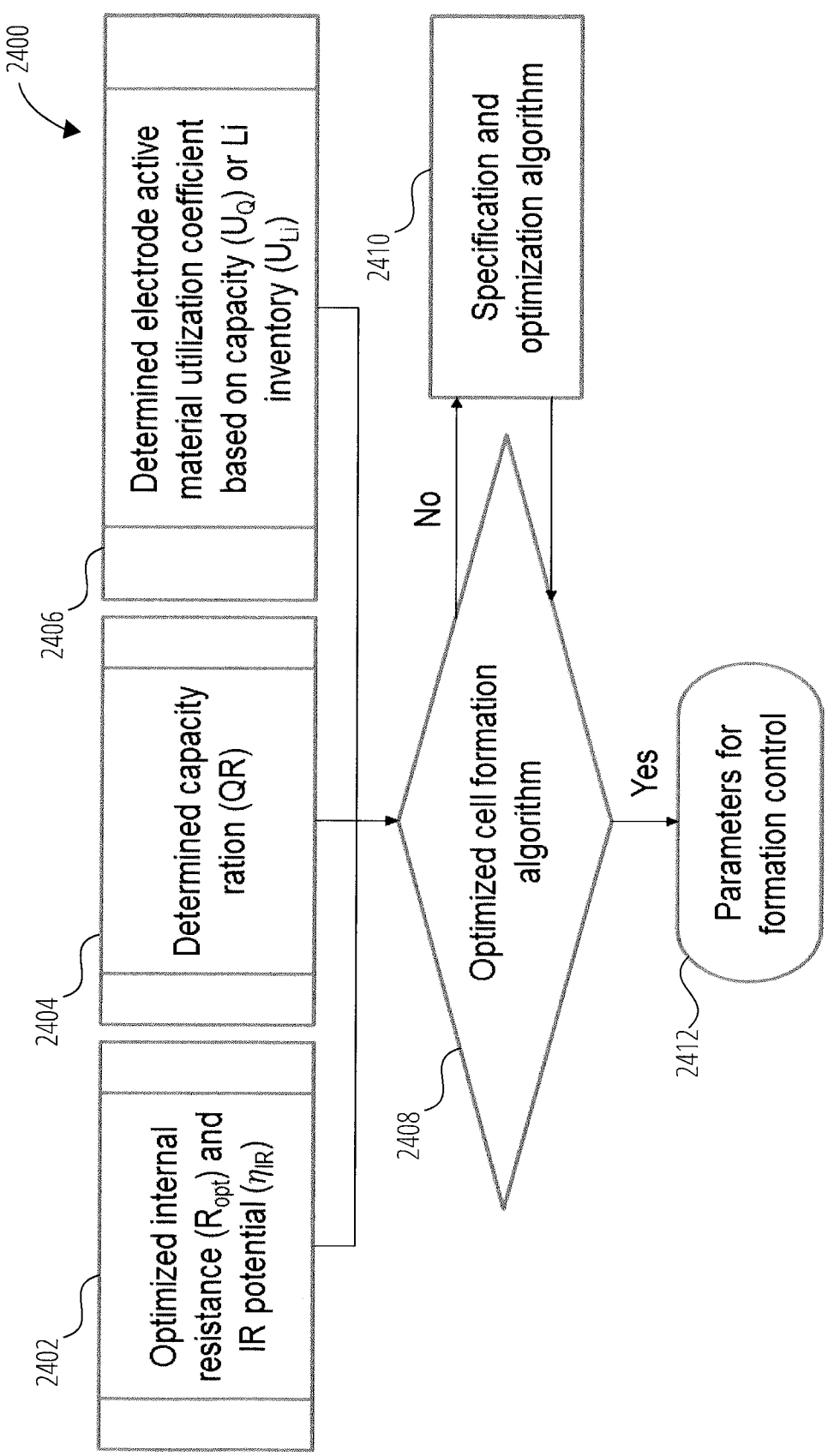
FIG. 24 is a flow diagram illustrating a method of battery cell formation process control, according to some examples.

FIG. 24 is a flow diagram illustrating a method 2400 of battery cell formation process control. The method 2400 may include receiving optimized internal resistance and IR potential values 2402, a capacity ration 2404, and an electrode active material utilization coefficient 2406. At operation 2408, the method 2400 may check to see whether there is an "optimized" cell formation algorithm determined based on the internal resistance/IR potential values 2402, the capacity ration 2404, or the electrode active material utilization coefficient 2406. If yes then the method 2400 may generate parameters for formation control, as shown in operation 2412. If no, then the method 2400 proceeds to operation 2410 where a specification and optimization algorithm generates an optimized cell formation algorithm. For example, optimizing may include defining or inferring a desirable formation optimization criterion by principle. For instance, an ideal formation protocol may entail highest CAM utilization, instead of capacity; the compositional change is within the specification, instead of capacity, in the voltage window specified; avoid overcharging and overdischarging by the composition changes; reduce the difference in the CAM utilization coefficient between the charge and discharge processes; sorting out the differences between charge retention and Li inventory retention to ensure minimal degradation of CAM; analyzing the capacity loss during thermal/calendar aging and the loss mechanism if related to CAM loss or capacity loss from the Li transport.

Figure 25:
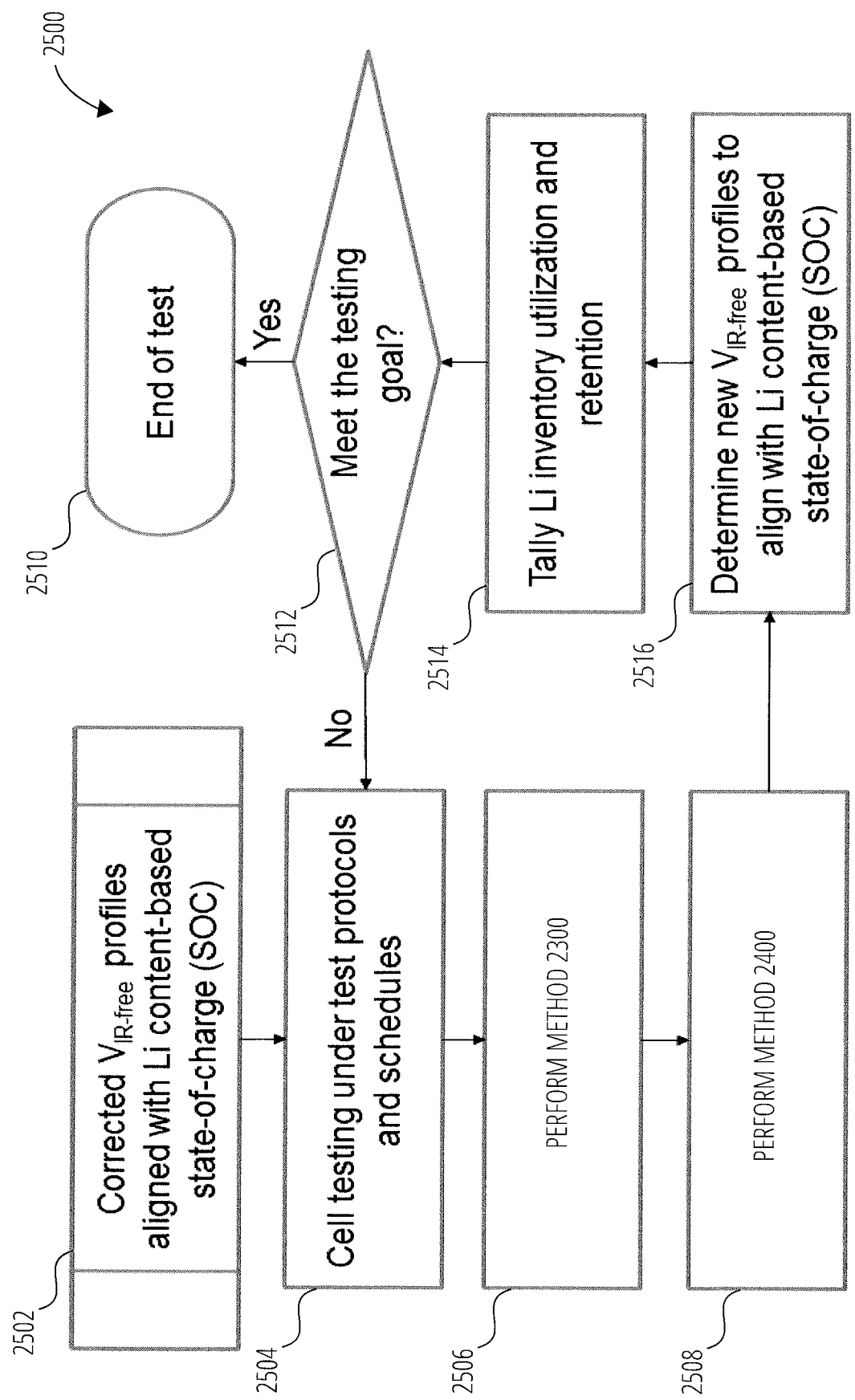
FIG. 25 is a flow diagram illustrating a method of lithium inventory tracking and retention in an energy storage device, according to some examples.

FIG. 25 is a flow diagram illustrating a method 2500 of lithium inventory tracking and retention in an energy storage device. The method 2500 may include aligning corrected IR-free voltage profiles with Li content-based state of charge, as shown in operation 2502. The method 2500 may also include testing one or more cells, as shown in operation 2504. For example, the cells may be tested based on a predetermined specification designed for a specific application. For instance, predetermined specifications may include charging protocol optimization, reliability quantification, life cycle prediction, evaluation of cell performance under predetermined operating conditions, without limitation. At operation 2506, the method 2500 may perform the operations of the method 2200 as shown in FIG. 22. At operation 2508, the method 2500 may perform the operations of method 2300 as shown in FIG. 23. The method 2500 may then determine new IR-free voltage profiles to align with Li content based state-of-charge (SOC), as shown in operation 2516. The method 2500 may also include tallying Li inventory utilization and retention, as shown in operation 2514. At operation 2512, the method 2500 checks whether the cell testing has met a predetermined testing goal. If yes, the test ends, as shown in operation 2510. If no, then the method 2500 proceeds back to operation 2504.

Figure 26:
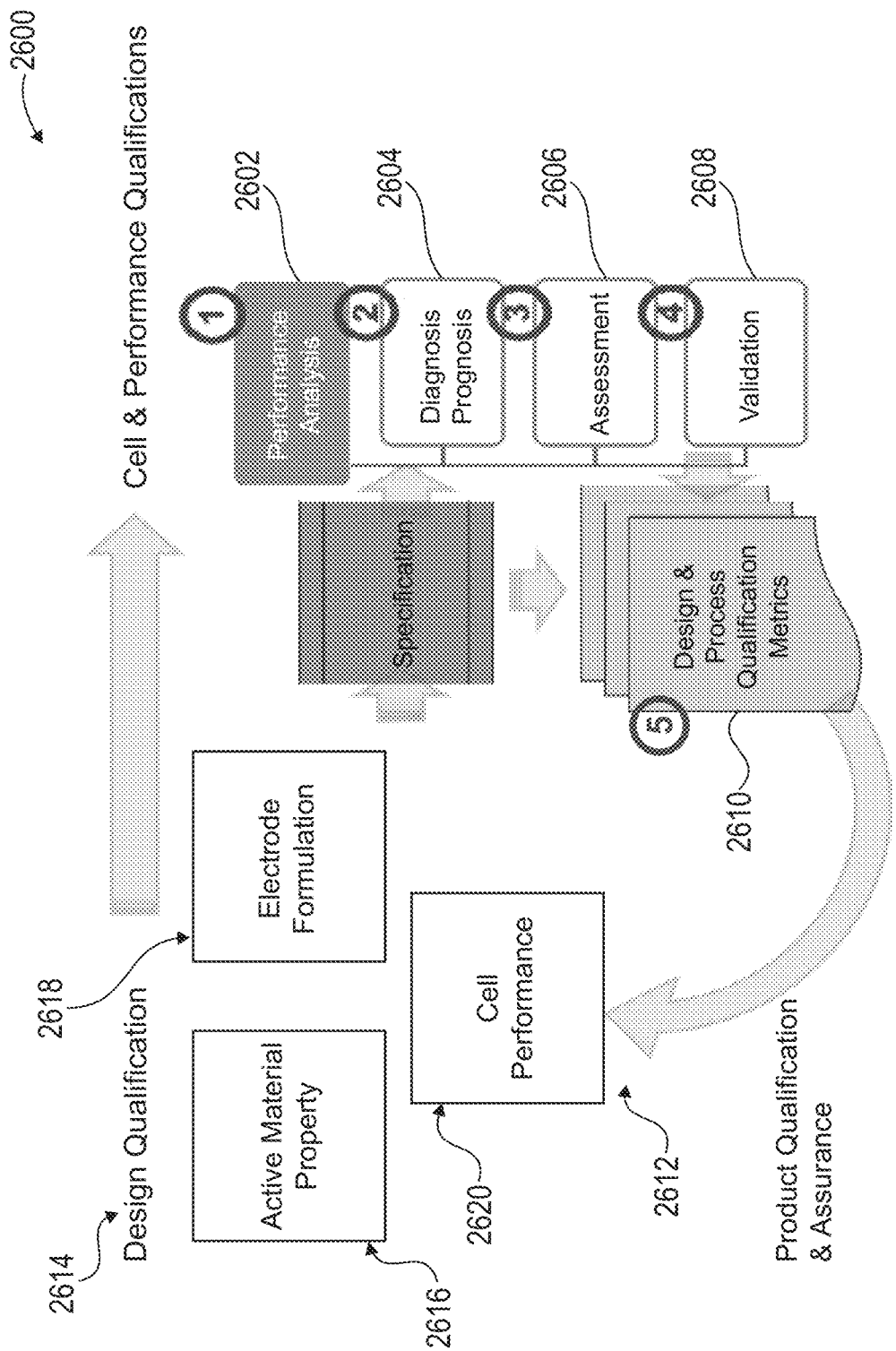
FIG. 26 is a flow diagram illustrating a method of Failure Mode and Effects Analysis for an energy storage device, according to some examples.

FIG. 26 is a flow diagram 2600 illustrating a method of Failure Mode and Effects Analysis for an energy storage device. The flow diagram 2600 includes performance analysis 2602, which may include diagnosis and prognosis 2604, assessment 2606, and validation 2608. The flow diagram also includes driving design and process qualification metrics 2610, product qualification and assurance 2612, and design qualification 2614. The numbers (1)-(5) shown in FIG. 26 correlate to operations 2602, 2604, 2606, 2608, and 2610 respectively. The performance analysis 2602 may include assessing dQ/dv over Voltage for a one or more cells. The diagnosis prognosis 2604 may include assessing the voltage over state of charge (SOC) percentage for a Pseudo OCV. Assessment 2606 may include cell quantification which may include measuring the specific capacity as a function of cycle number for one or more good cells, bad cells, or "ugly" cells. The validation 2608 may include measuring the sum of loss of lithium inventory or a Li foil thickness as a function of cycle number. The design qualification 2614 may include assessing active material properties 2616, electrode formulation 2618, and cell performance 2620. Active material properties may be assessed by examining voltage over SOC for a given cell. Electrode formation may be assessed by examining the utilization coefficient as a function of cutoff voltage for a given cell. Cell performance may be assessed by examining a coulombic coefficient as a function of a cutoff voltage for a given cell.

Figure 27:
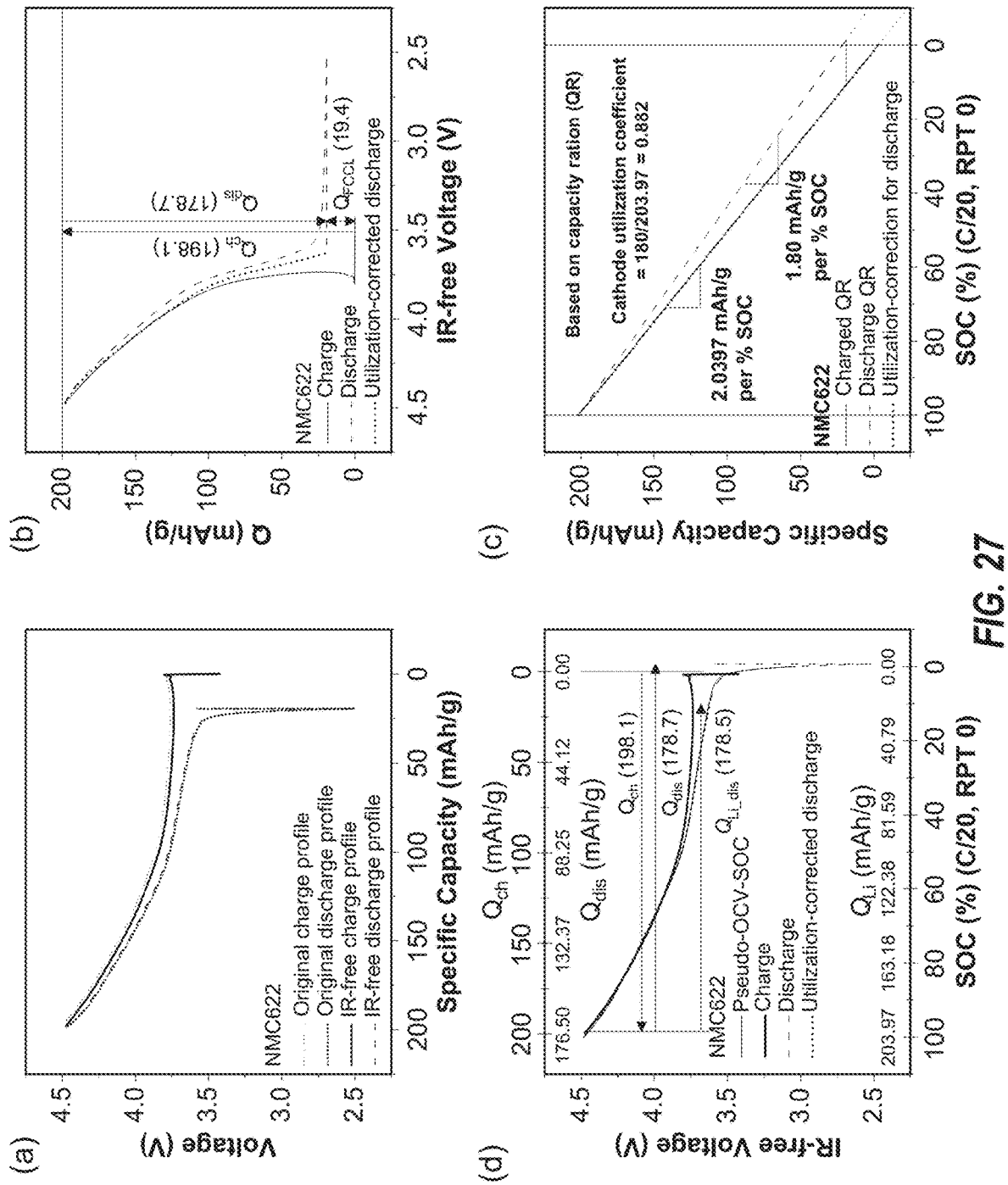
FIG. 27 is a series of plots illustrating an analysis of the formation cycle of a Li-NMC622 cell using the eCAD technique.

FIG. 27 is a series of plots 2700 (plots (a)-(d)) illustrating an analysis of the formation cycle of a Li-NMC622 cell using the eCAD technique. Plot (a) of FIG. 27 illustrates the charge and discharge profiles and the associated IR-free voltage profiles. Plot (b) of FIG. 27 illustrates the transformed correspondence of the specific capacity vs. IR-free voltage. Plot (c) of FIG. 27 illustrates the associated specific capacity and SOC correspondence for the charge and discharge profiles that show the utilization disparity between the two. Plot (d) of FIG. 27 illustrates the reconciled charge and discharge IR-free voltage vs. SOC profiles in correspondence with the Li content in NMC622. The plots depicted in FIG. 27 are similar to those depicted in FIG. 3 illustrating the applicability of the same principle and procedure to obtain the IR-free voltage charge and discharge profiles. For example, in plot (a) of FIG. 27, the specific capacity and IR-free voltage correspondence; in plot (b) of FIG. 27, the specific capacity and SOC relationships; in plot (c) of FIG. 27, where the utilization of the charge and discharge regimes may be quantified respectively based on $QR_{Th}$ of NMC622, and the reconciled charge and discharge profiles may be based on SOC and the Li content in NMC622, as shown in plot (d) of FIG. 27.

The theoretical capacity of NMC622 may be $Q_{Th}$=276.5 mAh/g, if one Li were removed from the lattice. Using the RPT0 charge and discharge profiles at C/20, the pseudo-OCV vs. SOC curve for NMC622 is obtained. Based on the pseudo-OCV vs. SOC curve for NMC622, the theoretical capacity between 2.5 V and 4.5 V may be $Q_{Th}$(2.5–4.5 V)=204.0 mAh/g. The capacity ration calculation using the section between 60% and 75% SOC may also validate the same, thus $QR_{Th}$=2.040 mAh/g·% SOC. The illustration in FIG. 28 fully demonstrates the generality and applicability of the eCAD technique to track Li inventory and quantify Li inventory retention in other transition metal oxides-based cathode systems, when the IR-free voltage vs. SOC profiles exhibit a unique correspondence for inference of the Li content in the lattice.

To use the universal pseudo-OCV vs. SOC curve, as illustrated in FIG. 2, as the basis for any cross-platform comparison, the charge discharge profiles are transformed from the data in the experiments into a useful analytic format that can be used in the framework depicted by the universal pseudo-OCV vs. SOC relationship. Following the data transformation scheme, the voltages may be "IR-free," thus the polarization potential may be estimated and removed from the voltage profile in each regime, and the SOC is scaled to represent the actual Li content in NMC811 to track the Li inventory and its changes in the polarization. Although such a data transformation methodology may be reported to track the capacity loss, the validation with GITT may be accomplished in the present disclosure to understand the context and accuracy of this transformation. Additionally, the theoretical basis for such a transformation may be established in the present disclosure with a modified process as illustrated in FIG. 3.

One example modification applied herein may be the incorporation of the concept of cathode "utilization efficiency" which may vary with the polarization conditions. Introducing the utilization coefficient and efficiency into the data transformation may not only alleviate the impacts from the polarization kinetics but also may mitigate the disparity in the utilization of NMC811 under various polarization conditions imposed by the experiments. Quantifying the utilization may enable a precise alignment of the IR-free voltage profiles with the Li content in NMC811. The charge regime may sometimes suffer almost no utilization issue because Li is being removed from the lattice. In contrast, ineffective utilization of the NMC capacity may often be observed in the discharge regime in NMC811. Such a utilization disparity may suggest the unreliable nature of using the measured capacity as the basis for comparison.

The utilization efficiency (or utilization coefficient) may be derived from the quantification of the "capacity ration (QR)," a variable that may represent the use of specific capacity (mAh/g) per % SOC under polarization, as shown in FIG. 3(c). The QR determined at C/20 in the charge regime (2.202 mAh/g·% SOC) may be validated similarly to the specific capacity related to the Li content change in NMC811 per % SOC represented by the theoretical capacity ration ($QR_{Th}$=2.204 mAh/g·% SOC). Using inferred SOC as a basis for tracking the Li content in NMC811, the QR for each charge or discharge segment may be evaluated and the cathode material utilization efficiency assessed by the $QR/QR_{Th}$ ratio.

To illustrate the ability to conduct cross-platform comparisons, two types of cells: Targray NMC811 pouch cells (T-P cells) and EcoPro NMC811 coin cells (E-C cells) may be used to show how Li inventory analyses can decipher distinct differences in performance depending on the degrees of capacity utilization in the cathode due to the factors in the cathode formulation. These variances may alter the polarization kinetics during the measurements which might be difficult to decipher by the capacity-based analyses. However, with eCAD and Li inventory tracking, insightful information may be derived quantitatively.

To gain optimized battery performance, reducing internal DC resistance (DCR) and polarization IR potential (η) may be useful in the cell design and performance optimization. The increase of the DCR is also often used to assess the battery aging in performance. In some cases, both DCR and IR potential rely on laboratory testing as a function of capacity. The capacity dependent DCR and IR potential in battery management system (BMS) are convenient parameters to monitor and be used in the control algorithm calculation. However, as the cell ages, the capacity of the cell is reduced, making the capacity dependence less reliable. Additionally, the algorithm calculation may not be optimized anymore for control strategy and life optimization. One alternative is to use electrode composition based SOC as the controlling variable to yield a more reliable dependency. This is one of the underlying merits of eCAD, which uses Li content in the cathode material as the basis for estimating the capacity loss to decipher the loss mechanism. Additionally, the DCR and IR potential increases consist of two major components. One is the Li content variation in the cathode composition that may cause the potential of the cathode and anode to shift, often showing as an increase in the IR potential. The other is the actual DCR increase due to the kinetic polarization with the electrode composition.

Although capacity reflects the Li content change in the electrode composition, the same capacity does not always come from the same region of the compositional change in the electrode. Therefore, if the battery state estimation is based on the electrode composition, it may be more reliable than that based on the capacity. Likewise, the dependence of DCR and IR potential on the electrode composition may be more reliable than those dependent on capacity correlation. The eCAD derived correlations may thus be more reliable than those determined directly by the capacity measurements.

Figure 28:
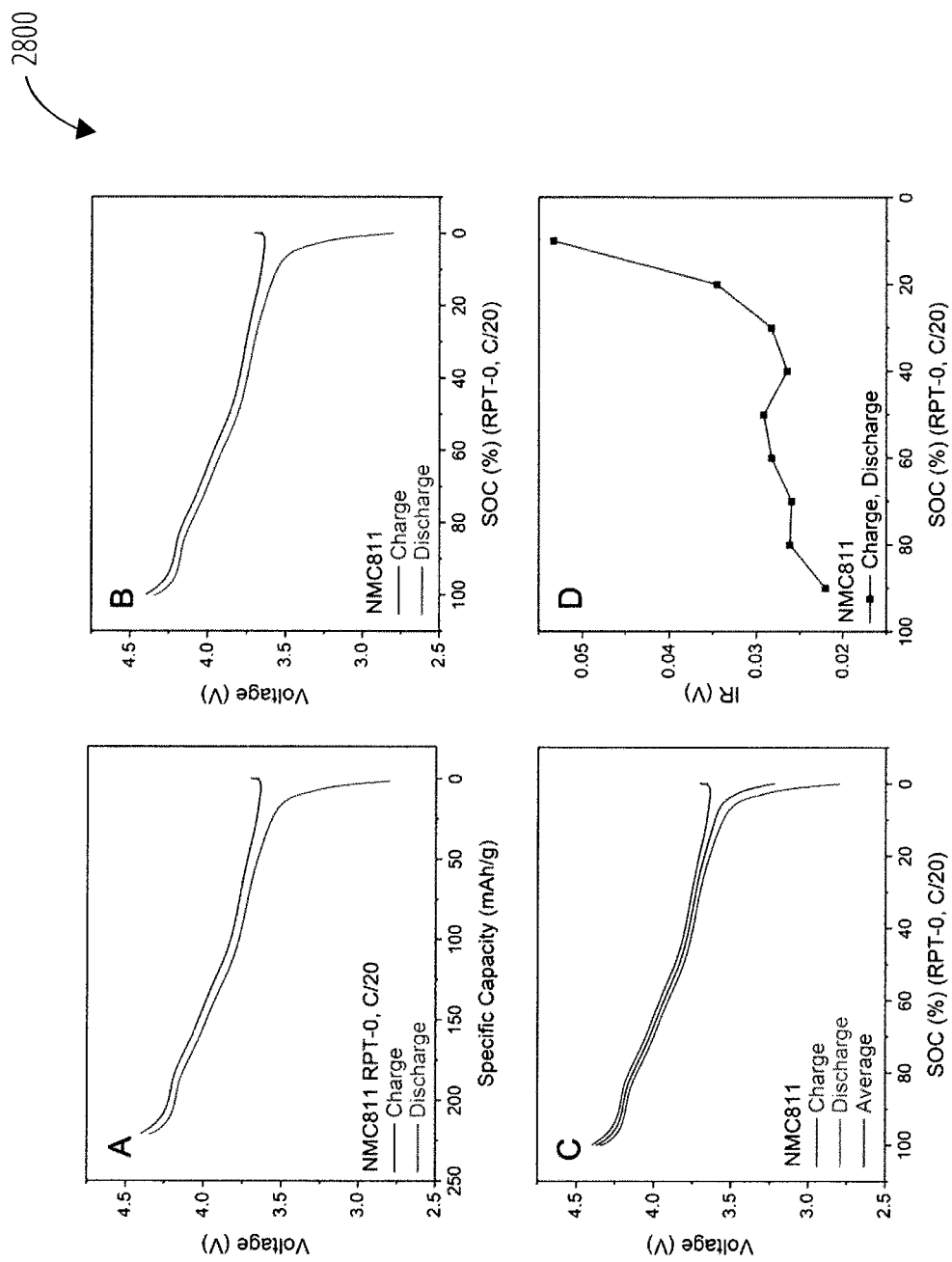
FIG. 28 shows a schematic representation of a method of using voltage averaging to obtain IR potential in a charge or discharge profile, according to one or more embodiments of the present disclosure.

FIG. 28 is a schematic illustration of a method of using voltage averaging to obtain IR potential in a charge or discharge profile via a series of plots 3200 (plots (A)-(D)). Plot (A) illustrates a set of typical charge and discharge voltage profiles for a rechargeable lithium (Li) battery cell. Plot (B) illustrates converting the charge and discharge profiles into a Li content-based state-of-charge (SOC) dependence. Plot (C) illustrates deriving the averaged voltage profile from the charge and discharge voltage profile. Plot (D) illustrates calculating the differences between the charge or discharge profile against the averaged voltage profile to yield the IR potential.

Specifically, plots (A)-(D) are four different methods in the estimation and determination of DCR and IR potential. As shown in FIG. 28, a pseudo-OCV that is derived from the averaging of the charge and discharge voltage profiles measured at C/20 rate (plot (C)) may be used as the basis for the DCR and IR potential determination. Additionally, the electrode (NMC811) composition determined between 2.8 V and 4.4 V verses a lithium (Li) electrode may be used as the basis for state-of-charge (SOC) determination (plots (A) and (B)). The pseudo-OCV versus SOC correspondence may be verified to be a reliable and universal correspondence between the equilibrium electrode potential and the electrode composition defined by the Li content in the NMC811 composition. The difference between the measured charge and discharge profiles and the pseudo-OCV as a function of SOC may thus be determined as the IR potential that changes with SOC (see plot (D)). The schematic shown in FIG. 28 is thus denoted as the "Pseudo-OCV method."

Figure 29:
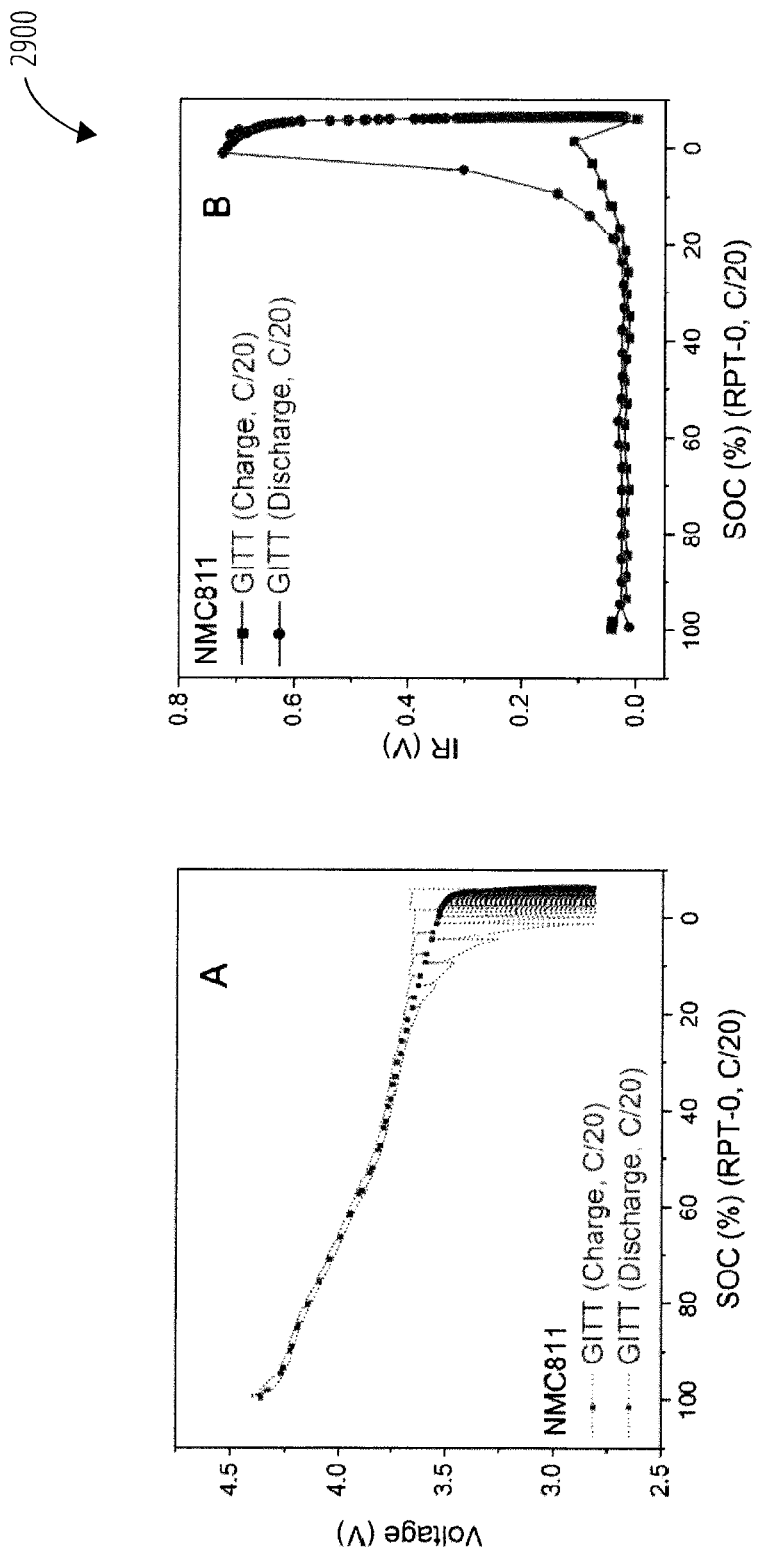
FIG. 29 shows a schematic representation of a method of using a galvanostatic intermittent titration (GITT) to derive the IR potential as a function of Li content in a cathode or in the cathode active material, according to one or more embodiments of the present disclosure.

The galvanostatic intermittent titration technique (GITT) as well as the potentiostatic intermittent titration technique (PITT) may be used to determine the equilibrium electrode potential as a function of electrode composition. For example, as shown in FIG. 29, the measurement of GITT on NMC811 may be used as an example to illustrate the determination of DCR and IR potential using the equilibrium electrode potential determined by GITT as a function of SOC in plot (A) and plot (B). The process depicted in FIG. 29 is denoted as the "GITT method." Because the GITT data are measured in an incremental manner, the DCR and IR potential so determined by the GITT method do not have the detailed granularity as those determined by pseudo-OCV or the process shown in FIG. 28 as a function of SOC. However, since the equilibrium potential is directly determined by measurements, the DCR and IR potential so determined may possess a better accuracy.

Specifically, FIG. 29 illustrates a pair of plots 2900 (plots (A)-(B)) to explain the method of using galvanostatic intermittent titration technique (GITT) to derive the IR potential as a function of Li content in the cathode material. Plot (A) illustrates the voltage excursion profiles obtained in the GITT experiment to show the polarized voltage profiles in the charge and discharge process and the associated equilibrium open circuit voltage (OCV) profiles determined by the rest voltage of the cell in an incremental rest period. Plot (B) illustrates the potential differences between the polarized voltage and the equilibrium OCV as a function of SOC can be obtained for the charge and discharge process to represent the IR potential.

Figure 30:
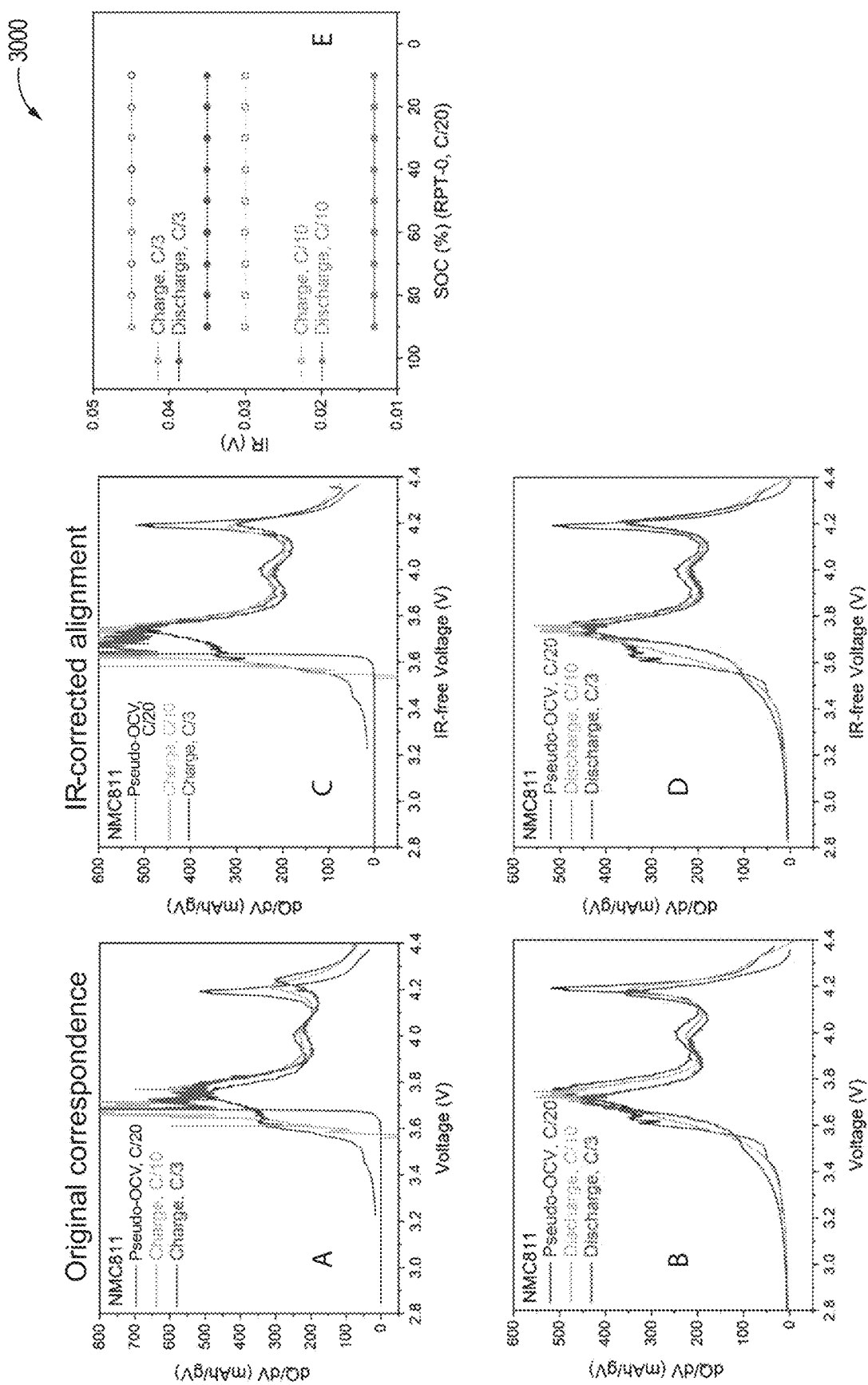
FIG. 30 shows a schematic representation of a dQ/dV derivation method of using dQ/dV profiles to derive an IR potential, according to one or more embodiments of the present disclosure.

FIG. 30 is a series of plots 3000 (plots (A)-(E)) showing the dQ/dV derivation method of using dQ/dV profiles to derive the IR potential. Plot (A) depicts the dQ/dV profiles based on pseudo-OCV at C/20, charge voltage profiles at C/10 and C/3. Plot (B) illustrates the corresponding dQ/dV profiles in the charge regime. Plot (C) and plot (D) illustrate using the alignment of a specific dQ/dV peak to yield the rate-dependent IR corrected best fit for charge and discharge regime, respectively. Plot (E) illustrates the correction of the IR displacement is used to derive the IR potential for each rate.

Specifically, FIG. 30 illustrates another DCR and IR potential determination method 3000 using a dQ/dV derivation method. The dQ/dV charge and discharge profiles as shown in plot (A) and plot (B) are the first derivative of the charge and discharge voltage profiles similar to those shown in plot (A) but at C/10 and C/3 rates to illustrate the rate dependent behavior. The corresponding dQ/dV profile of the pseudo-OCV versus capacity curve is also shown in each plot (plots (A)-(D)) for reference. Using the best fit to align the dQ/dV profiles at different rates with the one of pseudo-OCV, we can also derive the DCR and IR potential accordingly at different rates, as shown in plot (E). Thus, we called this process depicted in FIG. 30 the "dQ/dV Derivation Method."

Figure 31:
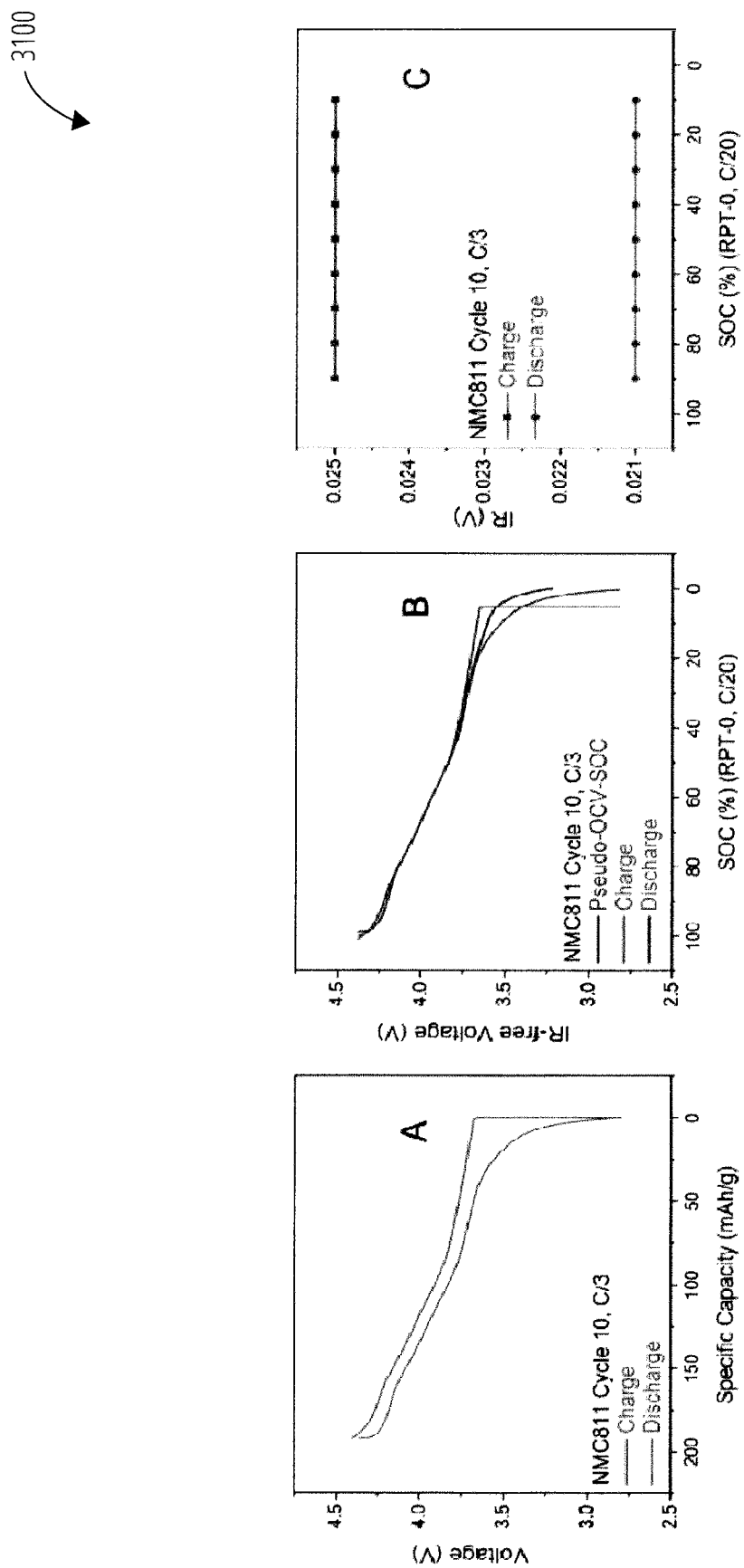
FIG. 31 shows a schematic representation of a Capacity-Ration-Corrected Pseudo-OCV method, according to one or more embodiments of the present disclosure.

FIG. 31 illustrates a series of plots 3100 (plots (A)-(C)) demonstrating a Capacity-Ration-Corrected Pseudo-OCV Method. Plot (A) shows a set of charge and discharge voltage profiles at C/3. Plot (B) illustrates, based on the pseudo-OCV versus SOC profile, a proper alignment with the Li content in the cathode material can be processed as delineated in the eCAD method disclosed in U.S. patent application Ser. No. 17/149,046, titled "ENERGY STORAGE CELL QUALIFICATION AND RELATED SYSTEMS, METHODS, AND DEVICES," filed Jan. 14, 2021, the entire disclosure of which is hereby incorporated herein by this reference, for the capacity loss analysis or the Li inventory tracking and analysis of the Li inventory retention. Plot (C) depicts the corresponding IR potential that may be calculated from the Li content alignment with the pseudo-OCV at the same SOC point.

Specifically, FIG. 31 illustrates a set of charge and discharge profiles (plot (A)), of which the IR potential and DCR can be used to yield the IR-free charge and discharge profiles with capacity ration correction to align with the pseudo-OCV versus SOC curve (plot (B)). The process allows the proper alignment of the charge and discharge voltage profiles with the electrode composition defined by the Li content and thus SOC. By using this process, we can obtain the best fit of the IR potential and DCR for each voltage profile (plot (C)). Therefore, this process depicted in FIG. 31 is called "Capacity-Ration-Corrected Pseudo-OCV Method."

Figure 32:
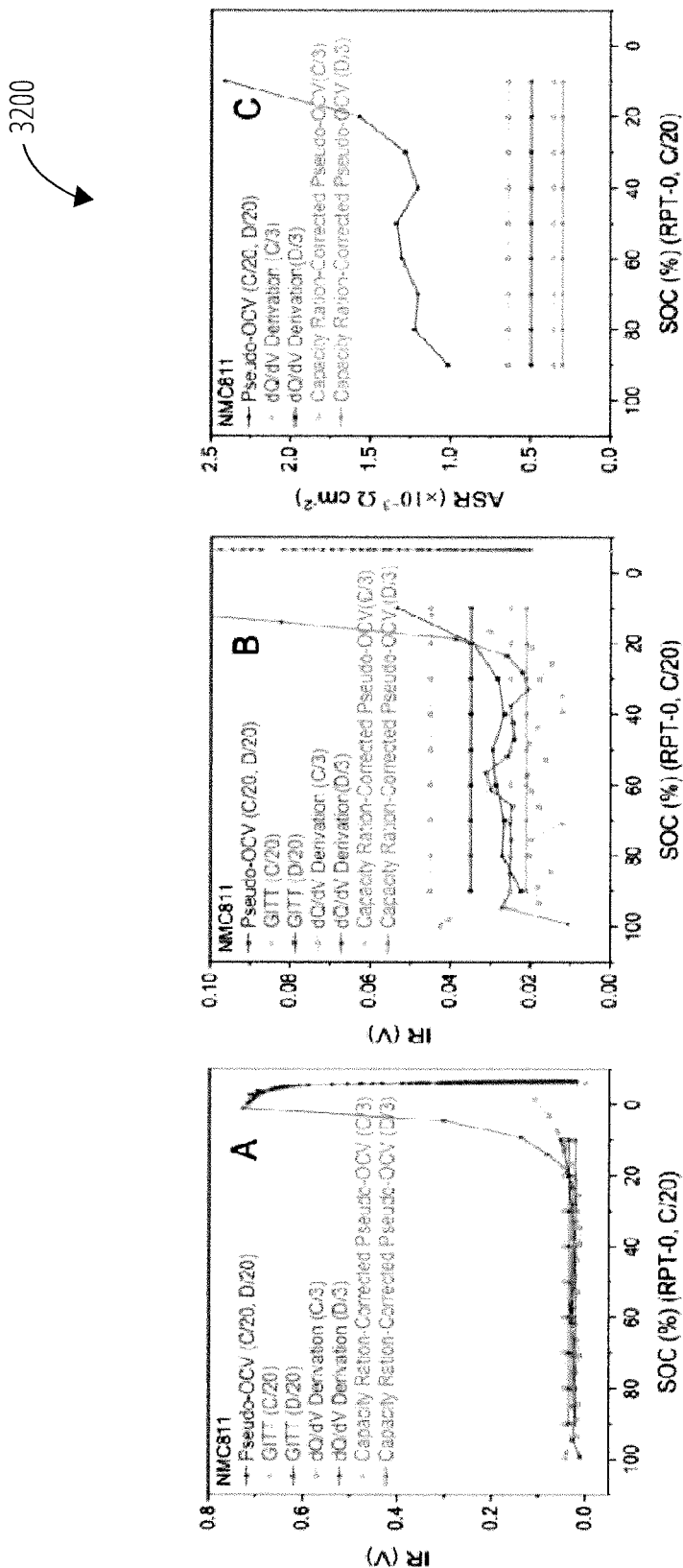
FIG. 32 shows a number of plots illustrating a summary of four IR potential estimation methods discussed herein, according to one or more embodiments of the present disclosure.

FIG. 32 illustrates a series of plots 3200 that summarize the comparisons among the four methods regarding IR potential (plots (A and B)) and DCR (plot (C)). It is worth noting that these four methods can be used to cross-verify their accuracy and SOC dependence. The four methods also provide convenient processes to derive accurate SOC dependent IR potential and DCR, depending on the availability of the data format and the accuracy required in the BMS and control algorithm.

Figure 33:
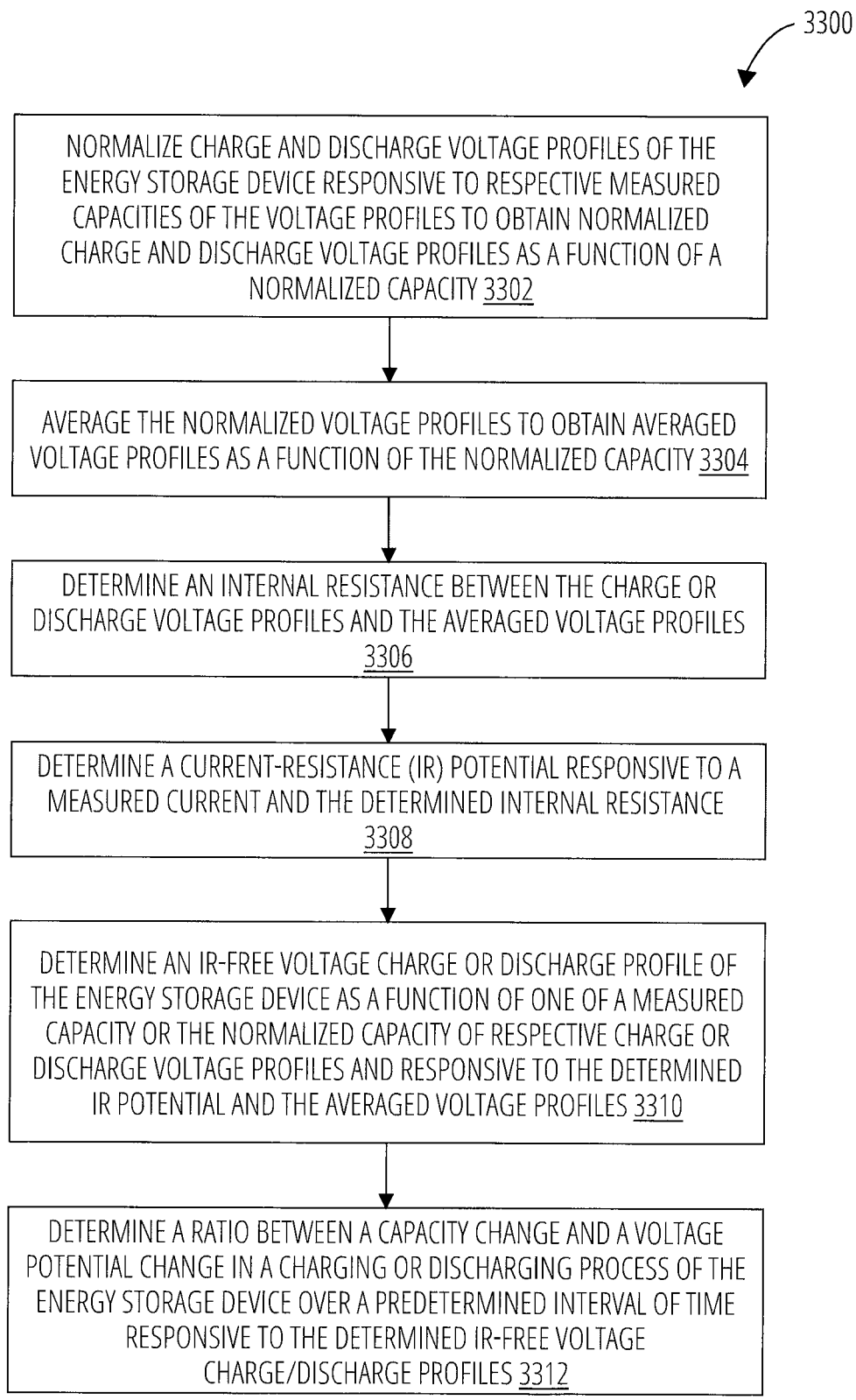
FIG. 33 is a flow diagram of a method to obtain the IR-free voltage profiles for the electrochemical energy storage system, according to one or more embodiments of the present disclosure.

FIG. 33 shows an example method 3300 performed by the electrochemical energy storage system 100 of FIG. 1. In operation 3302, the electrochemical energy storage system normalizes charge and discharge voltage profiles of the energy storage device responsive to respective measured capacities of the voltage profiles to obtain normalized charge and discharge voltage profiles as a function of a normalized capacity. In operation 3304, the electrochemical energy storage system averages the normalized voltage profiles to obtain averaged voltage profiles as a function of the normalized capacity. In operation 3306, the electrochemical energy storage system determines an internal resistance between the charge or discharge voltage profile and the normalized averaged voltage profile. In operation 3308, the electrochemical energy storage system determines a current-resistance (IR) potential responsive to a measured current and the determined internal resistance. In operation 3310, the electrochemical energy storage system determines an IR-free voltage charge or discharge profile of the energy storage device as a function of one of a measured capacity or the normalized capacity of respective charge or discharge voltage profiles responsive to the determined IR potential and the averaged voltage profiles. In operation 3312, the electrochemical energy storage system determines a ratio between a capacity change and a voltage potential change in a charging or discharging process of the energy storage device over a predetermined interval of time responsive to the determined IR-free voltage charge/discharge profiles.

Figure 34:
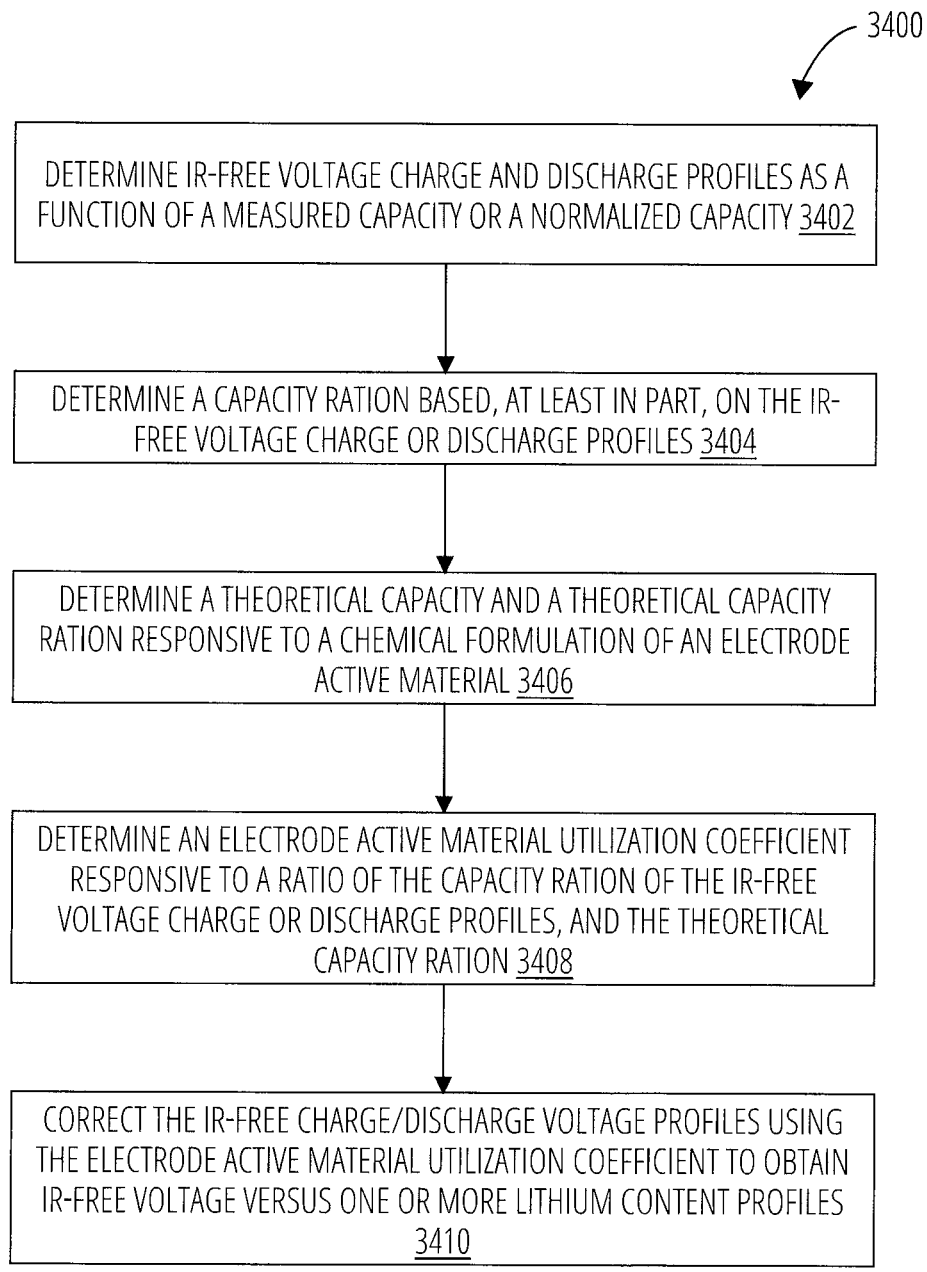
FIG. 34 is a flow diagram of another method to obtain the IR-free voltage profiles as a function of lithium content in the cathode active material in the electrochemical energy storage system, according to one or more embodiments of the present; disclosure.

FIG. 34 shows an example method 3400 performed by the electrochemical energy storage system 100 of FIG. 1. In operation 3402, the electrochemical energy storage system determines IR-free voltage charge/discharge profiles as a function of a measured capacity or a normalized capacity. In operation 3404, method 3400 determines a capacity ration based, at least in part, on the IR-free voltage charge/discharge profiles. In operation 3406, the electrochemical energy storage system determines a theoretical capacity and a theoretical capacity ration responsive to a chemical formulation of an electrode active material. In operation 3408, the electrochemical energy storage system determines an electrode active material utilization coefficient responsive to a ratio of the capacity ration of the IR-free voltage charge/discharge profiles, and the theoretical capacity ration. In operation 3810, the electrochemical energy storage system corrects the IR-free voltage charge/discharge profiles using the electrode active material utilization coefficient to obtain IR-free voltage versus one or more lithium content profiles.

Figure 35:
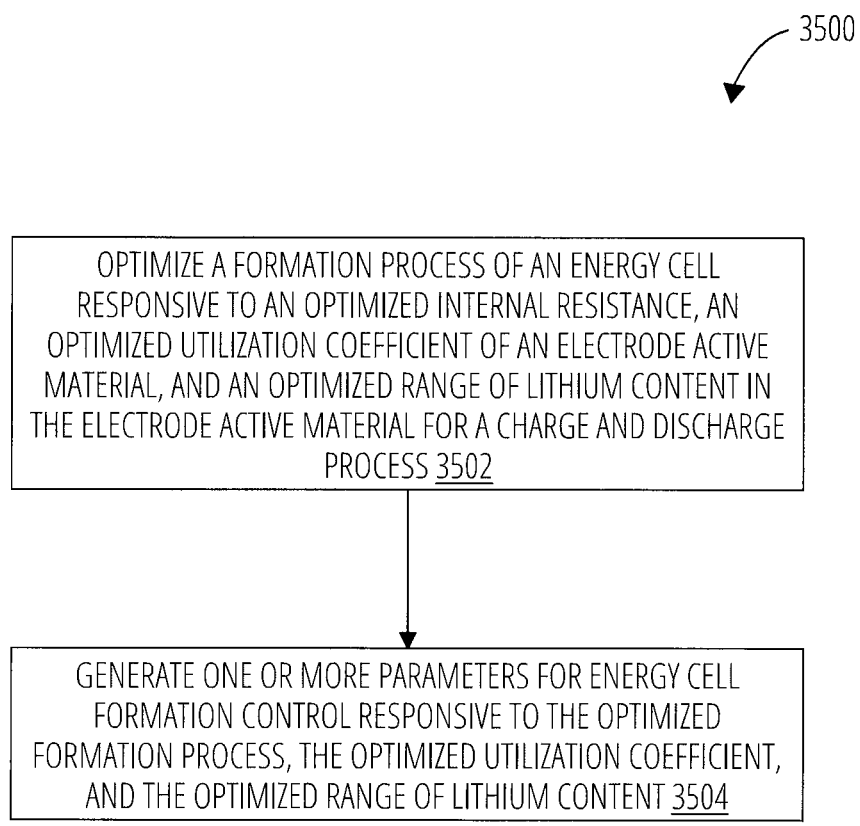
FIG. 35 is a flow diagram of another method to optimize the formation process for the electrochemical energy storage system, according to one or more embodiments of the present; disclosure.

FIG. 35 shows an example method 3500 performed by the electrochemical energy storage system 100 of FIG. 1. In operation 3502, the electrochemical energy storage system optimizes a formation process of an energy storage cell responsive to an optimized internal resistance, an optimized utilization coefficient of an electrode active material, and an optimized range of lithium content in the electrode active material for a charge and discharge process. In operation 3504, the electrochemical energy storage system generates one or more parameters for energy storage cell formation control.

Figure 36:
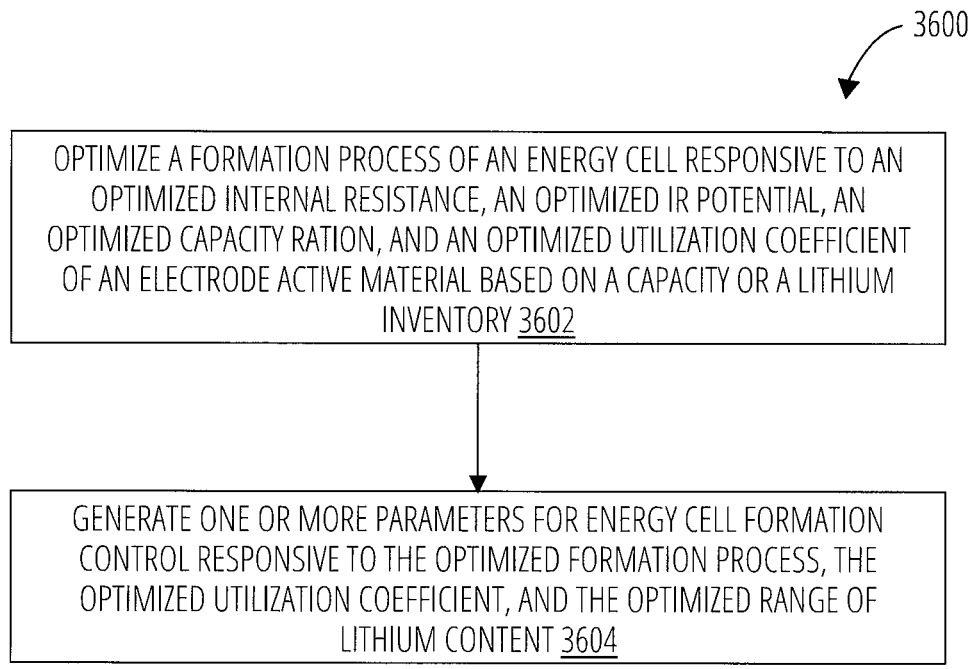
FIG. 36 is a flow diagram of another method to optimize the formation process and control for the electrochemical energy storage system, according to one or more embodiments of the present disclosure.

FIG. 36 shows an example method 3600 performed by the electrochemical energy storage system 100 of FIG. 1. In operation 3602, the electrochemical energy storage system optimizes a formation process of an energy storage cell responsive to an optimized internal resistance, an optimized IR potential, an optimized capacity ration, and an optimized utilization coefficient of an electrode active material based on a capacity or a lithium inventory. In operation 3604, the electrochemical energy storage system generates one or more parameters for energy storage cell formation control.

Figure 37:
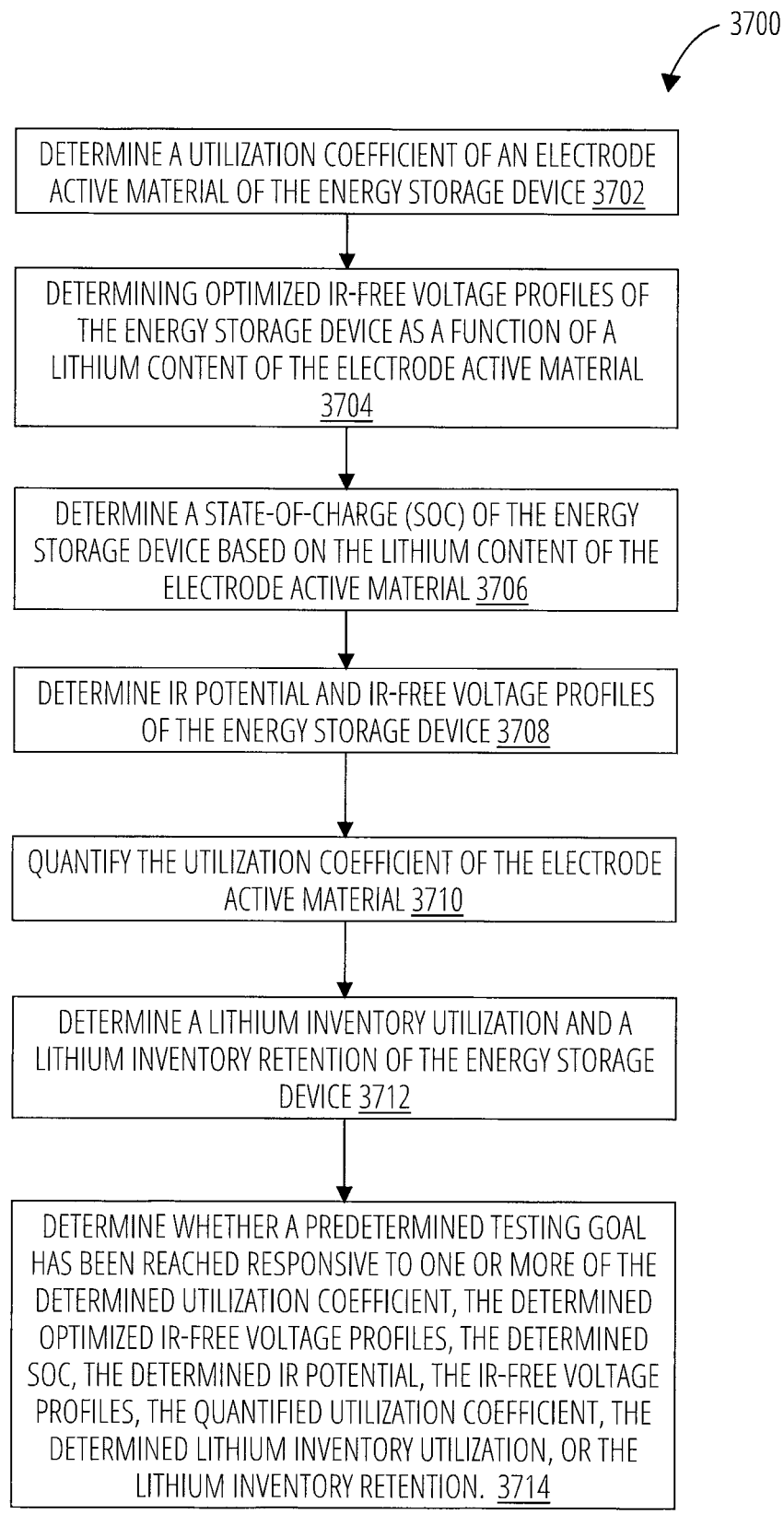
FIG. 37 is a flow diagram of another method to optimize the control of the operating conditions for the electrochemical energy storage system, according to one or more embodiments of the present disclosure.

FIG. 37 shows an example method 3700 performed by the electrochemical energy storage system 100 of FIG. 1. In operation 3702, the electrochemical energy storage system determines a utilization coefficient of an electrode active material. In operation 3704, the electrochemical energy storage system determining optimized IR-free voltage profiles as a function of a lithium content of the electrode active material. In operation 3706, the electrochemical energy storage system determines a state-of-charge (SOC) based on the lithium content in the electrode active material. In operation 3708, method 3700 tests one or more energy storage cells. In operation 3710, the electrochemical energy storage system determines IR potential and IR-free voltage profiles. In operation 3712, the electrochemical energy storage system quantifies the utilization coefficient of the electrode active material. In operation 3714, the electrochemical energy storage system determines a lithium inventory utilization and a lithium inventory retention. In operation 3716, the electrochemical energy storage system determines whether a predetermined testing goal has been reached.

Figure 38:
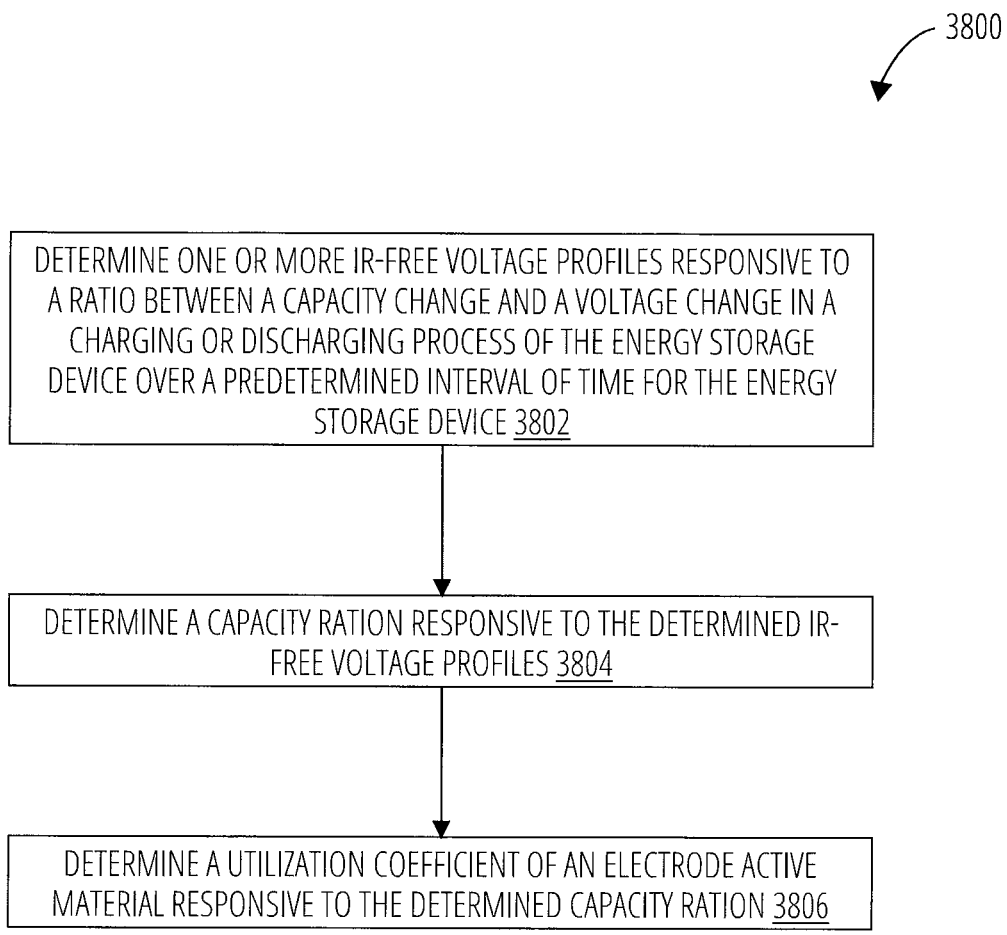
FIG. 38 is a flow diagram of another method to determine a utilization coefficient of an electrode active material in the electrochemical energy storage system according to one or more embodiments of the present disclosure.

FIG. 38 shows an example method 3800 performed by the electrochemical energy storage system 100 of FIG. 1. In operation 3802, the electrochemical energy storage system determines one or more IR-free voltage profiles responsive to a ratio between a capacity change and a voltage change in a charging or discharging process of the energy storage device over a predetermined interval of time for the energy storage device. In operation 3804, the electrochemical energy storage system determines a capacity ration responsive to the determined IR-free voltage profiles. In operation 3806, the electrochemical energy storage system determines a utilization coefficient of an electrode active material responsive to the determined capacity ration.

Figure 39:
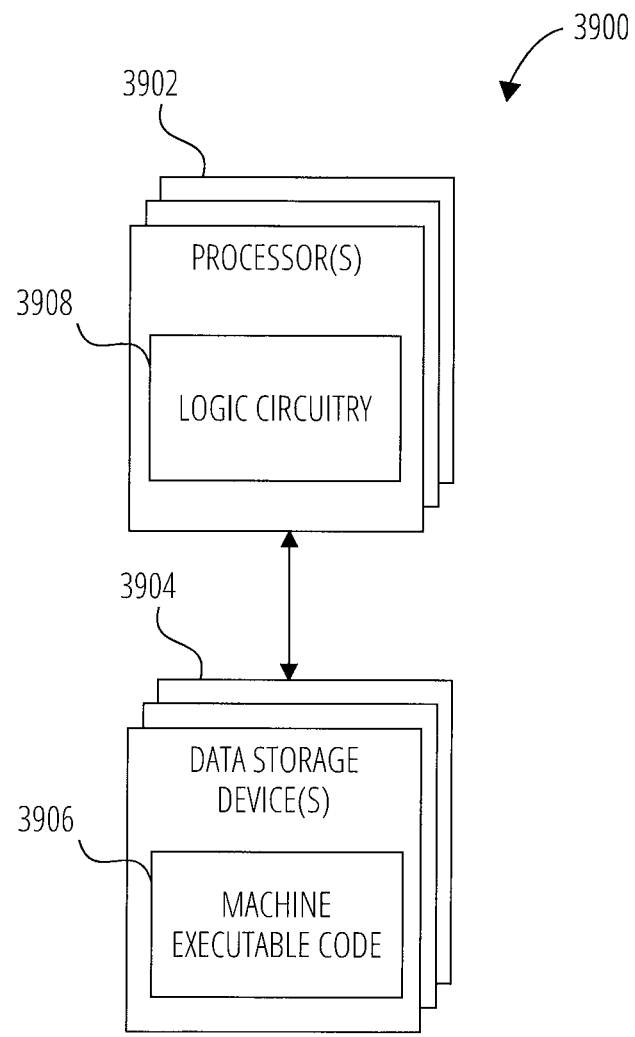
FIG. 39 is a block diagram of circuitry that, in some examples, may be used to implement various functions, operations, acts, processes, and/or methods disclosed herein.

It will be appreciated by those of ordinary skill in the art that functional elements of examples disclosed herein (e.g., functions, operations, acts, processes, and/or methods) may be implemented in any suitable hardware, software, firmware, or combinations thereof. FIG. 39 illustrates non-limiting examples of implementations of functional elements disclosed herein. In some examples, some or all portions of the functional elements disclosed herein may be performed by hardware specially configured for carrying out the functional elements.

FIG. 39 is a block diagram of circuitry 3900 that, in some examples, may be used to implement various functions, operations, acts, processes, and/or methods disclosed herein.

The circuitry 3900 includes one or more processors 3902 (sometimes referred to herein as "processors 3902") operably coupled to one or more data storage devices (sometimes referred to herein as "storage 3904"). The storage 3904 includes machine executable code 4306 stored thereon and the processors 3902 include logic circuitry 3908. The machine executable code 3906 includes information describing functional elements that may be implemented by (e.g., performed by) the logic circuitry 3908. The logic circuitry 3908 is adapted to implement (e.g., perform) the functional elements described by the machine executable code 3906. The circuitry 3900, when executing the functional elements described by the machine executable code 3906, should be considered as special purpose hardware configured for carrying out functional elements disclosed herein. In some examples the processors 3902 may perform the functional elements described by the machine executable code 3906 sequentially, concurrently (e.g., on one or more different hardware platforms), or in one or more parallel process streams.

When implemented by logic circuitry 3908 of the processors 3902, the machine executable code 3906 is to adapt the processors 3902 to perform operations of examples disclosed herein. For example, the machine executable code 3906 may adapt the processors 3902 to perform at least a portion or a totality of the method 3300 of FIG. 33 and/or the method 3700 of FIG. 37. As another example, the machine executable code 3906 may adapt the processors 3902 to perform at least a portion or a totality of the operations discussed for the apparatus of FIG. 1. As a specific, non-limiting example, the machine executable code 3906 may adapt the processors 3902 to normalize charge/discharge voltage profiles of an energy storage device, average the normalized profiles, determine an internal resistance, determine a current resistance, determine an IR-free voltage profile, and determine a ratio between a capacity change and a voltage potential change in a charging or discharging process of the energy storage device. As another specific, non-limiting example, the machine executable code 3906 may adapt the processors 3902 to determine a utilization coefficient of an electrode active material, determine optimized IR-free voltage profiles, determine a state of charge (SOC), test one or more energy cells, determine IR potential and IR-free voltage profiles, quantify the utilization coefficient of the electrode active material, determine a lithium inventory utilization and a lithium inventory retention, and determine whether a predetermined testing goal has been reached.

The processors 3902 may include a general purpose processor, a special purpose processor, a central processing unit (CPU), a microcontroller, a programmable logic controller (PLC), a digital signal processor (DSP), an application specific integrated circuit (ASIC), a field-programmable gate array (FPGA) or other programmable logic device, discrete gate or transistor logic, discrete hardware components, other programmable device, or any combination thereof designed to perform the functions disclosed herein. A general-purpose computer including a processor is considered a special-purpose computer while the general-purpose computer executes functional elements corresponding to the machine executable code 3906 (e.g., software code, firmware code, hardware descriptions) related to examples of the present disclosure. It is noted that a general-purpose processor (may also be referred to herein as a host processor or simply a host) may be a microprocessor, but in the alternative, the processors 3902 may include any conventional processor, controller, microcontroller, or state machine. The processors 3902 may also be implemented as a combination of computing devices, such as a combination of a DSP and a microprocessor, a plurality of microprocessors, one or more microprocessors in conjunction with a DSP core, or any other such configuration.

In some examples the storage 3904 includes volatile data storage (e.g., random-access memory (RAM)), non-volatile data storage (e.g., Flash memory, a hard disc drive, a solid state drive, erasable programmable read-only memory (EPROM), etc.). In some examples the processors 3902 and the storage 3904 may be implemented into a single device (e.g., a semiconductor device product, a system on chip (SOC), etc.). In some examples the processors 3902 and the storage 3904 may be implemented into separate devices.

In some examples the machine executable code 3906 may include computer-readable instructions (e.g., software code, firmware code). By way of non-limiting example, the computer-readable instructions may be stored by the storage 3904, accessed directly by the processors 3902, and executed by the processors 3902 using at least the logic circuitry 3908. Also by way of non-limiting example, the computer-readable instructions may be stored on the storage 3904, transferred to a memory device (not shown) for execution, and executed by the processors 3902 using at least the logic circuitry 3908. Accordingly, in some examples the logic circuitry 3908 includes electrically configurable logic circuitry 3908.

In some examples the machine executable code 3906 may describe hardware (e.g., circuitry) to be implemented in the logic circuitry 3908 to perform the functional elements. This hardware may be described at any of a variety of levels of abstraction, from low-level transistor layouts to high-level description languages. At a high-level of abstraction, a hardware description language (HDL) such as an IEEE Standard hardware description language (HDL) may be used. By way of non-limiting examples, VERILOG™, SYSTEMVERILOG™ or very large scale integration (VLSI) hardware description language (VHDL™) may be used.

HDL descriptions may be converted into descriptions at any of numerous other levels of abstraction as desired. As a non-limiting example, a high-level description may be converted to a logic-level description such as a register-transfer language (RTL), a gate-level (GL) description, a layout-level description, or a mask-level description. As a non-limiting example, micro-operations to be performed by hardware logic circuits (e.g., gates, flip-flops, registers, without limitation) of the logic circuitry 3908 may be described in a RTL and then converted by a synthesis tool into a GL description, and the GL description may be converted by a placement and routing tool into a layout-level description that corresponds to a physical layout of an integrated circuit of a programmable logic device, discrete gate or transistor logic, discrete hardware components, or combinations thereof. Accordingly, in some examples the machine executable code 3906 may include an HDL, an RTL, a GL description, a mask level description, other hardware description, or any combination thereof.

In examples where the machine executable code 3906 includes a hardware description (at any level of abstraction), a system (not shown, but including the storage 3904) may implement the hardware description described by the machine executable code 3906. By way of non-limiting example, the processors 3902 may include a programmable logic device (e.g., an FPGA or a PLC) and the logic circuitry 3908 may be electrically controlled to implement circuitry corresponding to the hardware description into the logic circuitry 3908. Also by way of non-limiting example, the logic circuitry 3908 may include hard-wired logic manufactured by a manufacturing system (not shown, but including the storage 3904) according to the hardware description of the machine executable code 3906.

Regardless of whether the machine executable code 3906 includes computer-readable instructions or a hardware description, the logic circuitry 3908 is adapted to perform the functional elements described by the machine executable code 3906 when implementing the functional elements of the machine executable code 3906. It is noted that although a hardware description may not directly describe functional elements, a hardware description indirectly describes functional elements that the hardware elements described by the hardware description are capable of performing.

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, etc.) of the computing system. In some embodiments, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. A method of analyzing an energy storage device, the method comprising:
   normalizing charge and discharge voltage profiles of the energy storage device responsive to respective measured capacities of the charge and discharge voltage profiles to obtain normalized charge and discharge voltage profiles as a function of a normalized capacity;
   averaging the normalized charge and discharge voltage profiles to obtain an averaged voltage profile as a function of the normalized capacity;
   determining an internal resistance representative of a difference in a potential between the charge or discharge voltage profiles and the averaged voltage profile divided by an applied current;
   determining a current-resistance (IR) potential responsive to a measured current and the determined internal resistance;
   determining IR-free voltage charge and discharge profiles of the energy storage device as a function of one of a measured capacity or the normalized capacity of respective charge and discharge voltage profiles and responsive to the determined IR potential and the averaged voltage profile; and
   determining a ratio between a capacity change and a voltage potential change in a charging or discharging process of the energy storage device over a predetermined interval of time responsive to the determined IR-free voltage charge/discharge profiles.

2. The method of claim 1, further comprising:
   performing Galvanostatic Intermittent Titration Techniques (GITT) or Potentiostatic Intermittent Titration Techniques (PITT) responsive to a determination of the internal resistance and IR potential as a function of lithium content in a cathode or a cathode active material.

3. The method of claim 2, wherein performing GITT comprises;
   incrementally adding a predetermined amount of capacity according to an incremental process to determine an equilibrium open circuit voltage potential as a function of an accumulated capacity in a charge or discharge process; and determining the internal resistance and the IR potential by measuring a difference between the equilibrium open circuit voltage potential and a terminal voltage potential before a charge current or a discharge current was cut off in the respective charge or discharge process at each increment of the incremental process.

4. The method of claim 3, further comprising:
determining an accumulated capacity responsive to performing GITT;
determining a profile of equilibrium open circuit voltage potential as a function of a lithium content in an electrode active material of the energy storage device responsive to dividing the accumulated capacity by a utilization coefficient of the electrode active material; and
obtaining a relationship between the open circuit voltage potential and the lithium content of the electrode active material.

5. The method of claim 4, further comprising:
determining a utilization coefficient of an electrode active material responsive to the ratio between a capacity change and a voltage potential change in a charging or discharging process of the energy storage device.

6. The method of claim 5, further comprising:
defining a relationship between the equilibrium open circuit voltage potential and the lithium content in an electrode active material responsive to dividing equilibrium voltage profiles by the utilization coefficient of the electrode active material in a respective charge or discharge process of the energy storage device.

7. The method of claim 5, further comprising:
obtaining a relationship between the IR-free voltage charge/discharge profiles and the lithium content in an electrode active material responsive to dividing the charge or discharge voltage profiles by the utilization coefficient of the electrode active material.

8. A method of analyzing an energy storage device, the method comprising:
determining IR-free voltage charge and discharge profiles as a function of a measured capacity or a normalized capacity;
determining a capacity ration based, at least in part, on the IR-free voltage charge and discharge profiles;
determining a theoretical capacity and a theoretical capacity ration responsive to a chemical formulation of an electrode active material;
determining an electrode active material utilization coefficient responsive to a ratio of the capacity ration of respective IR-free voltage charge or discharge profiles and the theoretical capacity ration; and
correcting the IR-free voltage charge or discharge profiles using the electrode active material utilization coefficient to obtain IR-free voltage versus lithium content charge or discharge profiles.

9. The method of claim 8, wherein the theoretical capacity and the theoretical capacity ration are determined using the electrode active material's chemical formulation.

10. The method of claim 9, wherein the chemical formulation of the electrode active material comprises $Li(Ni_{0.8}Mn_{0.1}Co_{0.1})O_2$ or NMC811.

11. The method of claim 10, wherein the theoretical capacity of the electrode active material is 275.5 mAh/g and the theoretical capacity ration is 2.755 mAh/g per removal of 1% of the lithium content in NMC811.

12. A method of analyzing an energy storage device, the method comprising:
optimizing a formation process of an energy storage cell responsive to an optimized internal resistance, an optimized utilization coefficient of an electrode active material, and an optimized range of lithium content in the electrode active material for a charge and discharge process; and
generating one or more parameters for energy cell formation control responsive to the optimized formation process, the optimized utilization coefficient, and the optimized range of lithium content.

13. The method of claim 12, further comprising optimizing a formation process of an energy storage cell responsive to a specification for application and the one or more generated parameters.

14. A method of analyzing an energy storage device, the method comprising:
optimizing a formation process of an energy storage cell responsive to an optimized internal resistance, an optimized IR potential, an optimized capacity ration, and an optimized utilization coefficient of an electrode active material based on a capacity or a lithium inventory; and
generating one or more parameters for energy storage cell formation control responsive to the optimized formation process, the optimized IR potential, the optimized capacity ration, and the optimized utilization coefficient of the electrode active material.

15. A method of analyzing an energy storage device, the method comprising:
determining a utilization coefficient of an electrode active material of the energy storage device;
determining optimized IR-free voltage profiles of the energy storage device as a function of a lithium content of the electrode active material;
determining a state-of-charge (SOC) of the energy storage device based on the lithium content of the electrode active material;
determining IR potential and IR-free voltage profiles of the energy storage device;
quantifying the utilization coefficient of the electrode active material;
determining a lithium inventory utilization and a lithium inventory retention of the energy storage device; and
determining whether a predetermined testing goal has been reached responsive to one or more of the determined utilization coefficient, the determined optimized IR-free voltage profiles, the determined SOC, the determined IR potential, the IR-free voltage profiles, the quantified utilization coefficient, the determined lithium inventory utilization, or the lithium inventory retention.

16. A method of analyzing an energy storage device, the method comprising:
determining one or more IR-free voltage profiles responsive to a ratio between a capacity change and a voltage change in a charging or discharging process of the energy storage device over a predetermined interval of time for the energy storage device;
determining a capacity ration responsive to the determined IR-free voltage profiles; and
determining a utilization coefficient of an electrode active material responsive to the determined capacity ration.

17. The method of claim 16, wherein determining the utilization coefficient of the electrode active material comprises dividing the capacity ration by a theoretical capacity ration.

18. The method of claim 17, further comprising determining the theoretical capacity by loading of the electrode active material on the electrode.

19. The method of claim 16, wherein determining the utilization coefficient of the electrode active material comprises determining a utilization efficiency of the energy storage device.

* * * * *

UNITED STATES PATENT AND TRADEMARK OFFICE
CERTIFICATE OF CORRECTION

| | | Page 1 of 1 |
|---|---|---|
| PATENT NO. | : 12,095,054 B2 | |
| APPLICATION NO. | : 18/185018 | |
| DATED | : September 17, 2024 | |
| INVENTOR(S) | : Boryann Liaw, Yulun Zhang and Meng Li | |

It is certified that error appears in the above-identified patent and that said Letters Patent is hereby corrected as shown below:

In the Specification

| | | |
|---|---|---|
| Column 14, | Lines 29-30, | change "take 27.5 mAh/g" to --take 275.5 mAh/g to-- |
| Column 17, | Lines 59-60, | change "2.204 mAh/g·% SOC" to --2.204 mAh/g·%SOC-- |
| Column 18, | Line 53, | change "2.202 mAh/g·% SOC" to --2.202 mAh/g·%SOC-- |
| Column 18, | Line 54, | change "2.059 mAh/g·% SOC." to --2.059 mAh/g·%SOC.-- |
| Column 23, | Line 26, | change "($SOC_{4.1V}$-$SOC_{4.0V}$) Plot" to --($SOC_{4.1V}$-$SOC_{4.0V}$). Plot-- |
| Column 25, | Line 66, | change "2.040 mAh/g·% SOC" to --2.040 mAh/g·%SOC-- |
| Column 26, | Line 45, | change "(2.202 mAh/g·% SOC)" to --2.202 mAh/g·%SOC-- |
| Column 26, | Line 48, | change "2.204 mAh/g·% SOC)." to --2.204 mAh/g·%SOC).-- |

Signed and Sealed this
Ninth Day of September, 2025

Coke Morgan Stewart
*Acting Director of the United States Patent and Trademark Office*